United States Patent
James et al.

(10) Patent No.: US 9,368,761 B2
(45) Date of Patent: Jun. 14, 2016

(54) COMPOSITIONS COMPRISING ORGANIC SEMICONDUCTING COMPOUNDS

(75) Inventors: Mark James, Romsey (GB); Magda Goncalves-Miskiewicz, Southampton (GB); Philip Edward May, Sidcup (GB); Lana Nanson, Hampshire (GB); Ruth Effenberger, Undenheim (DE); Klaus Bonrad, Alsbach-Haehnlein (DE); Edgar Kluge, Gross-Gerau (DE)

(73) Assignee: Merck Patent GmbH (DE)

( * ) Notice: Subject to any disclaimer, the term of this patent is extended or adjusted under 35 U.S.C. 154(b) by 1016 days.

(21) Appl. No.: 13/518,069

(22) PCT Filed: Nov. 24, 2010

(86) PCT No.: PCT/EP2010/007131
§ 371 (c)(1),
(2), (4) Date: Jun. 21, 2012

(87) PCT Pub. No.: WO2011/076324
PCT Pub. Date: Jun. 30, 2011

(65) Prior Publication Data
US 2012/0256137 A1    Oct. 11, 2012

(30) Foreign Application Priority Data

Dec. 23, 2009 (EP) .................................... 09015910

(51) Int. Cl.
*H01L 51/56* (2006.01)
*H01L 51/00* (2006.01)
(Continued)

(52) U.S. Cl.
CPC ............ *H01L 51/56* (2013.01); *H01L 51/0003* (2013.01); *H01L 51/0004* (2013.01); *H01L 51/0005* (2013.01); *H01L 51/0007* (2013.01); *H01L 51/0036* (2013.01); *H01L 51/0037* (2013.01); *H01L 51/0043* (2013.01);
(Continued)

(58) Field of Classification Search
None
See application file for complete search history.

(56) References Cited

U.S. PATENT DOCUMENTS 5,965,281 A    10/1999 Cao
7,736,540 B1 *  6/2010 Lang ............................ 252/500
(Continued)

FOREIGN PATENT DOCUMENTS

DE    10123115 A1    11/2002
EP     1837928 A1     9/2007
(Continued)

OTHER PUBLICATIONS

Information sheet for Surfynol from Nissan Chemical Industry Co,. Ltd., 1 page, date unknown.*
(Continued)

*Primary Examiner* — Robert S Loewe
(74) *Attorney, Agent, or Firm* — Drinker Biddle & Reath LLP

(57) ABSTRACT

The present invention relates to novel compositions comprising an organic semiconductor (OSC) and a wetting agent, to their use as inks for the preparation of organic electronic (OE) devices, especially organic photovoltaic (OPV) cells and organic light emitting diode (OLED) devices, to methods for preparing OE devices using the novel compositions, and to OE devices, especially OLED devices and OPV cells prepared from such methods and compositions. The efficiency of an OE device with the inclusion of 1% volatile surfactant was 13.5 cd/A at 100 cd/m2.

12 Claims, 10 Drawing Sheets

(51) Int. Cl.
    *H01L 51/05* (2006.01)
    *H01L 51/50* (2006.01)
(52) U.S. Cl.
    CPC ......... *H01L51/0055* (2013.01); *H01L 51/0071* (2013.01); *H01L 51/0085* (2013.01); *H01L 51/0087* (2013.01); *H01L 51/0097* (2013.01); *H01L 51/0541* (2013.01); *H01L 51/5016* (2013.01); *Y02E 10/549* (2013.01)

(56) References Cited

U.S. PATENT DOCUMENTS

| | | | |
|---|---|---|---|
| 2001/0019782 A1* | 9/2001 | Igarashi et al. | 428/690 |
| 2004/0188672 A1 | 9/2004 | Spreitzer et al. | |
| 2007/0102696 A1* | 5/2007 | Brown et al. | 257/40 |
| 2008/0079358 A1 | 4/2008 | Satou | |
| 2008/0265214 A1* | 10/2008 | Steiger | C09K 11/025 252/500 |
| 2009/0236979 A1 | 9/2009 | Han-Adebekun et al. | |
| 2010/0213455 A1* | 8/2010 | James et al. | 257/40 |
| 2011/0008590 A1 | 1/2011 | Goddard et al. | |
| 2012/0273736 A1 | 11/2012 | James et al. | |

FOREIGN PATENT DOCUMENTS

| | | |
|---|---|---|
| JP | 2004-088094 A | 3/2004 |
| JP | 2005-100893 A | 4/2005 |
| JP | 2005-514726 A | 5/2005 |
| JP | 2008-088094 A | 4/2008 |
| JP | 2008-100893 A | 5/2008 |
| JP | 2008-109085 A | 5/2008 |
| JP | 2008-220459 A | 9/2008 |
| JP | 2008-231843 A | 10/2008 |
| JP | 2008-269232 A | 11/2008 |
| JP | 2008-310312 A | 12/2008 |
| JP | 2009-231843 A | 10/2009 |
| JP | 2011-515835 A | 5/2011 |
| JP | 2011-517369 A | 6/2011 |
| WO | WO-2009049744 A1 | 4/2009 |
| WO | WO-2009109273 A1 | 9/2009 |
| WO | WO 2009109273 A1 * | 9/2009 ............. H01L 51/00 |
| WO | WO-2009151978 A1 | 12/2009 |
| WO | WO-2010149259 A2 | 12/2010 |

OTHER PUBLICATIONS

International Search Report for PCT/EP2010/007131 mailed Feb. 17, 2011.

Lee, et al. "White Light Emitting Electrophosphorescent Devices with Solution Processed Emission Layer", Japanese Journal of Applied Physics, vol. 45, No. 12, (2006), pp. 9231-9233.

Japanese Office Action mailed on Oct. 21, 2014 for Application NO. 2012-545116.

* cited by examiner

Figure 17
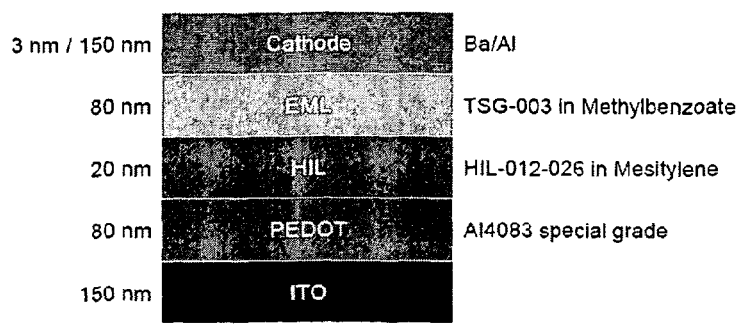
Figure 18
Figure 19
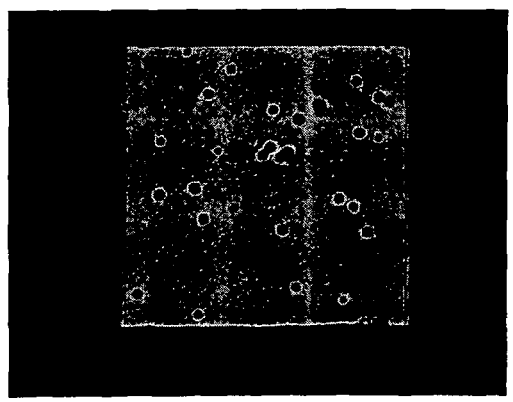
Formulation without volatile surfactant (Sample A)
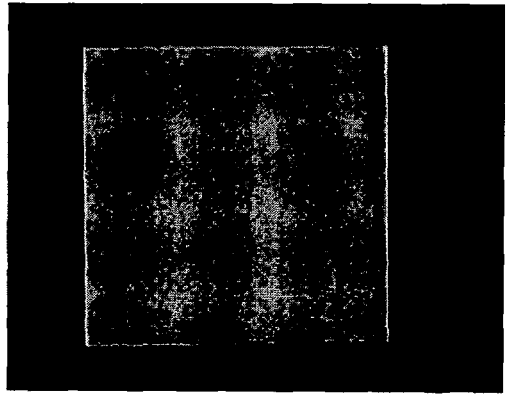
Formulation with 1% volatile surfactant (Sample B)

Formulation without volatile surfactant (Sample C)

Formulation with 1% volatile surfactant (Sample D)

Formulation without volatile surfactant (Sample C)

Formulation with 1% volatile surfactant (Sample D)

Formulation without volatile surfactant (Sample E)

Formulation with 1% volatile surfactant (Sample F)

Formulation without volatile surfactant (Sample E)

Formulation with 1% volatile surfactant (Sample F)

COMPOSITIONS COMPRISING ORGANIC SEMICONDUCTING COMPOUNDS

RELATED APPLICATIONS

This application is a national stage application (under 35 U.S.C. §371) of PCT/EP2010/007131, filed Nov. 24, 2010, which claims benefit of European Patent Application No. 09015910.4, filed Dec. 23, 2009.

BACKGROUND OF THE INVENTION

1. Field of the Invention

The present invention relates to novel compositions comprising an organic semiconductor (OSC) and a wetting agent, to their use as conducting inks for the preparation of organic electronic (OE) devices, especially organic photovoltaic (OPV) cells and OLED devices, to methods for preparing OE devices using the novel formulations, and to OE devices and OPV cells prepared from such methods and compositions.

2. Background and Prior Art

When preparing OE devices like OFETs or OPV cells, in particular flexible devices, usually printing or coating techniques like inkjet printing, roll to roll printing, slot dye coating or flexographic/gravure printing are used to apply the OSC layer. Based on low solubility of the most of the present organic compounds useful as OSC these techniques need the use of solvents in high amounts. In order to reduce solvent de-wetting and to increase dry film levelness surfactants can be used. These additives are especially needed with regard to small molecular OSC or polymeric OSC having a low molecular weight. The use of conventional surfactants or wetting agents is disclosed, e.g. in WO 2009/049744. However, no explicit examples are mentioned. Based on the low solubility of the most of the OSC materials the amounts of surfactants needed are high in relation to the amount of OSC material in an ink formulation.

U.S. Pat. No. 5,326,672 discloses the use of volatile surfactants to control the rinsing of a resist structure in order to give improved line definition. However, the composition comprising the volatile surfactants is not used to apply any components to a surface but to rinse the developed resist pattern. No composition is disclosed comprising any OSC material.

Furthermore, volatile surfactants for cleaning electric and electronic parts are disclosed in EP 1 760 140 B1. However, EP 1 760 140 B1 does not provide any hints to use these wetting agents in a composition for applying any layer on a surface.

JP 2003-128941 A discusses the formulation of a photo-curing formulation which gives enhanced resistance properties. According to the teaching of JP 2003-128941A a water emulsion for applying a photoresist layer can be used in order to provide environmental improvements. No composition is disclosed comprising any OSC material.

JP 5171117 A relates to the addition of a volatile surfactant to a tacky acrylic resin and a reactive surfactant to form an emulsion. The composition is used for forming a tape in wafer processing. No composition is disclosed comprising any OSC material.

In prior art volatile surfactants or wetting agents are used to improve the adhesion of a layer formed before applying a composition comprising the wetting agent or of a layer being applied after a rinsing step. However, in the field of OSC materials, the adhesion of the layers formed with conventional surfactants is not critical. Furthermore, the OE devices as disclosed in WO 2009/049744 show useful efficiencies and lifetimes. However, it is a permanent desire to improve the performance of the OSC layer, such as efficiency, lifetime and sensitivity regarding oxidation or water.

It is therefore desirable to have fluids comprising an OSC that are suitable for the preparation of OE devices, especially thin film transistors, diodes, OLED displays and OPV cells, which allow the manufacture of high efficient OE devices having a high performance, a long lifetime and a low sensitivity against water or oxidation. One aim of the present invention is to provide such improved fluids. Another aim is to provide improved methods of preparing an OE device from such fluids. Another aim is to provide improved OE devices obtained from such fluids and methods. Further aims are immediately evident to the person skilled in the art from the following description.

Surprisingly it has been found that these aims can be achieved, and the above-mentioned problems can be solved, by providing methods, materials and devices as claimed in the present invention, especially by providing a process for preparing an OE device using a composition comprising a volatile wetting agent.

SUMMARY OF THE INVENTION

The invention relates to a composition comprising one or more organic semiconducting compounds (OSC), one or more organic solvents, and one or more additives that decrease the surface tension of the composition (wetting agents), characterized in that said wetting agent is volatile and is not capable of chemically reacting with the organic semiconducting compounds.

The invention further relates to the use of a formulation as described above and below as coating or printing ink, especially for the preparation of OE devices, in particular for thin film transistors, diodes, OLED devices and rigid or flexible organic photovoltaic (OPV) cells and devices.

The invention further relates to a process of preparing an organic electronic (OE) device, comprising the steps of
a) depositing the composition as described above and below onto a substrate to form a film or layer, and
b) removing the solvent(s) and any wetting agent(s) that are volatile.

The invention further relates to an OE device prepared from a formulation and/or by a process as described above and below.

The OE devices include, without limitation, organic field effect transistors (OFET), integrated circuits (IC), thin film transistors (TFT), Radio Frequency Identification (RFID) tags, organic light emitting diodes (OLED), organic light emitting transistors (OLET), electroluminescent displays, organic photovoltaic (OPV) cells, organic solar cells (O-SC), flexible OPVs and O-SCs, organic laser diodes (O-laser), organic integrated circuits (O-IC), lighting devices, sensor devices, electrode materials, photoconductors, photodetectors, electrophotographic recording devices, capacitors, charge injection layers, Schottky diodes, planarising layers, antistatic films, conducting substrates, conducting patterns, photoconductors, electrophotographic devices, organic memory devices, biosensors and biochips.

According to a preferred embodiment, the present invention provides organic light emitting diodes (OLED). OLED devices can for example be used for illumination, for medical illumination purposes, as signalling device, as signage devices, and in displays. Displays can be addressed using passive matrix driving, total matrix addressing of active matrix driving. Transparent OLEDs can be manufactured by using optically transparent electrodes. Flexible OLEDs are assessable through the use of flexible substrates.

The compositions, methods and devices of present invention provide surprising improvements in the efficiency of the OE devices and the production thereof. Unexpectedly, the performance, the lifetime and the efficiency of the OE devices can be improved, if these devices are achieved by using a composition of the present invention. Furthermore, the composition of the present invention provides an astonishingly high level of film forming. Especially, the homogeneity and the quality of the films can be improved. In addition thereto, the present invention enables better solution printing of multi layer devices.

A BRIEF DESCRIPTION OF THE FIGURES

FIG. 1A exemplarily and schematically depicts a typical bottom gate (BG), top contact (TC) OFET device according to the present invention.

FIG. 1B exemplarily and schematically depicts a typical bottom gate (BG), bottom contact (BC) OFET device according to the present invention.

FIG. 2 exemplarily and schematically depicts a top gate (TG) OFET device according to the present invention.

FIG. 3 and FIG. 4 exemplarily and schematically depict typical and preferred OPV devices according to the present invention.

FIGS. 7-16 illustrates the results of control example 2, control example 3, and examples 2-9 respectively.

FIG. 17 illustrates the device layout.

FIGS. 18 and 19 show the electroluminescence of the 2 samples.

Figure 20:
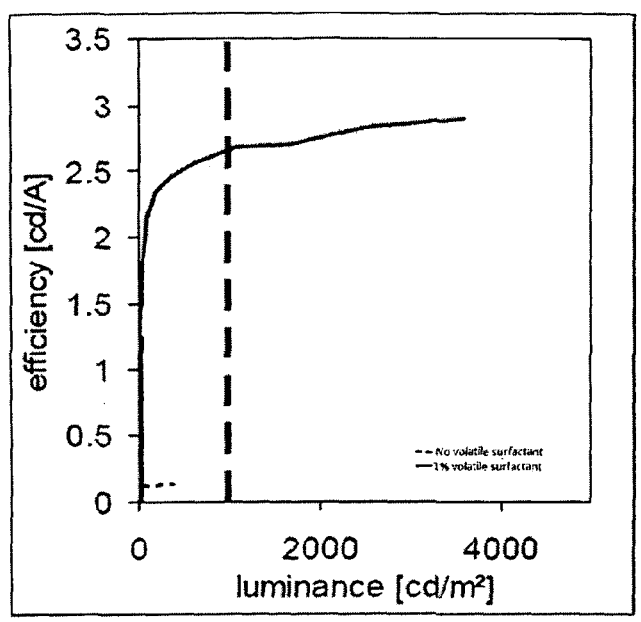

FIG. 20 illustrates a substantial improvement in the efficiency in the example.

Figure 21:
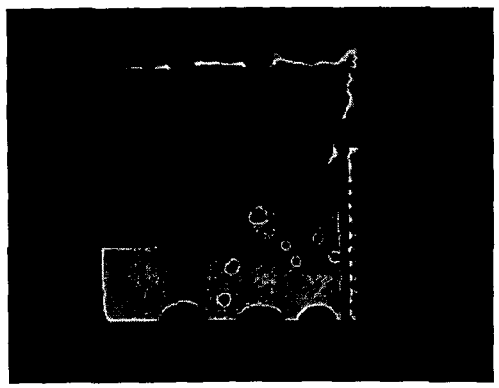
Figure 22:
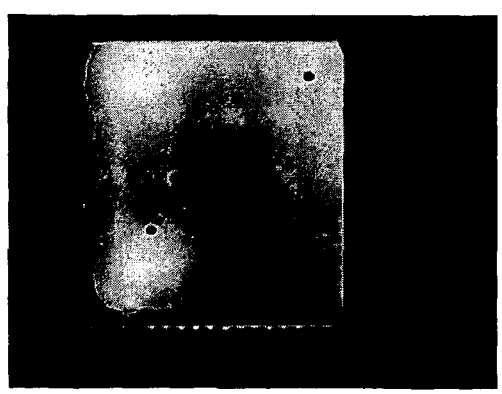

FIGS. 21 and 22 show the electroluminescence of the 2 samples.

Figure 23:
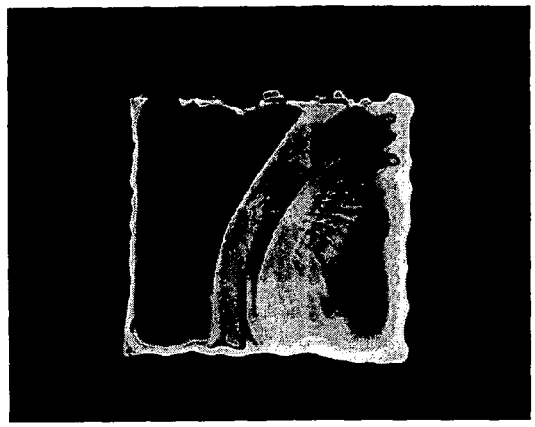
Figure 24:
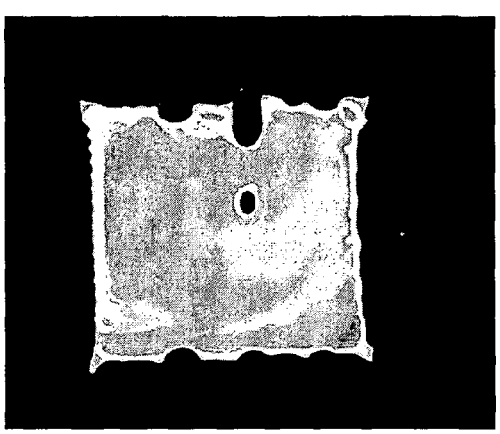

FIGS. 23 and 24 are those assessed by photoluminescence.

Figure 25:
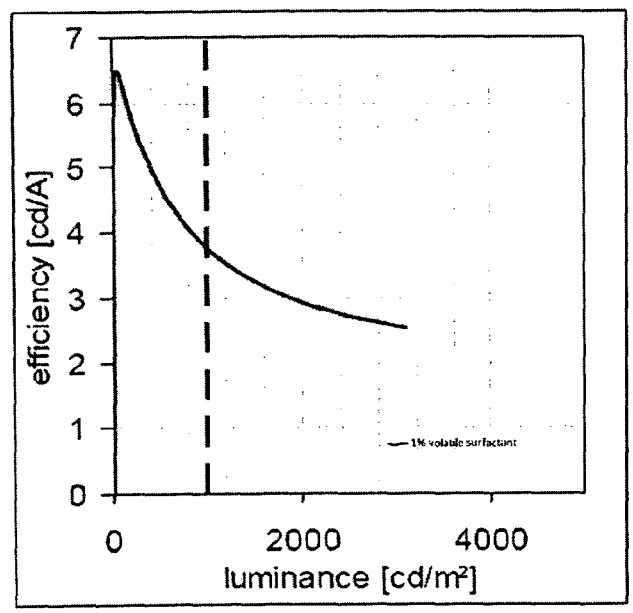

FIG. 25 illustrates only the device with the volatile surfactant could be measured.

Figure 26:
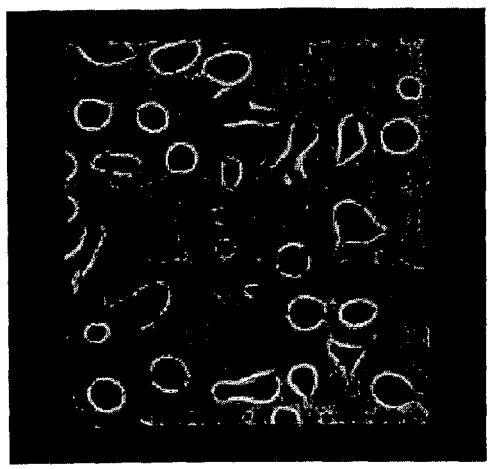
Figure 27:
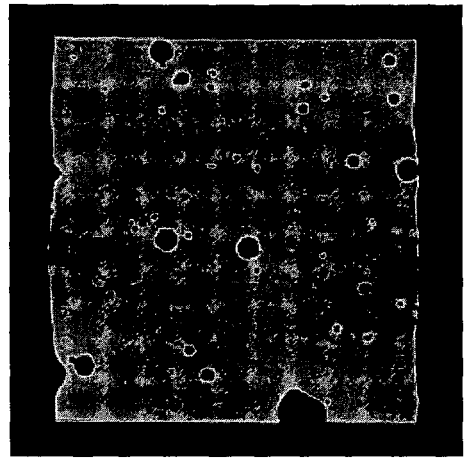

FIGS. 26 and 27 show the electroluminescence of the 2 samples.

Figure 28:
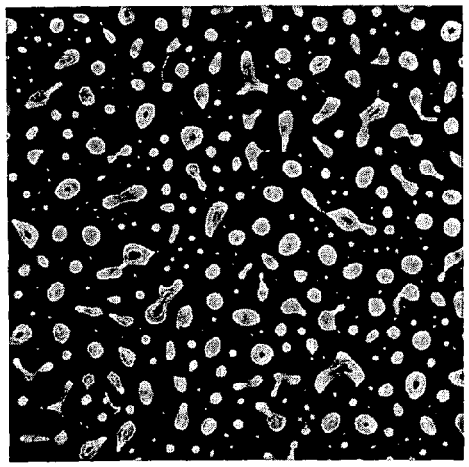
Figure 29:

FIGS. 28 and 29 are those assessed by photo luminescence.

Figure 30:
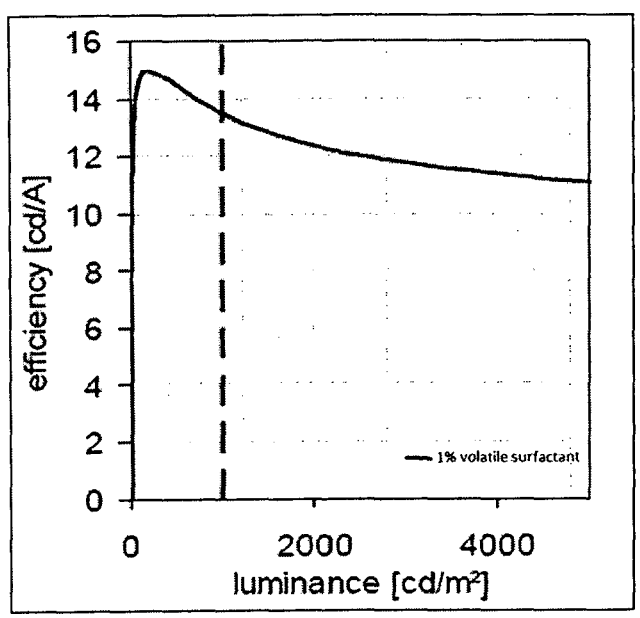

FIG. 30 illustrates only the device with the volatile surfactant could be measured.

DETAILED DESCRIPTION OF THE INVENTION

In order to avoid permanent doping of the OSC material, which comprises one or more OSC compounds, the wetting agents are selected from the group consisting of compounds that are volatile and are not capable of chemically reacting with the OSC compounds. In particular they are selected from compounds that do not have a permanent doping effect on the OSC material (e.g. by oxidising or otherwise chemically reacting with the OSC material). Therefore, the formulation preferably should not contain additives, like e.g. oxidants or protonic or lewis acids, which react with the OSC materials by forming ionic products.

It can also be tolerable to add additives like for example oxidants, lewis acids, protic inorganic acids or non-volatile protic carboxylic acids, to the formulation. However, the total concentration of these additives in the formulation should then be less than 5%, preferably less than 2.5%, more preferably less than 0.5%, most preferably less than 0.1% by weight. Preferably, however, the formulation does not contain dopants selected from this group.

Thus, preferably the wetting agents are selected such that they do not permanently dope the OSC materials and they are removed from the OSC materials after processing (wherein processing means for example depositing the OSC materials on a substrate or forming a layer or film thereof), and/or they are present in a concentration low enough to avoid a significant effect on the OSC properties, caused for example by permanent doping. Furthermore, preferably the wetting agents are not chemically bound to the OSC materials or the film or layer comprising it.

Preferred wetting agents are selected from the group consisting of compounds that do not oxidise the OSC materials or otherwise chemically react with these materials. The terms "oxidise" and "chemically react" as used above and below refer to a possible oxidation or other chemical reaction of the wetting agents with the OSC materials under the conditions used for manufacture, storage, transport and/or use of the formulation and the OE device.

Wetting agents are selected from the group consisting of volatile compounds. The term "volatile" as used above and below means that the agent can be removed from the OSC materials by evaporation, after the OSC materials have been deposited onto a substrate of an OE device, under conditions (like temperature and/or reduced pressure) that do not significantly damage the OSC materials or the OE device. Preferably this means that the wetting agent has a boiling point or sublimation temperature of <350° C., more preferably ≤300° C., most preferably ≤250° C., at the pressure employed, very preferably at atmospheric pressure (1013 hPa). Evaporation can also be accelerated e.g. by applying heat and/or reduced pressure.

Preferred wetting agents are non-aromatic compounds. With further preference the wetting agents are non-ionic compounds. Particular useful wetting agents comprise a surface tension of at most 35 mN/m, preferably of at most 30 mN/m, and more preferably of at most 25 mN/m. The surface tension can be measured using a FTA (First Ten Angstrom) 125 contact angle goniometer at 25° C. Details of the method are available from First Ten Angstrom as published by Roger P. Woodward, Ph.D. "Surface Tension Measurements Using the Drop Shape Method". Preferably, the pendant drop method can be used to determine the surface tension.

For the purpose for making a rough estimate, the surface tension can be calculated using the Hansen Solubility Parameters by the formula expounded in Hansen Solubility Parameters: A User's Handbook, Second Edition, C. M. Hansen (2007), Taylor and Francis Group, LLC (HSPiP manual).

$$\text{Surface tension}=0.0146\times(2.28\times\delta H_d^2+\delta H_p^2+\delta H_h^2)\times M\text{Vol}^{0.2}, \text{ where:}$$

$H_d$ refers to Dispersion contribution
$H_p$ refers to Polar contribution
$H_h$ refers to Hydrogen bonding contribution
MVol refers to Molar Volume.

The Hansen Solubility Parameters can be determined according to the Hansen Solubility Parameters in Practice (HSPiP) program ($2^{nd}$ edition) as supplied by Hanson and Abbot et al.

According to a special aspect of the present invention the wetting additive can comprise a relative evaporation rate (Butyl acetate=100) of at least 0.01, preferably of at least 0.1, preferably of at least 0.5, more preferably of at least 5, more preferably of at least 10 and most preferably of at least 20. The relative evaporation rate can be determined according to DIN 53170:2009-08.

For the purpose for making a rough estimate, the relative evaporation rate can be calculated using the Hansen Solubility Parameters with the HSPiP program as mentioned above and below.

Unexpected improvements can be achieved by wetting agents comprising a molecular weight of at least 100 g/mol, preferably at least 150 g/mol, more preferably at least 180 g/mol and most preferably at least 200 g/mol.

Suitable and preferred wetting agents that do not oxidise or otherwise chemically react with the OSC materials are selected from the group consisting of siloxanes, alkanes, amines, alkenes, alkynes, alcohols and/or halogenated derivates of these compounds. Furthermore, fluoro ethers, fluoro esters and/or fluoro ketones can be used. More preferably, these compounds are selected from methyl siloxanes having 6 to 20 carbon atoms, especially 8 to 16 carbon atoms, $C_7$-$C_{14}$ alkanes, $C_7$-$C_{14}$ alkenes, $C_7$-$C_{14}$ alkynes, alcohols having 7 to 14 carbon atoms, fluoro ethers having 7 to 14 carbon atoms, fluoro esters having 7 to 14 carbon atoms and fluoro ketones having 7 to 14 carbon atoms. Most preferred wetting agents are methyl siloxanes having 8 to 14 carbon atoms.

Useful and preferred alkanes having 7 to 14 carbon atoms include heptane, octane, nonane, decane, undecane, dodecane, tridecane, tetradecane, 3-methyl heptane, 4-ethyl heptane, 5-propyl decane, trimethyl cyclohexane and decalin.

Halogenated alkanes having 7 to 14 carbon atoms include 1-chloro heptane, 1,2-dichloro octane, tetrafluoro octane, decafluoro dodecane, perfluoro nonane, 1,1,1-trifluoromethyl decane, and perfluoro methyl decalin.

Useful and preferred alkenes having 7 to 14 carbon atoms include heptene, octene, nonene, 1-decene, 4-decene, undecene, dodecene, tridecene, tetradecene, 3-methyl heptene, 4-ethyl heptene, 5-propyl decene, and trimethyl cyclohexene.

Halogenated alkenes having 7 to 14 carbon atoms include 1-chloro heptene, 1,2-dichloro octene, tetrafluoro octene, decafluoro dodecene, perfluoro nonene, and 1,1,1-trifluoromethyl decene.

Useful and preferred alkynes having 7 to 14 carbon atoms include heptyne, octyne, nonyne, 1-decyne, 4-decyne, undecyne, dodecyne, tridecyne, tetradecyne, 3-methyl heptyne, 4-ethyl heptyne, 5-propyl decyne, and trimethyl cyclohexane.

Halogenated alkynes having 7 to 14 carbon atoms include 1-chloro heptyne, 1,2-dichloro octyne, tetrafluoro octyne, decafluoro dodecyne, perfluoro nonyne, and 1,1,1-trifluoromethyl decyne.

Useful and preferred alcohols having 7 to 14 carbon atoms include 3,5-dimethyl-1-hexyn-3-ol, heptanol, octanol, nonanol, decanol, undecanol, dodecanol, tridecanol, tetradecanol, 3-methyl heptanol, 4-ethyl heptanol, 5-propyl decanol, trimethyl cyclohexanol and hydroxyl decalin.

Halogenated alkanols having 7 to 14 carbon atoms include 1-chloro heptanol, 1,2-dichloro octanol, tetrafluoro octanol, decafluoro dodecanol, perfluoro nonanol, 1,1,1-trifluoromethyl decanol, and 2-trifluoro methyl-1-hydroxy decalin.

Useful and preferred amines having 4 to 15 carbon atoms include hexylamine, tripropylamine, tributylamine, dibutylamine, piperazine, heptylamine, octylamine, nonylamine, decylamine, undecylamine, dodecylamine, tridecylamine, tetradecylamine, 3-methyl heptylamine, 4-ethyl heptylamine, 5-propyl decylamine, trimethyl cyclohexylamine.

Halogenated amines having 4 to 15 carbon atoms include 1-chloro heptyl amine, 1,2-dichloro octyl amine, tetrafluoro octyl amine, decafluoro dodecyl amine, perfluoro nonyl amine, 1,1,1-trifluoromethyl decyl amine, perfluorotributyl amine, and perfluorotripentyl amine.

Useful and preferred fluoro ethers having 7 to 14 carbon atoms include 3-ethoxy-1,1,1,2,3,4,4,5,5,6,6,6 dodecafluoro-2-trifluoromethyl-hexane, 3-propoxy-1,1,1,2,3,4,4,5,5,6,6,6 dodecafluoro-2-trifluoromethyl-hexane, 3-ethoxy-1,1,1,2,3,4,4,5,5,6,6,7,7,7 tetradecafluoro-2-trifluoromethyl-heptane, 3-ethoxy-1,1,1,2,3,4,4,5,5,5 decafluoro-2-trifluoromethyl-pentane, and 3-propoxy-1,1,1,2,3,4,4,5,5,5 decafluoro-2-trifluoromethyl-pentane.

Useful and preferred fluoro esters having 7 to 14 carbon atoms include 3-(1,1,1,2,3,4,4,5,5,6,6,6 dodecafluoro-2-trifluoromethyl-hexyl)ethanoate, 3-(1,1,1,2,3,4,4,5,5,6,6,6 dodecafluoro-2-trifluoromethyl-hexyl) propanoate, 3-(1,1,1,2,3,4,4,5,5,6,6,7,7,7 tetradecafluoro-2-trifluoromethyl-heptyl)ethanoate, 3-(1,1,1,2,3,4,4,5,5,5 decafluoro-2-trifluoromethyl-pentyl)ethanoate, and 3-(1,1,1,2,3,4,4,5,5,5 decafluoro-2-trifluoromethyl-pentyl)propanoate.

Useful and preferred fluoro ketones having 7 to 14 carbon atoms include 3-(1,1,1,2,3,4,4,5,5,6,6,6 dodecafluoro-2-trifluoromethyl-hexyl)ethyl ketone, 3-(1,1,1,2,3,4,4,5,5,6,6,6 dodecafluoro-2-trifluoromethyl-hexyl) propyl ketone, 3-(1,1,1,2,3,4,4,5,5,6,6,7,7,7 tetradecafluoro-2-trifluoromethyl-heptyl)ethyl ketone, 3-(1,1,1,2,3,4,4,5,5,5 decafluoro-2-trifluoromethyl-pentyl)ethyl ketone, and 3-(1,1,1,2,3,4,4,5,5,5 decafluoro-2-trifluoromethyl-pentyl) propyl ketone.

Useful and preferred siloxanes include hexamethyl disiloxane, octamethyl trisiloxane, decamethyl tetrasiloxane, dodecamethyl pentasiloxane, and tetradecamethyl hexasiloxane.

Examples of compounds useful as wetting agents are disclosed in Table 1. The provided relative evaporation rate (RER) and surface tension values are calculated using the Hansen Solubility Parameters with the HSPiP program provided by Hanson and Abbott et al. as mentioned above and below.

TABLE 1

Preferred wetting agents

| Wetting agent | Boiling point [° C.] | $H_d$ [$MPa^{0.5}$] | $H_h$ [$MPa^{0.5}$] | $H_p$ [$MPa^{0.5}$] | $M_{Vol}$ | RER | Surface tension [mN/m] |
|---|---|---|---|---|---|---|---|
| Decane | 174 | 15.5 | 0 | 0 | 194 | 19.9 | 23.0 |
| 3-Octanol | 175 | 15.5 | 6 | 10 | 159.3 | 2.2 | 27.5 |
| 1-Decene | 169 | 15.5 | 1.5 | 2.3 | 188.4 | 13.9 | 23.1 |
| 1-Octyn-3-ol | 195 | 15.5 | 8.8 | 10.2 | 147 | 2.6 | 28.9 |
| 4-Octyne | 129 | 14.6 | 0 | 2.6 | 148.3 | 81.8 | 19.6 |
| 1-Decyne | 174 | 15.5 | 0.1 | 3.3 | 181.4 | 15.1 | 23.1 |
| 1-Dodecyne | 215 | 15.7 | 0.1 | 3.3 | 213.5 | 1.4 | 24.5 |
| Perfluorononane | 125 | 13.3 | 0 | −0.3 | 283.6 | 393.1 | 18.2 |
| Hexamethyl disiloxane | 128 | 13 | 1.5 | 0.8 | 207.2 | 505.2 | 16.5 |
| Octamethyl trisiloxane | 153 | 12.6 | 1.5 | 0.4 | 283.4 | 56 | 16.5 |

TABLE 1-continued

Preferred wetting agents

| Wetting agent | Boiling point [° C.] | $H_d$ [MPa$^{0.5}$] | $H_h$ [MPa$^{0.5}$] | $H_p$ [MPa$^{0.5}$] | $M_{Vol}$ | RER | Surface tension [mN/m] |
|---|---|---|---|---|---|---|---|
| Decamethyl tetrasiloxane | 194 | 12.3 | 1.4 | 0.1 | 359.7 | 7.4 | 16.4 |
| Dodecamethyl pentasiloxane | 230 | 12 | 1.3 | −0.1 | 436 | 1.1 | 16.2 |
| Perfluoromethyl decalin | 150 | 11.8 | 0 | 1.2 | 275.8 | 16.6 | 14.3 |
| 3,5 Dimethyl-1-hexyn-3-ol | 160 | 15.2 | 5.5 | 13.2 | 145.7 | 0.8 | 28.9 |
| 3-Ethoxy-1,1,1,2,3, 4,4,5,5,6,6,6 dodeca-fluoro-2-trifluoro-methyl-hexane | 128 | 13.2 | 2.7 | 1.8 | 266.9 | 1946 | 18.2 |
| Perfluorotributyl amine | 174 | 12.9 | 0 | 0 | 383.3 | 0.2 | 18.2 |
| Perfluorotripentyl amine | 215 | 13.2 | 0 | 0 | 462.7 | <0.1 | 19.8 |
| Tripropylamine | 156 | 15.5 | 3.9 | 2.1 | 189 | 28.6 | 23.6 |
| Tributylamine | 216 | 15.7 | 2.1 | 1.7 | 240.4 | 2.2 | 24.9 |
| Dibutylamine | 159 | 15.3 | 2.2 | 4.4 | 171.0 | 22.4 | 22.8 |
| Hexylamine | 132 | 15.7 | 5.0 | 9.3 | 132.1 | 30.5 | 26.1 |
| Piperazine | 145 | 16.9 | 4.4 | 6.7 | 97 | 22.8 | 26.1 |

$H_d$ refers to Dispersion contribution
$H_p$ refers to Polar contribution
$H_h$ refers to Hydrogen bonding contribution
$M_{Vol}$ refers to Molar Volume.

Preferably, the composition comprises at most 5% by weight, especially at most 3% by weight of wetting additives. More preferably, the composition comprises 0.01 to 4% by weight, most preferably 0.1 to 1% by weight of wetting agent.

The solvents are preferably selected from the group consisting of aromatic hydrocarbons, like toluene, o-, m- or p-xylene, trimethyl benzenes (e.g. 1,2,3-, 1,2,4- and 1,3,5-trimethyl benzenes), tetralin, other mono-, di-, tri- and tetraalkylbenzenes (e.g. diethylbenzenes, methylcumene, tetramethylbenzenes etc), aromatic ethers (e.g. anisole, alkyl anisoles, e.g. 2, 3 and 4 isomers of methylanisole, 2,3-, 2,4-, 2,5-, 2,6-, 3,4- and 3,5-isomers of dimethylanisole), naphthalene derivatives, alkyl naphthalene derivatives (e.g. 1- and 2-methylnaphthalene), di- and tetrahydronaphthalene derivatives. Also preferred are aromatic esters (e.g alkyl benzoates), aromatic ketones (e.g. acetophenone, propiophenone), alkyl ketones (e.g. cyclohexanone), heteroaromatic solvents (e.g. thiophene, mono-, di- and trialkyl thiophenes, 2-alkylthiazoles, benzthiazoles etc, pyridines), halogenarylenes and anilin derivatives. These solvents may comprise halogen atoms.

Especially preferred are: 3-fluoro-trifluoromethylbenzene, trifluoromethylbenzene, dioxane, trifluoromethoxybenzene, 4-fluoro-benzenetrifluoride, 3-fluoropyridine, toluene, 2-fluorotoluene, 2-fluoro-benzenetrifluoride, 3-fluorotoluene, pyridine, 4-fluorotoluene, 2,5-difluorotoluene, 1-chloro-2,4-difluorobenzene, 2-fluoropyridine, 3-chlorofluorobenzene, 1-chloro-2,5-difluorobenzene, 4-chlorofluorobenzene, chlorobenzene, 2-chlorofluorobenzene, p-xylene, m-xylene, o-xylene, 2,6-lutidine, 2-fluoro-m-xylene, 3-fluoro-o-xylene, 2-chlorobenzenetrifluoride, dimethylformamide, 2-chloro-6-fluorotoluene, 2-fluoroanisole, anisole, 2,3-dimethylpyrazine, bromobenzene, 4-fluoroanisole, 3-fluoroanisole, 3-trifluoromethylanisole, 2-methylanisole, phenetol, benzenedioxol, 4-methylanisole, 3-methylanisole, 4-fluoro-3-methylanisole, 1,2-dichlorobenzene, 2-fluorobenzenenitril, 4-fluoroveratrol, 2,6-dimethylanisole, aniline, 3-fluorobenzenenitril, 2,5-dimethylanisole, 3,4-dimethylanisole, 2,4-dimethylanisole, benzenenitril, 3,5-dimethylanisole, N,N-dimethylaniline, 1-fluoro-3,5-dimethoxybenzene, phenylacetate, N-methylaniline, methylbenzoate, N-methylpyrrolidone, morpholine, 1,2-dihydronaphthalene, 1,2,3,4-tetrahydronaphthalene, o-tolunitril, veratrol, ethylbenzoate, N,N-diethylaniline, propylbenzoate, 1-methylnaphthalene, butylbenzoate, 2-methylbiphenyl, 2-phenylpyridin or 2,2'-Bitolyl.

Especially preferred are aromatic hydrocarbons especially toluene, dimethyl benzenes (xylenes), trimethyl benzenes, tetralin and methyl naphthalenes, aromatic ethers, especially anisole and aromatic esters, especially methyl benzoate.

These solvents can be used as mixture of two, three or more.

Preferably the solvent has a boiling point or sublimation temperature of <300° C., more preferably ≤250° C., most preferably ≤200° C., at the pressure employed, very preferably at atmospheric pressure (1013 hPa). Evaporation can also be accelerated e.g. by applying heat and/or reduced pressure.

Surprising effects can be accomplished by compositions comprising volatile components having similar boiling points. Preferably, the difference of the boiling point of the wetting agent and the organic solvent is in the range of −50° C. to 50° C., more preferably in the range of −30° C. to 30° C. and most preferably in the range of −20° to 20° C.

Usually, the organic solvent can comprise a surface tension of at least 28 mN/m, preferably at least 30 mN/m and more preferably at least 32 mN/m and most preferably 35 mN/m.

According to a special aspect of the present invention, the difference of the surface tension of the organic solvent and the wetting agent is preferably at least 1 mN/m, more preferably at least 5 mN/m and most preferably at least 10 mN/m.

Preferably, the solvent can comprise a relative evaporation rate (Butyl acetate=100) of at least 0.01, preferably of at least 0.1, preferably of at least 0.5, more preferably of at least 5, more preferably of at least 10 and most preferably of at least 20. The relative evaporation rate can be determined according to DIN 53170:2009-08.

Unexpected improvements can be achieved with compositions comprising solvents and wetting agents having a similar relative evaporation rate (Butyl acetate=100). Preferably, the difference of the relative evaporation rate (Butyl acetate=100) of the wetting agent and the organic solvent is in the range of −20 to 20, more preferably in the range of −10 to 10. According to a preferred embodiment of the present invention, the ratio of the relative evaporation rate (Butyl acetate=100) of the wetting agent to relative evaporation rate (Butyl acetate=100) of the organic solvent can range from 230:1 to 1:230, especially from 20:1 to 1:20 and more preferably from 5:1 to 1:5.

The composition of the present invention can particularly comprise at least 70% by weight, preferably at least 80% by weight and more preferably at least 90% by weight of organic solvents.

Preferably, the solvent should be selected such that it can be evaporated from the coated or printed layer comprising the OSC materials together with the wetting agent, preferably in the same processing step. The processing temperature used for removing the solvent and the volatile additive should be selected such that the layer, comprising the organic light emitting materials and/or charge transporting materials, is not damaged. Preferably the deposition processing temperature is from room temperature (RT; about 25° C.) to 135° C. and more preferably from RT to 80° C.

The OSC compounds can be selected from standard materials known to the skilled person and described in the literature. The OSC may be a monomeric compound (also referred to as "small molecule", as compared to a polymer or macromolecule) a polymeric compound, or a mixture, dispersion or blend containing one or more compounds selected from either or both of monomeric and polymeric compounds.

In one preferred embodiment of the present invention the OSC is selected from monomeric compounds, where it is easier to achieve a significant variation in the degree of crystallinity.

According to an aspect of the present invention, the OSC is preferably a conjugated aromatic molecule, and contains preferably at least three aromatic rings, which can be fused or unfused. Unfused rings are connected e.g. via a linkage group, a single bond or a spiro-linkage. Preferred monomeric OSC compounds contain one or more rings selected from the group consisting of 5-, 6- or 7-membered aromatic rings, and more preferably contain only 5- or 6-membered aromatic rings. The material may be a monomer, oligomer or polymer, including mixtures, dispersions and blends.

Each of the aromatic rings optionally contains one or more hetero atoms selected from Se, Te, P, Si, B, As, N, O or S, preferably from N, O or S.

The aromatic rings may be optionally substituted with alkyl, alkoxy, polyalkoxy, thioalkyl, acyl, aryl or substituted aryl groups, halogen, particularly fluorine, cyano, nitro or an optionally substituted secondary or tertiary alkylamine or arylamine represented by —N(R$^x$)(R$^y$), where R$^x$ and R$^y$ independently of each other denote H, optionally substituted alkyl, optionally substituted aryl, alkoxy or polyalkoxy groups. Where R$^x$ and/or R$^y$ denote alkyl or aryl these may be optionally fluorinated.

Preferred rings are optionally fused, or are optionally linked with a conjugated linking group such as —C(T$^1$)=C (T$^2$)-, —C≡C—, —N(R$^z$)—, —N=N—, —(R$^z$)C=N—, —N=C(R$^z$)—, wherein T$^1$ and T$^2$ independently of each other denote H, Cl, F, —C≡N— or a lower alkyl group, preferably a C$_{1-4}$ alkyl group, and R$^z$ denotes H, optionally substituted alkyl or optionally substituted aryl. Where R$^z$ is alkyl or aryl these may be optionally fluorinated.

Preferred OSC compounds include small molecules (i.e. monomeric compounds), polymers, oligomers and derivatives thereof, selected from condensed aromatic hydrocarbons such as tetracene, chrysene, pentacene, pyrene, perylene, coronene, or soluble substituted derivatives of the aforementioned; oligomeric para substituted phenylenes such as p-quaterphenyl (p-4P), p-quinquephenyl (p-5P), p-sexiphenyl (p-6P), or soluble substituted derivatives of the aforementioned; conjugated hydrocarbon polymers such as polyacene, polyphenylene, poly(phenylene vinylene), polyfluorene, polyindenofluorene, including oligomers of these conjugated hydrocarbon polymers; conjugated heterocyclic polymers such as poly(3-substituted thiophene), poly(3,4-bisubstituted thiophene), polyselenophene, poly(3-substituted selenophene), poly(3,4-bisubstituted selenophene), polybenzothiophene, polyisothianapthene, poly(N-substituted pyrrole), poly(3-substituted pyrrole), poly(3,4-bisubstituted pyrrole), polyfuran, polypyridine, poly-1,3,4-oxadiazole, polyisothianaphthene, poly(N-substituted aniline), poly (2-substituted aniline), poly(3-substituted aniline), poly(2,3-bisubstituted aniline), polyazulene, polypyrenepolybenzofuran; polyindole, polypyridazine, polytriarylamines such as optionally substituted polytriphenylamines; pyrazoline compounds; benzidine compounds; stilbene compounds; triazines; substituted metallo- or metal-free porphines, phthalocyanines, fluorophthalocyanines, naphthalocyanines or fluoronaphthalocyanines; C$_{60}$ and C$_{70}$ fullerenes or derivatives thereof; N,N'-dialkyl, substituted dialkyl, diaryl or substituted diaryl-1,4,5,8-naphthalenetetracarboxylic diimide and fluoro derivatives; N,N'-dialkyl, substituted dialkyl, diaryl or substituted diaryl 3,4,9,10-perylenetetracarboxylicdiimide; bathophenanthroline; diphenoquinones; 1,3,4-oxadiazoles; 11,11,12,12-tetracyanonaptho-2,6-quinodimethane; α,α'-bis(dithieno[3,2-b2', 3'-d]thiophene); 2,8-dialkyl, substituted dialkyl, diaryl or substituted diaryl anthradithiophene; 2,2'-bibenzo[1,2-b:4,5-b]dithiophene. Preferred compounds are those from the above list and derivatives thereof which are soluble.

Especially preferred OSC materials are substituted polyacenes, such as 6,13-bis(trialkylsilylethynyl)pentacene or derivatives thereof, such as 5,11-bis(trialkylsilylethynyl)anthradithiophenes, as described for example in U.S. Pat. No. 6,690,029, WO 2005/055248 A1, or WO 2008/107089 A1. A further preferred OSC material is poly(3-substituted thiophene), very preferably poly(3-alkylthiophenes) (P3AT) wherein the alkyl group is preferably straight-chain and preferably has 1 to 12, most preferably 4 to 10 C-atoms, like e.g. poly(3-hexylthiophene).

Particularly preferred polymeric OSC compounds are polymers or copolymers comprising one or more repeating units selected from the group consisting of thiophene-2,5-diyl, 3-substituted thiophene-2,5-diyl, optionally substituted thieno[2,3-b]thiophene-2,5-diyl, optionally substituted thieno[3,2-b]thiophene-2,5-diyl, selenophene-2,5-diyl, 3-substituted selenophene-2,5-diyl, optionally substituted indenofluorene, optionally substituted phenanthrene and optionally substituted triarylamine.

The composition according to the present invention can comprise between 0.01 and 20% by weight, preferably between 0.1 and 15% by weight, more preferably between 0.2 and 10% by weight and most preferably between 0.25 and 5% by weight of OSC materials or the corresponding blend. The percent data relate to 100% of the solvent or solvent mixture. The composition may comprise one or more than one, preferably 1, 2, 3 or more than three OSC compounds.

The organic semiconductor compound used here is either a pure component or a mixture of two or more components, at least one of which must have semiconducting properties. In the case of the use of mixtures, however, it is not necessary for each component to have semiconducting properties. Thus, for example, inert low-molecular-weight compounds can be used together with semiconducting polymers. It is likewise possible to use non-conducting polymers, which serve as inert matrix or binder, together with one or more low-molecular-weight compounds or further polymers having semiconducting properties. For the purposes of this application, the potentially admixed non-conducting component is taken to mean an electro-optically inactive, inert, passive compound.

Preference is given to solutions of polymeric organic semiconductors, which optionally comprise further admixed substances. The molecular weight $M_w$ of the polymeric organic semiconductor is preferably greater than 10,000 g/mol, more preferably between 50,000 and 2,000,000 g/mol and most preferably between 100,000 and 1,000,000 g/mol.

For the purposes of the present invention, polymeric organic semiconductors are taken to mean, in particular, (i) substituted poly-p-arylenevinylenes (PAVs) as disclosed in EP 0443861, WO 94/20589, WO 98/27136, EP 1025183, WO 99/24526, DE 19953806 and EP 0964045 which are soluble in organic solvents, (ii) substituted polyfluorenes (PFs) as disclosed in EP 0842208, WO 00/22027, WO 00/22026, DE 19846767, WO 00/46321, WO 99/54385 and WO 00155927 which are soluble in organic solvents, (iii) substituted polyspirobifluorenes (PSFs) as disclosed in EP 0707020, WO 96/17036, WO 97/20877, WO 97/31048, WO 97/39045 and WO 031020790 which are soluble in organic solvents, (iv) substituted poly-para-phenylenes (PPPs) or -biphenylenes as disclosed in WO 92/18552, WO 95/07955, EP 0690086, EP 0699699 and WO 03/099901 which are soluble in organic solvents, (v) substituted polydihydrophenanthrenes (PDHPs) as disclosed in WO 05/014689 which are soluble in organic solvents, (vi) substituted poly-trans-indenofluorenes and poly-cis-indenofluorenes (PIFs) as disclosed in WO 04/041901 and WO 04/113412 which are soluble in organic solvents, (vii) substituted polyphenanthrenes as disclosed in DE 102004020298 which are soluble in organic solvents, (viii) substituted polythiophenes (PTs) as disclosed in EP 1028136 and WO 95/05937 which are soluble in organic solvents, (ix) polypyridines (PPys) as disclosed in T. Yamamoto et al., J. Am. Chem. Soc. 1994, 116, 4832 which are soluble in organic solvents, (x) polypyrroles as disclosed in V. Gelling et al., Polym. Prepr. 2000, 41, 1770 which are soluble in organic solvents, (xi) substituted, soluble copolymers having structural units from two or more of classes (i) to (x), as described, for example, in WO 02/077060, (xii) conjugated polymers as disclosed in Proc. of ICSM '98, Part I & II (in: Synth. Met 1999, 101/102) which are soluble in organic solvents, (xiii) substituted and unsubstituted polyvinylcarbazoles (PVKs), as disclosed, for example, in R. C. Penwell et al., J. Polym. Sci., Macromol Rev. 1978, 13, 63-160, (xiv) substituted and unsubstituted triarylamine polymers, as disclosed, for example, in JP 2000/072722, (xv) substituted and unsubstituted polysilylenes and polygermylenes, as disclosed, for example, in M. A. Abkowitz and M. Stolka, Synth. Met. 1996, 78, 333, and (xvi) soluble polymers containing phosphorescent units, as disclosed, for example in EP 1245659, WO 03/001616, WO 03/018653, WO 03/022908, WO 03/080687, EP 1311138, WO 031102109, WO 04/003105, WO 04/015025, DE 102004032527 and some of the specifications already cited above.

According to a further embodiment of the present invention, the organic semiconducting compound preferably has a molecular weight of 5000 g/mol or less, preferably a molecular weight of 2000 g/mol or less.

According to a special embodiment of the present invention, the OSC can be used for example as the active channel material in the semiconducting channel of an OFET, or as a layer element of an organic rectifying diode.

In case of OFET devices, where the OFET layer contains an OSC as the active channel material, it may be an n- or p-type OSC. The semiconducting channel may also be a composite of two or more OSC compounds of the same type, i.e. either n- or p-type. Furthermore, a p-type channel OSC compound may for example be mixed with an n-type OSC compound for the effect of doping the OSC layer. Multilayer semiconductors may also be used. For example, the OSC may be intrinsic near the insulator interface and a highly doped region can additionally be coated next to the intrinsic layer.

Preferred OSC compounds have a FET mobility of greater than $1\times10^{-5}$ cm$^2$V$^{-1}$s$^{-1}$, more preferably greater than $1\times10^{-2}$ cm$^2$Vs$^{-1}$.

Particularly preferred polymeric OSC compounds comprise one or more repeating unit selected from formulae P1 to P7:

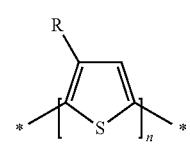

P1

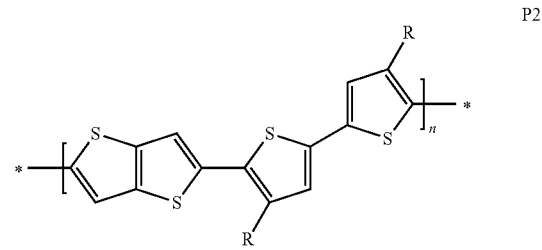

P2

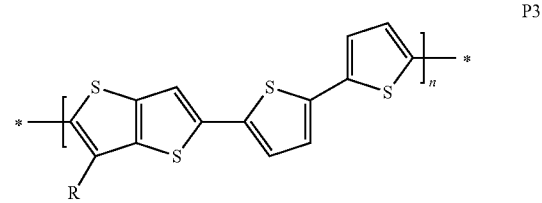

P3

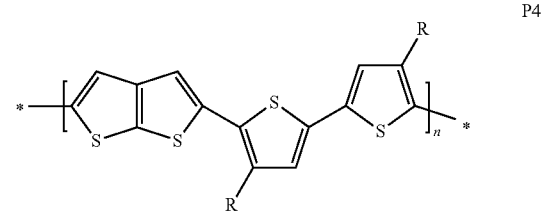

P4

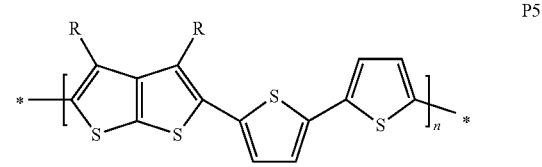

P5

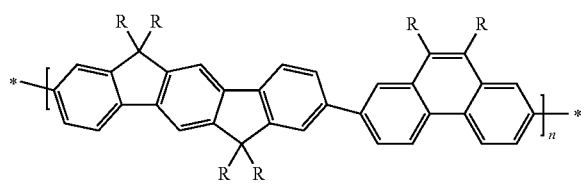

P6

-continued

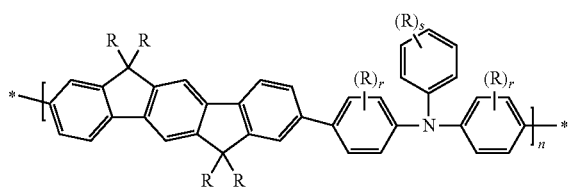

P7 wherein n is an integer >1, preferably from 10 to 1,000,

R on each occurrence identically or differently denotes H, F, Cl, Br, I, CN, a straight-chain, branched or cyclic alkyl group having from 1 to 40 C atoms, in which one or more C atoms are optionally replaced by O, S, O—CO, CO—O, —O—CO—O, $CR^0=CR^0$ or C≡C such that O- and/or S-atoms are not linked directly to each other, and in which one or more H atoms are optionally replaced by F, Cl, Br, I or CN, or denotes an aryl or heteroaryl group having from 4 to 20 ring atoms that is unsubstituted or substituted by one or more non-aromatic groups $R^s$, and wherein one or more groups R may also form a mono- or polycyclic, aliphatic or aromatic ring system with one another and/or with the ring to which they are attached, $R^s$ on each occurrence identically or differently denotes F, Cl, Br, I, CN, $Sn(R^{00})_3$, $Si(R^{00})_3$ or $B(R^{00})_2$ a straight-chain, branched or cyclic alkyl group having from 1 to 25 C atoms, in which one or more C atoms are optionally replaced by O, S, O—CO, CO—O, O—CO—O, $CR^0=CR^0$, such that O- and/or S-atoms are not linked directly to each other, and in which one or more H atoms are optionally replaced by F, Cl, Br, I or CN, or $R^s$ denotes an aryl or heteroaryl group having from 4 to 20 ring atoms that is unsubstituted or substituted by one or more non-aromatic groups $R^s$, and wherein one or more groups $R^s$ may also form a ring system with one another and/or with R, $R^0$ on each occurrence identically or differently denotes H, F, Cl, CN, alkyl having from 1 to 12 C atoms or aryl or heteroaryl having from 4 to 10 ring atoms, $R^{00}$ on each occurrence identically or differently denotes H or an aliphatic or aromatic hydrocarbon group having from 1 to 20 C atoms, wherein two groups $R^{00}$ may also form a ring together with the hetero atom (Sn, Si or B) to which they are attached, r is 0, 1, 2, 3 or 4, s is 0, 1, 2, 3, 4 or 5, wherein R in formulae P1 to P5 is preferably different from H.

Especially preferred monomeric OSC compounds are selected from the group consisting of substituted oligoacenes such as pentacene, tetracene or anthracene, or heterocyclic derivatives thereof, like bis(trialkylsilylethynyl) oligoacenes or bis(trialkylsilylethynyl) heteroacenes, as disclosed for example in U.S. Pat. No. 6,690,029, WO 2005/055248 A1 or U.S. Pat. No. 7,385,221.

Particularly preferred monomeric OSC compounds are selected from formula M1 (polyacenes):

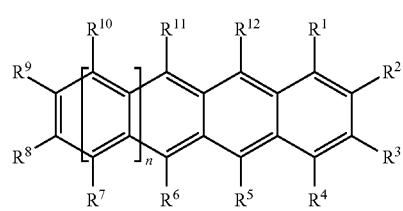

M1 wherein each of $R^1$, $R^2$, $R^3$, $R^4$, $R^5$, $R^6$, $R^7$, $R^8$, $R^9$, $R^{10}$, $R^{11}$ and $R^{12}$, which may be the same or different, independently represents hydrogen; an optionally substituted $C_1$-$C_{40}$ carbyl or hydrocarbyl group; an optionally substituted $C_1$-$C_{40}$ alkoxy group; an optionally substituted $C_6$-$C_{40}$ aryloxy group; an optionally substituted $C_7$-$C_{40}$ alkylaryloxy group; an optionally substituted $C_2$-$C_{40}$ alkoxycarbonyl group; an optionally substituted $C_7$-$C_{40}$ aryloxycarbonyl group; a cyano group (—CN); a carbamoyl group (—C(=O)NH$_2$); a haloformyl group (—C(=O)—X, wherein X represents a halogen atom); a formyl group (—C(=O)—H); an isocyano group; an isocyanate group; a thiocyanate group or a thioisocyanate group; an optionally substituted amino group; a hydroxy group; a nitro group; a CF$_3$ group; a halo group (Cl, Br, F); or an optionally substituted silyl or alkynylsilyl group; and wherein independently each pair of $R^1$ and $R^2$, $R^2$ and $R^3$, $R^3$ and $R^4$, $R^7$ and $R^8$, $R^8$ and $R^9$, $R^9$ and $R^{10}$, is optionally cross-bridged to form a $C_4$-$C_{40}$ saturated or unsaturated ring, which saturated or unsaturated ring may be intervened by an oxygen atom, a sulphur atom or a group of the formula —N($R^a$)—, wherein $R^a$ is a hydrogen atom or an optionally substituted hydrocarbon group, or may optionally be substituted; and wherein one or more of the carbon atoms of the polyacene skeleton may optionally be substituted by a heteroatom selected from N, P, As, O, S, Se and Te; and wherein independently any two or more of the substituents $R^1$-$R^{12}$ which are located on adjacent ring positions of the polyacene may, together, optionally constitute a further $C_4$-$C_{40}$ saturated or unsaturated ring optionally intervened by O, S or —N($R^a$) where $R^a$ is as defined above) or an aromatic ring system, fused to the polyacene; and wherein n is 0, 1, 2, 3 or 4 preferably n is 0, 1 or 2, most preferably n is 0 or 2, meaning that the polyacene compound is a pentacene compound (if n=2) or a "pseudo pentacene" compound (if n=0).

Very preferred are compounds of formula M1a (substituted pentacenes):

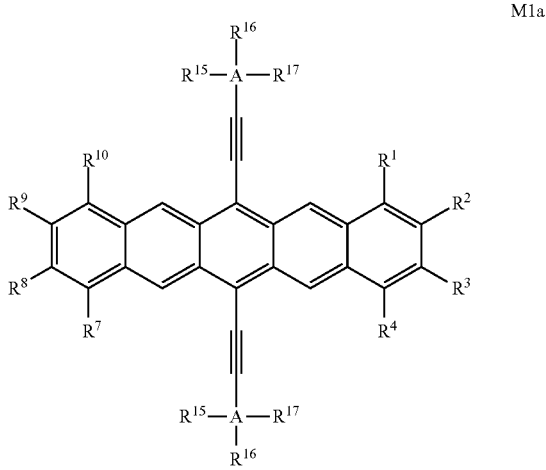

M1a wherein $R^1, R^2, R^3, R^4, R^7, R^8, R^9, R^{10}, R^{15}, R^{16}, R^{17}$ each independently are the same or different and each independently represents: H; an optionally substituted $C_1$-$C_{40}$ carbyl or hydrocarbyl group; an optionally substituted $C_1$-$C_{40}$ alkoxy group; an optionally substituted $C_6$-$C_{40}$ aryloxy group; an optionally substituted $C_7$-$C_{40}$ alkylaryloxy group; an optionally substituted $C_2$-$C_{40}$ alkoxycarbonyl group; an optionally substituted $C_7$-$C_{40}$ aryloxycarbonyl group; a cyano group (—CN); a carbamoyl group (—C(=O)NH$_2$); a haloformyl group (—C(=O)—X, wherein X represents a halogen atom); a formyl group (—C(=O)—H); an isocyano group; an isocyanate group; a thiocyanate group or a thioisocyanate group; an optionally substituted amino group; a hydroxy group; a nitro group; a CF$_3$ group; a halo group (Cl, Br, F); or an optionally substituted silyl group; and A represents Silicon or Germanium; and wherein independently each pair of $R^1$ and $R^2$, $R^2$ and $R^3$, $R^3$ and $R^4$, $R^7$ and $R^8$, $R^8$ and $R^9$, $R^9$ and $R^{10}$, $R^{15}$ and $R^{16}$, and $R^{16}$ and $R^{17}$ is optionally cross-bridged with each other to form a $C_4$-$C_{40}$ saturated or unsaturated ring, which saturated or unsaturated ring is optionally intervened by an oxygen atom, a sulphur atom or a group of the formula —N($R^a$)—, wherein $R^a$ is a hydrogen atom or a hydrocarbon group, or is optionally substituted; and wherein one or more of the carbon atoms of the polyacene skeleton is optionally substituted by a heteroatom selected from N, P, As, O, S, Se and Te.

Further preferred are compounds of formula M1b (substituted heteroacenes):

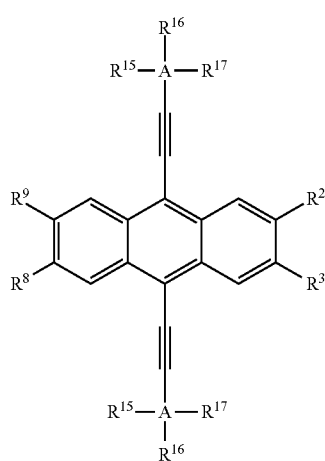

M1b wherein $R^2, R^3, R^8, R^9, R^{15}, R^{16}, R^{17}$ each independently are the same or different and each independently represents: H; an optionally substituted $C_1$-$C_{40}$ carbyl or hydrocarbyl group; an optionally substituted $C_1$-$C_{40}$ alkoxy group; an optionally substituted $C_3$-$C_{40}$ aryloxy group; an optionally substituted $C_7$-$C_{40}$ alkylaryloxy group; an optionally substituted $C_2$-$C_{40}$ alkoxycarbonyl group; an optionally substituted $C_7$-$C_{40}$ aryloxycarbonyl group; a cyano group (—CN); a carbamoyl group (—C(=O)NH$_2$); a haloformyl group (—C(=O)—X, wherein X represents a halogen atom); a formyl group (—C(=O)—H); an isocyano group; an isocyanate group; a thiocyanate group or a thioisocyanate group; an optionally substituted amino group; a hydroxy group; a nitro group; a CF$_3$ group; a halo group (Cl, Br, F); or an optionally substituted silyl group; and A represents Silicon or Germanium; and wherein independently each pair of $R^2$ and $R^3$, $R^8$ and $R^9$, $R^{15}$ and $R^{16}$, and $R^{16}$ and $R^{17}$ is optionally cross-bridged with each other to form a $C_4$-$C_{40}$ saturated or unsaturated ring, which saturated or unsaturated ring is optionally intervened by an oxygen atom, a sulphur atom or a group of the formula —N($R^a$)—, wherein $R^a$ is a hydrogen atom or a hydrocarbon group, and is optionally substituted; and wherein one or more of the carbon atoms of the polyacene skeleton is optionally substituted by a heteroatom selected from N, P, As, O, S, Se and Te.

Especially preferred are compounds of subformula M1b, wherein at least one pair of $R^2$ and $R^3$, and $R^8$ and $R^9$ is cross-bridged with each other to form a $C_4$-$C_{40}$ saturated or unsaturated ring, which is intervened by an oxygen atom, a sulphur atom or a group of the formula —N($R^a$)—, wherein $R^a$ is a hydrogen atom or a hydrocarbon group, and which is optionally substituted.

Especially preferred are compounds of subformula M1b1 (silylethynylated heteroacenes):

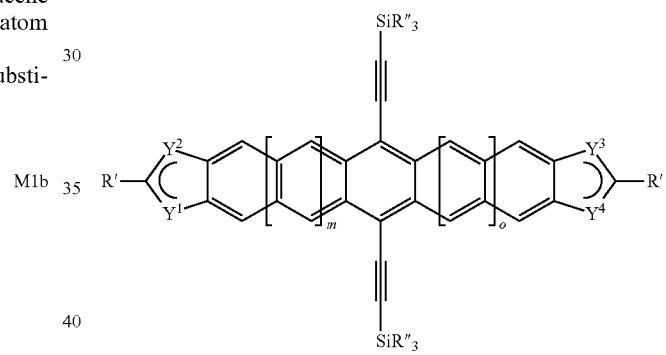

M1b1 wherein one of $Y^1$ and $Y^2$ denotes —CH= or =CH— and the other denotes —X—, one of $Y^3$ and $Y^4$ denotes —CH= or =CH— and the other denotes —X—, X is —O—, —S—, —Se— or —NR'''—, R' is H, F, Cl, Br, I, CN, straight-chain or branched alkyl or alkoxy that have 1 to 20, preferably 1 to 8 C-atoms and are optionally fluorinated or perfluorinated, optionally fluorinated or perfluorinated aryl having 6 to 30 C-atoms, preferably $C_6F_5$, or $CO_2R'''$, with R'''' being H, optionally fluorinated alkyl having 1 to 20 C-atoms or optionally fluorinated aryl having 2 to 30, preferably 5 to 20 C-atoms, R'' is, in case of multiple occurrence independently of one another, cyclic, straight-chain or branched alkyl or alkoxy that have 1 to 20, preferably 1 to 8 C-atoms, or aryl having 2 to 30 C-atoms, all of which are optionally fluorinated or perfluorinated, with SiR''$_3$ preferably being trialkylsilyl, R''' is H or cyclic, straight-chain or branched alkyl with 1 to 10 C-atoms, preferably H, m is 0 or 1, o is 0 or 1.

Especially preferred are compounds of formula M1b1 wherein m and o are 0, and/or X is S, and/or R' is F.

In a preferred embodiment the compound of subformula M1b1 is provided and used as a mixture of the anti- and syn-isomers of the following formulae

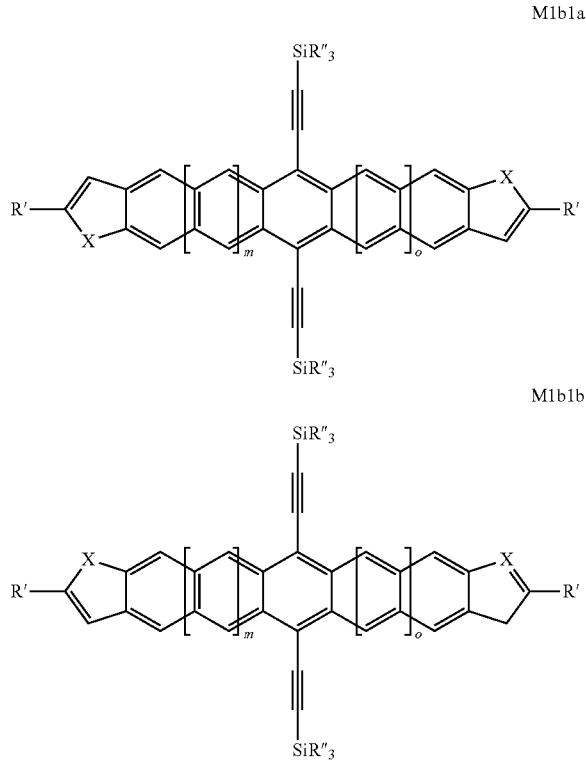

M1b1a

M1b1b wherein X, R, R', m and o have independently of each other one of the meanings given in formula M1b1 or one of the preferred meanings given above and below, X is preferably S, and m and o are preferably 0.

The term "carbyl group" as used above and below denotes any monovalent or multivalent organic radical moiety which comprises at least one carbon atom either without any non-carbon atoms (like for example —C≡C—), or optionally combined with at least one non-carbon atom such as N, O, S, P, Si, Se, As, Te or Ge (for example carbonyl etc.). The term "hydrocarbyl group" denotes a carbyl group that does additionally contain one or more H atoms and optionally contains one or more heteroatoms like for example N, O, S, P, Si, Se, As, Te or Ge. A carbyl or hydrocarbyl group comprising a chain of 3 or more C-atoms may also be straight-chain, branched and/or cyclic, including spiro and/or fused rings.

Preferred carbyl and hydrocarbyl groups include alkyl, alkoxy, alkylcarbonyl, alkoxycarbonyl, alkylcarbonyloxy and alkoxycarbonyloxy, each of which is optionally substituted and has 1 to 40, preferably 1 to 25, more preferably 1 to 18 C atoms, furthermore optionally substituted aryl or aryloxy having 6 to 40, preferably 6 to 25 C atoms, furthermore alkylaryloxy, arylcarbonyl, aryloxycarbonyl, arylcarbonyloxy and aryloxycarbonyloxy, each of which is optionally substituted and has 6 to 40, preferably 7 to 40 C-atoms, wherein all these groups optionally contain one or more heteroatoms, especially selected from N, O, S, P, Si, Se, As, Te and Ge.

The carbyl or hydrocarbyl group may be a saturated or unsaturated acyclic group, or a saturated or unsaturated cyclic group. Unsaturated acyclic or cyclic groups are preferred, especially aryl, alkenyl and alkynyl groups (especially ethynyl). Where the $C_1$-$C_{40}$ carbyl or hydrocarbyl group is acyclic, the group may be straight-chain or branched. The $C_1$-$C_{40}$ carbyl or hydrocarbyl group includes for example: a $C_1$-$C_{40}$ alkyl group, a $C_2$-$C_{40}$ alkenyl group, a $C_2$-$C_{40}$ alkynyl group, a $C_3$-$C_{40}$ alkyl group, a $C_4$-$C_{40}$ alkyldienyl group, a $C_4$-$C_{40}$ polyenyl group, a $C_6$-$C_{18}$ aryl group, a $C_6$-$C_{40}$ alkylaryl group, a $C_6$-$C_{40}$ arylalkyl group, a $C_4$-$C_{40}$ cycloalkyl group, a $C_4$-$C_{40}$ cycloalkenyl group, and the like. Preferred among the foregoing groups are a $C_1$-$C_{20}$ alkyl group, a $C_2$-$C_{20}$ alkenyl group, a $C_2$-$C_{20}$ alkynyl group, a $C_3$-$C_{20}$ alkyl group, a $C_4$-$C_{20}$ alkyldienyl group, a $C_6$-$C_{12}$ aryl group and a $C_4$-$C_{20}$ polyenyl group, respectively. Also included are combinations of groups having carbon atoms and groups having heteroatoms, like e.g. an alkynyl group, preferably ethynyl, that is substituted with a silyl group, preferably a trialkylsilyl group.

Aryl and heteroaryl preferably denote a mono-, bi- or tricyclic aromatic or heteroaromatic group with up to 25 C-atoms that may also comprise condensed rings and is optionally substituted with one or more groups L, wherein L is halogen or an alkyl, alkoxy, alkylcarbonyl or alkoxycarbonyl group with 1 to 12 C-atoms, wherein one or more H atoms may be replaced by F or Cl.

Especially preferred aryl and heteroaryl groups are phenyl in which, in addition, one or more CH groups may be replaced by N, naphthalene, thiophene, selenophene, thienothiophene, dithienothiophene, fluorene and oxazole, all of which can be unsubstituted, mono- or polysubstituted with L as defined above.

Especially preferred substituents R, $R^s$ and $R^{1-17}$ in the above formulae and subformulae are selected from straight chain, branched or cyclic alkyl having from 1 to 20 C-atoms, which is unsubstituted or mono- or polysubstituted by F, Cl, Br or I, and wherein one or more non-adjacent $CH_2$ groups are optionally replaced, in each case independently from one another, by —O—, —S—, —$NR^b$—, —$SiR^bR^c$—, —$CX^1$=$CX^2$— or —C≡C— in such a manner that O and/or S atoms are not linked directly to one another, or denotes optionally substituted aryl or heteroaryl preferably having from 1 to 30 C-atoms, with $R^b$ and $R^b$ being independently of each other H or alkyl having from 1 to 12 C-atoms, and $X^1$ and $X^2$ being independently of each other H, F, Cl or CN.

$R^{15-17}$ and R" are preferably identical or different groups selected from a $C_1$-$C_{40}$-alkyl group, preferably $C_1$-$C_4$-alkyl, most preferably methyl, ethyl, n-propyl or isopropyl, a $C_6$-$C_{40}$-aryl group, preferably phenyl, a $C_6$-$C_{40}$-arylalkyl group, a $C_1$-$C_{40}$-alkoxy group, or a $C_6$-$C_{40}$-arylalkyloxy group, wherein all these groups are optionally substituted for example with one or more halogen atoms. Preferably, $R^{15-17}$ and R" are each independently selected from optionally substituted $C_{1-12}$-alkyl, more preferably $C_{1-4}$-alkyl, most preferably $C_{1-3}$-alkyl, for example isopropyl, and optionally substituted $C_{6-10}$-aryl, preferably phenyl. Further preferred is a silyl group of formula —$SiR^{15}R^{16}$ wherein $R^{15}$ is as defined above and $R^{16}$ forms a cyclic silyl alkyl group together with the Si atom, preferably having 1 to 8 C-atoms.

In one preferred embodiment all of $R^{15-17}$, or all of R", are identical groups, for example identical, optionally substituted, alkyl groups, as in triisopropylsilyl. More preferably all of $R^{15-17}$, or all of R", are identical, optionally substituted $C_{1-10}$, more preferably $C_{1-4}$, most preferably $C_{1-3}$ alkyl groups. A preferred alkyl group in this case is isopropyl.

Preferred groups —$SiR^{15}R^{16}R^{17}$ and $SiR"_3$ include, without limitation, trimethylsilyl, triethylsilyl, tripropylsilyl, dimethylethylsilyl, diethylmethylsilyl, dimethylpropylsilyl, dimethylisopropylsilyl, dipropylmethylsilyl, diisopropylmethylsilyl, dipropylethylsilyl, diisopropylethylsilyl, diethylisopropylsilyl, triisopropylsilyl, trimethoxysilyl, triethoxysilyl, triphenylsilyl, diphenylisopropylsilyl, diisopropylphenylsilyl, diphenylethylsilyl, diethylphenylsilyl, diphenylmethylsilyl, triphenoxysilyl, dimethylmethoxysilyl, dimethylphenoxysilyl, methylmethoxyphenylsilyl, etc., wherein the alkyl, aryl or alkoxy group is optionally substituted.

According to a preferred embodiment of the present invention the OSC material is an organic light emitting material and/or charge transporting material. The organic light emitting materials and charge transporting materials can be selected from standard materials known to the skilled person and described in the literature. Organic light emitting material according to the present application means a material which emits light having a $\lambda_{max}$ in the range from 400 to 700 nm.

Suitable phosphorescent compounds are, in particular, compounds which emit light, preferably in the visible region, on suitable excitation and in addition contain at least one atom having an atomic number greater than 20, preferably greater than 38 and less than 84, more preferably greater than 56 and less than 80. The phosphorescence emitters used are preferably compounds which contain copper, molybdenum, tungsten, rhenium, ruthenium, osmium, rhodium, iridium, palladium, platinum, silver, gold or europium, in particular compounds which contain iridium or platinum.

Particularly preferred organic phosphorescent compounds are compounds of formulae (1) to (4):

$$A\text{—}Ir\begin{bmatrix}DCy\\|\\CCy\end{bmatrix}_2 \quad \text{formula (1)}$$

$$Ir\begin{bmatrix}DCy\\|\\CCy\end{bmatrix}_3 \quad \text{formula (2)}$$

$$A\text{—}Pt\begin{matrix}DCy\\|\\CCy\end{matrix} \quad \text{formula (3)}$$

$$Pt\begin{bmatrix}DCy\\|\\CCy\end{bmatrix}_2 \quad \text{formula (4)}$$

where
DCy is, identically or differently on each occurrence, a cyclic group which contains at least one donor atom, preferably nitrogen, carbon in the form of a carbene or phosphorus, via which the cyclic group is bonded to the metal, and which may in turn carry one or more substituents $R^{18}$; the groups DCy and CCy are connected to one another via a covalent bond;
CCy is, identically or differently on each occurrence, a cyclic group which contains a carbon atom via which the cyclic group is bonded to the metal and which may in turn carry one or more substituents $R^{18}$;
A is, identically or differently on each occurrence, a monoanionic, bidentate chelating ligand, preferably a diketonate ligand;
$R^{18}$ are identically or differently at each instance, and are F, Cl, Br, I, $NO_2$, CN, a straight-chain, branched or cyclic alkyl or alkoxy group having from 1 to 20 carbon atoms, in which one or more nonadjacent $CH_2$ groups may be replaced by —O—, —S—, —$NR^{19}$—, —$CONR^{19}$—, —CO—O—, —C=O—, —CH=CH— or —C≡C—, and in which one or more hydrogen atoms may be replaced by F, or an aryl or heteroaryl group which has from 4 to 14 carbon atoms and may be substituted by one or more nonaromatic $R^{18}$ radicals, and a plurality of substituents $R^{18}$, either on the same ring or on the two different rings, may together in turn form a mono- or polycyclic, aliphatic or aromatic ring system; and $R^{19}$ are identically or differently at each instance, and are a straight-chain, branched or cyclic alkyl or alkoxy group having from 1 to 20 carbon atoms, in which one or more nonadjacent $CH_2$ groups may be replaced by —O—, —S—, —CO—O—, —C=O—, —CH=CH— or —C≡C—, and in which one or more hydrogen atoms may be replaced by F, or an aryl or heteroaryl group which has from 4 to 14 carbon atoms and may be substituted by one or more nonaromatic $R^{18}$ radicals.

Formation of ring systems between a plurality of radicals $R^{18}$ means that a bridge may also be present between the groups DCy and CCy. Furthermore, formation of ring systems between a plurality of radicals $R^{18}$ means that a bridge may also be present between two or three ligands CCy-DCy or between one or two ligands CCy-DCy and the ligand A, giving a polydentate or polypodal ligand system.

Examples of the emitters described above are revealed by the applications WO 00/70655, WO 01/41512, WO 02/02714, WO 02/15645, EP 1191613, EP 1191612, EP 1191614, WO 04/081017, WO 05/033244, WO 05/042550, WO 05/113563, WO 06/008069, WO 06/061182, WO 06/081973 and DE 102008027005. In general, all phosphorescent complexes as are used in accordance with the prior art for phosphorescent OLEDs and as are known to the person skilled in the art in the area of organic electroluminescence are suitable, and the person skilled in the art will be able to use further phosphorescent compounds without inventive step. In particular, it is known to the person skilled in the art which phosphorescent complexes emit with which emission colour.

Examples of preferred phosphorescent compounds are shown in the following table.

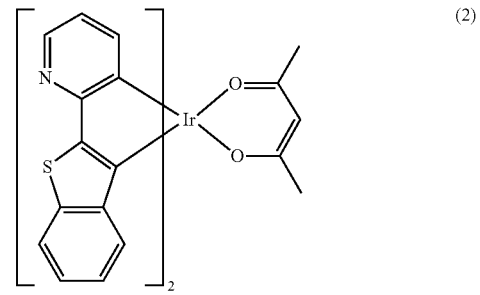

(1)

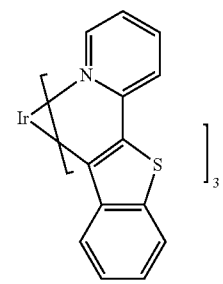

(2)

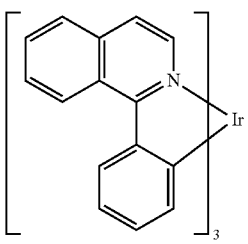 (3)
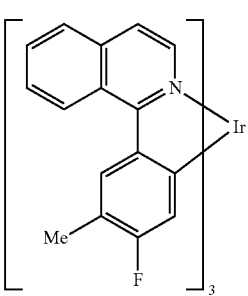 (4)
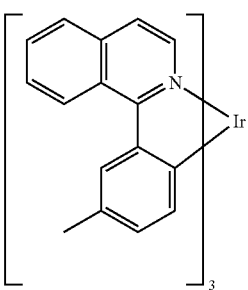 (5)
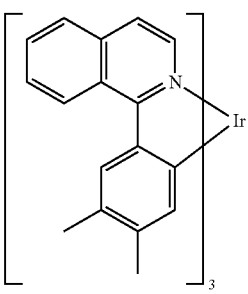 (6)
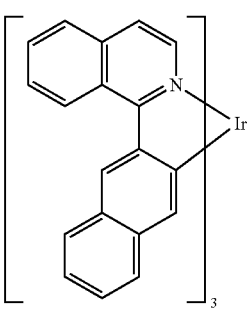 (7)
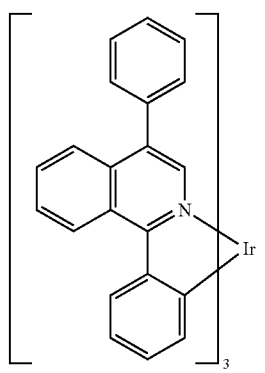 (8)
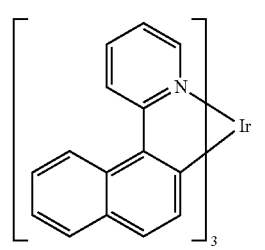 (9)
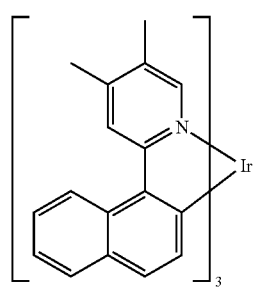 (10)
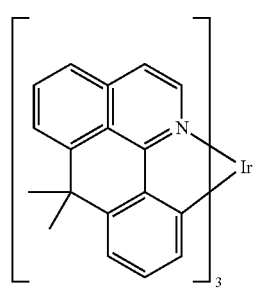 (11)
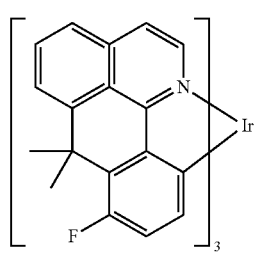 (12)

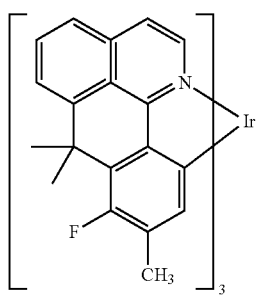 (13)
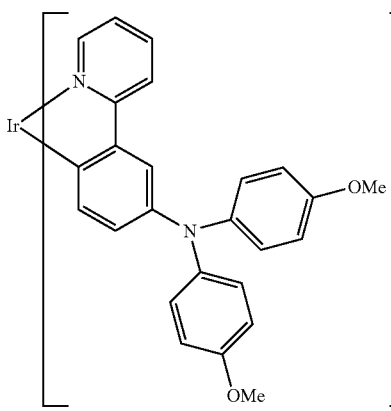 (17)
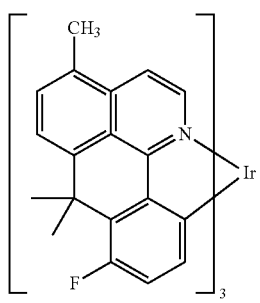 (14)
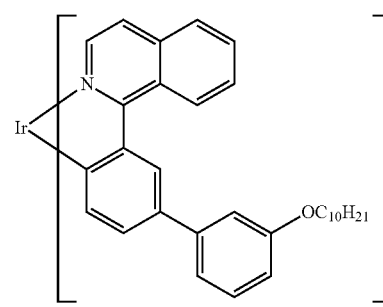 (18)
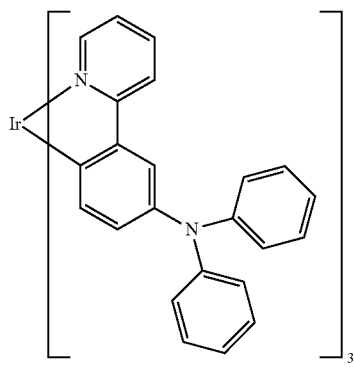 (15)
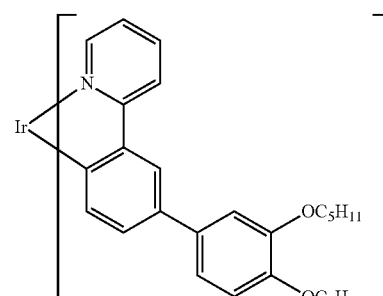 (19)
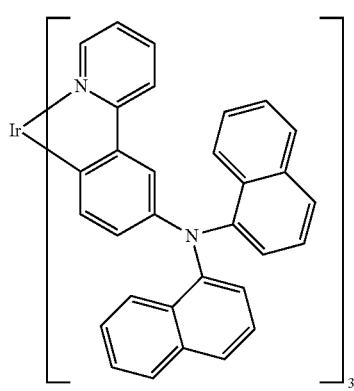 (16)
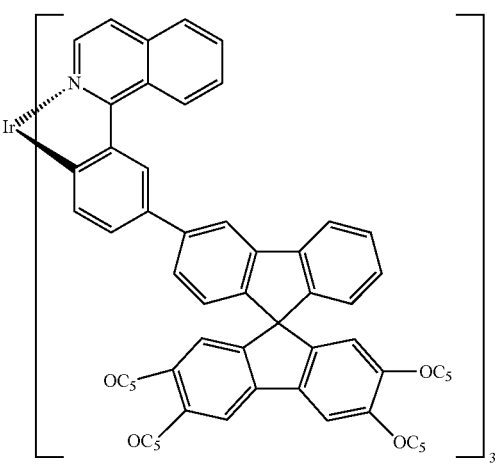 (20)

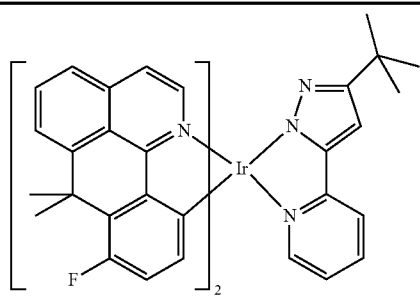 (21)
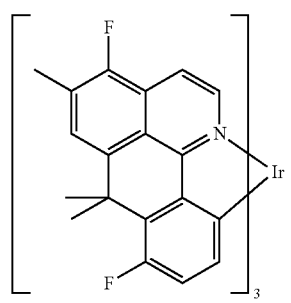 (22)
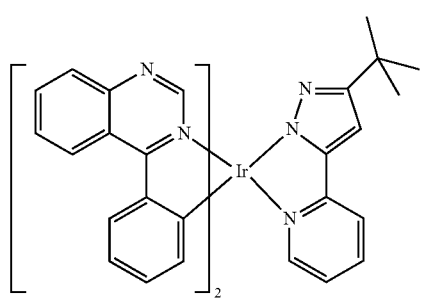 (23)
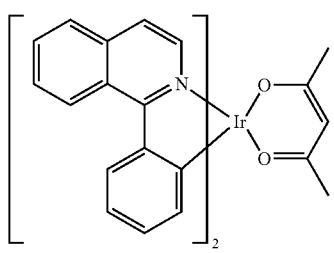 (24)
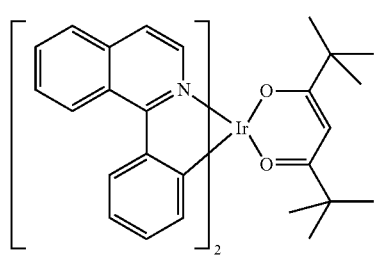 (25)
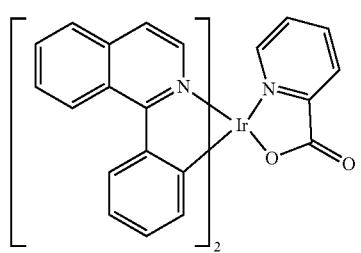 (26)
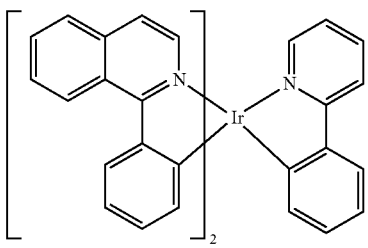 (27)
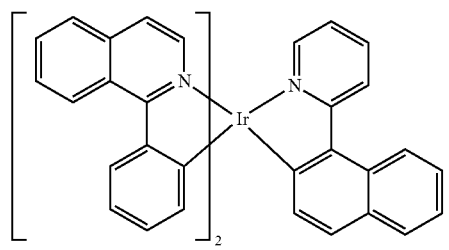 (28)
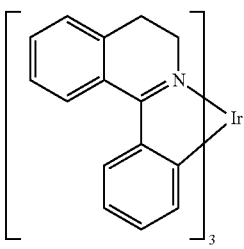 (29)
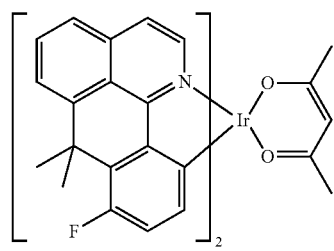 (30)
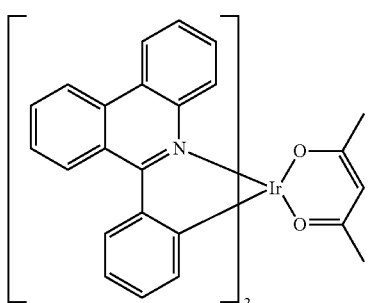 (31)
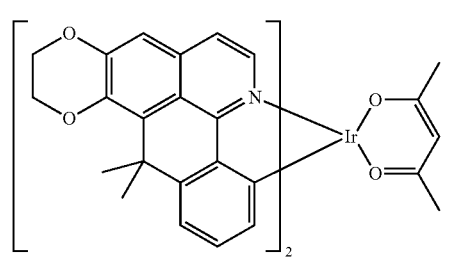 (32)

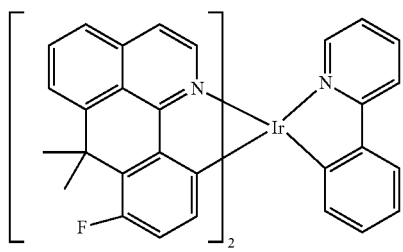 (33)
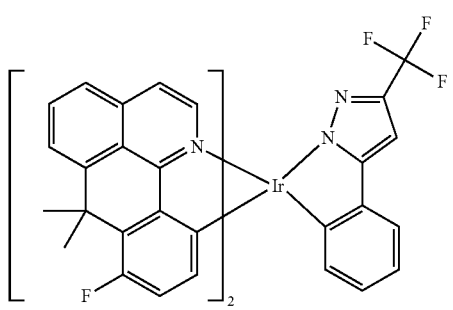 (34)
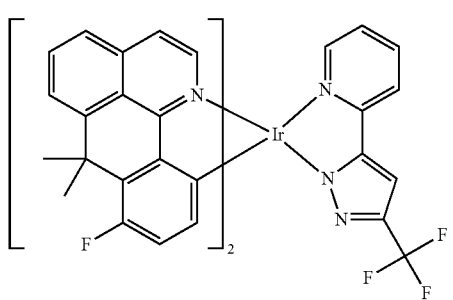 (35)
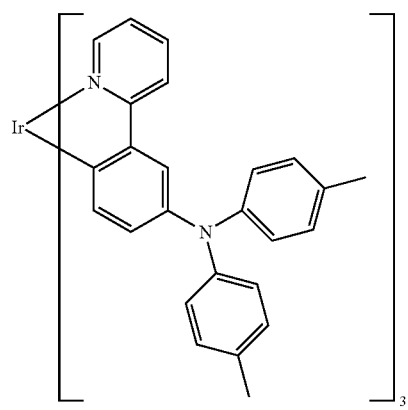 (36)
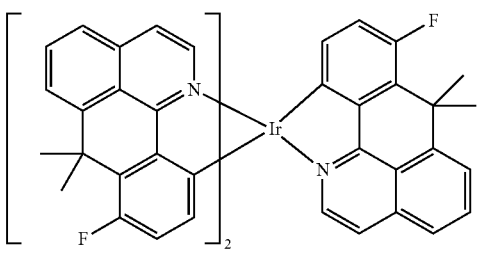 (37)
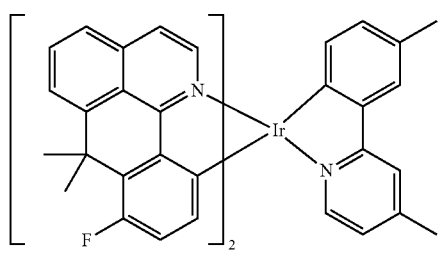 (38)
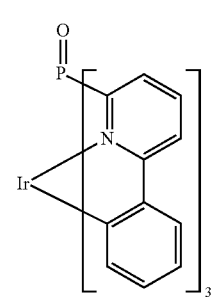 (39)
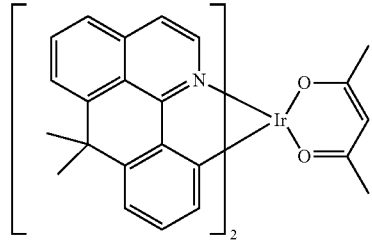 (40)
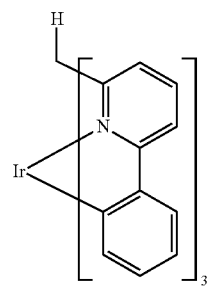 (41)
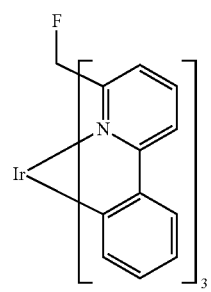 (42)

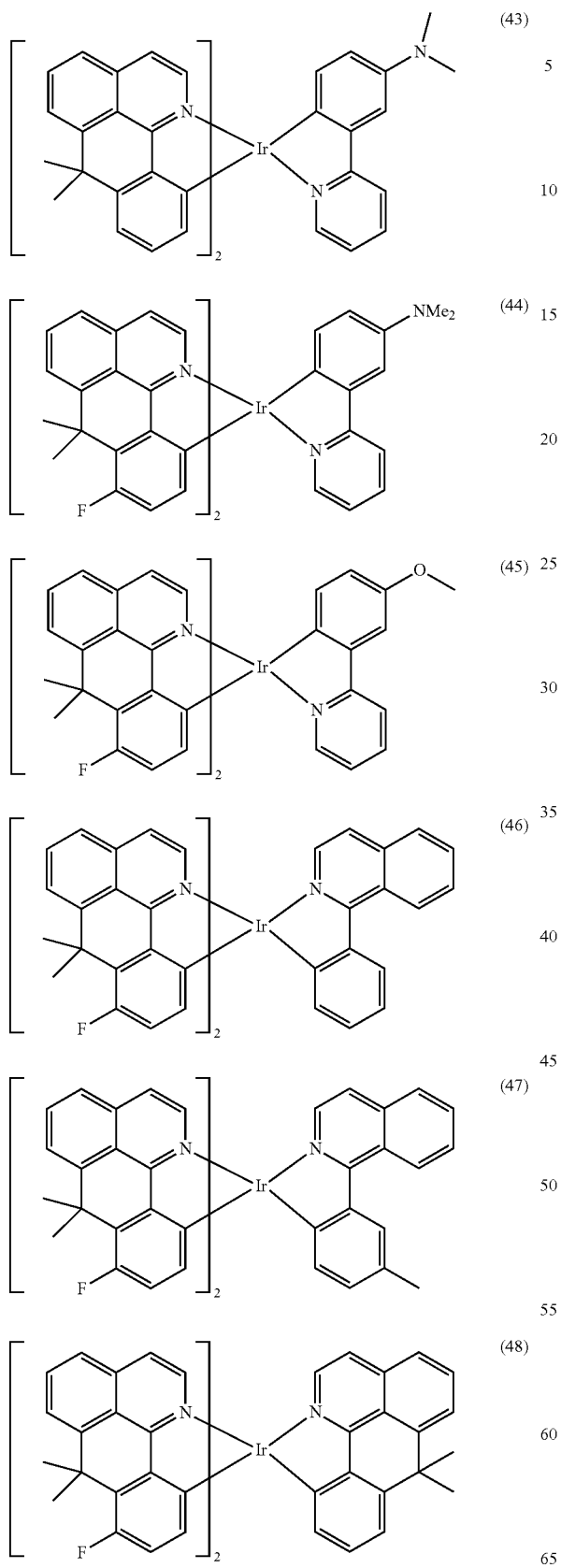
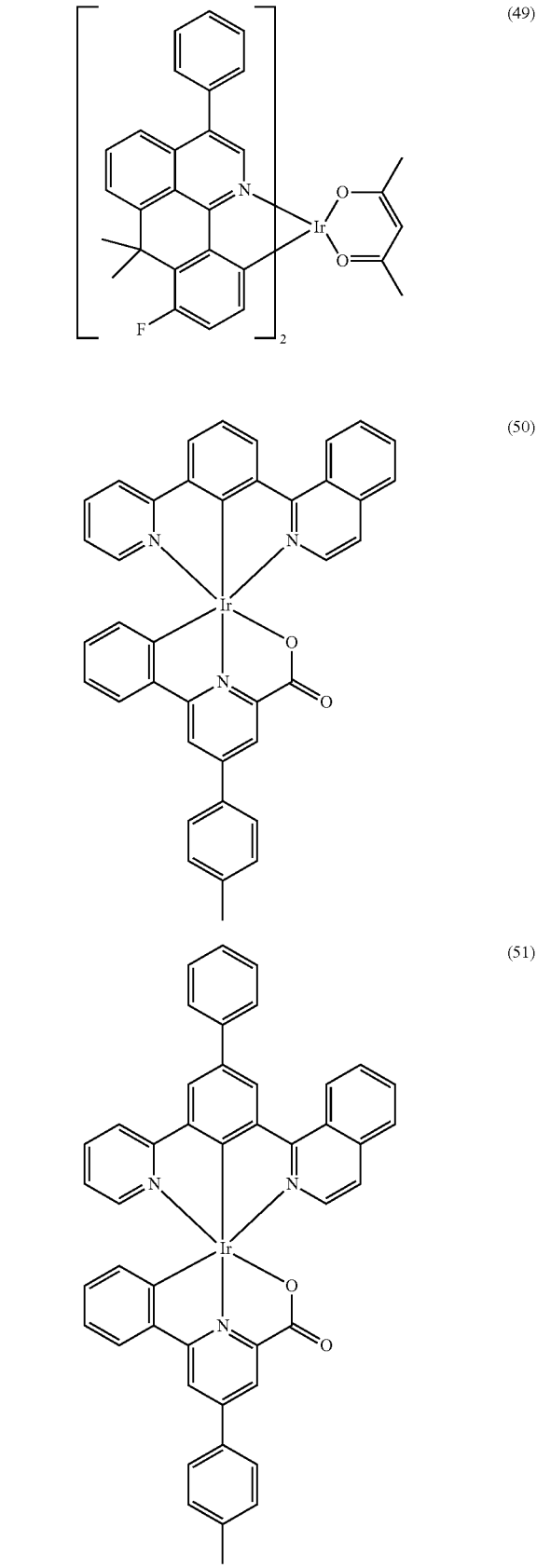

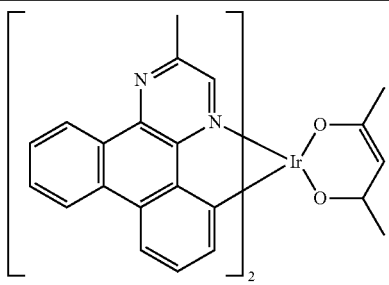 (52)
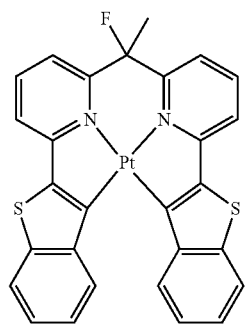 (53)
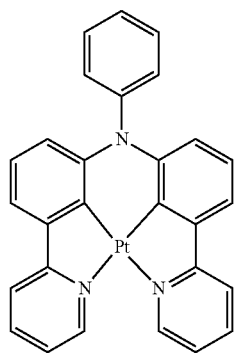 (54)
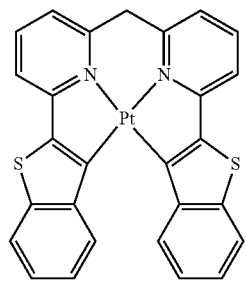 (55)
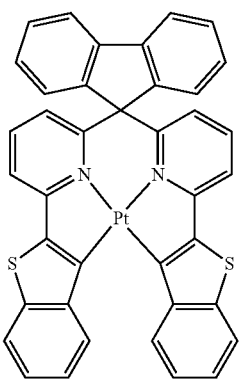 (56)
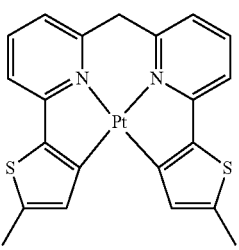 (57)
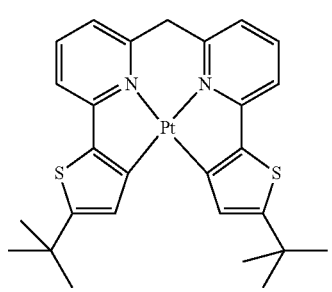 (58)
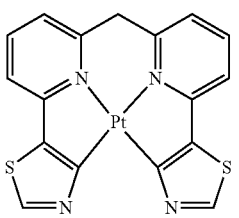 (59)
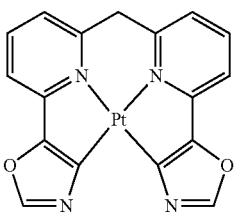 (60)
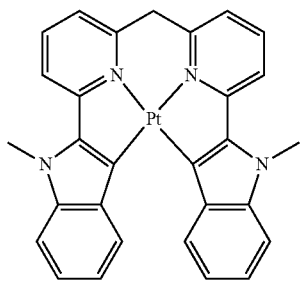 (61)
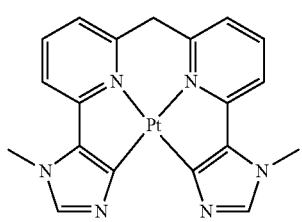 (62)

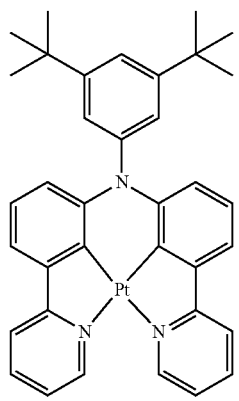 (63)
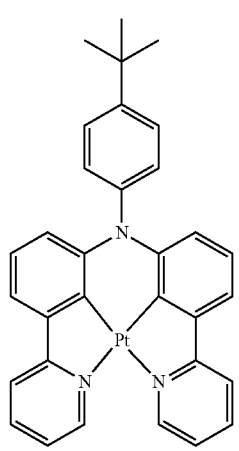 (64)
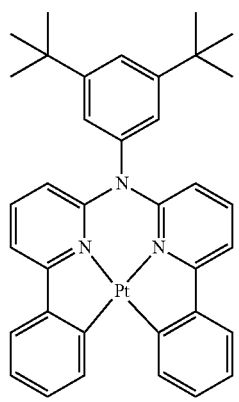 (65)
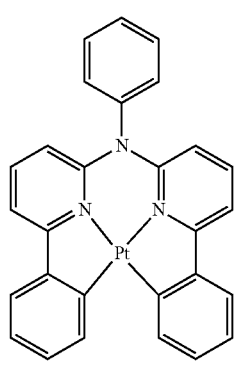 (66)
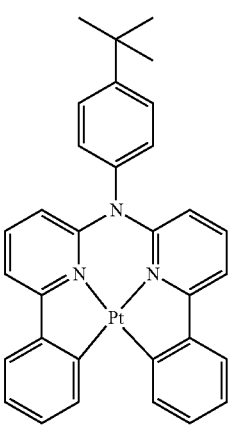 (67)
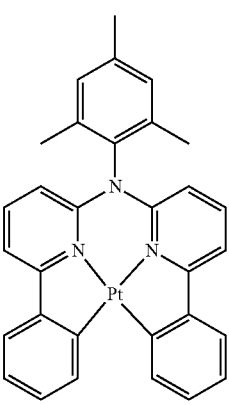 (68)
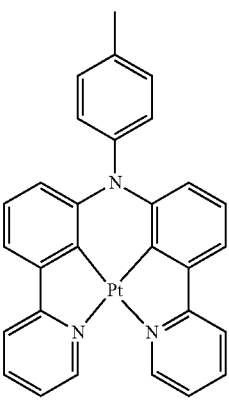 (69)

-continued
(70) 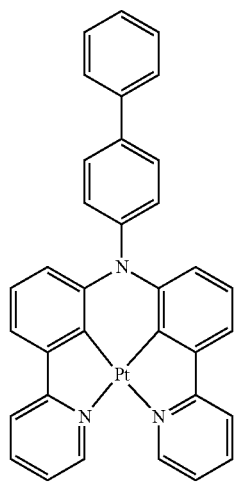
(71) 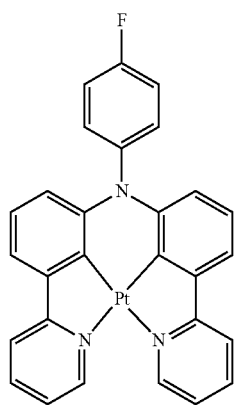
(72) 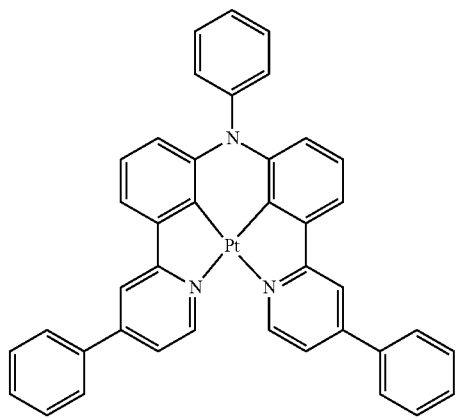
-continued
(73) 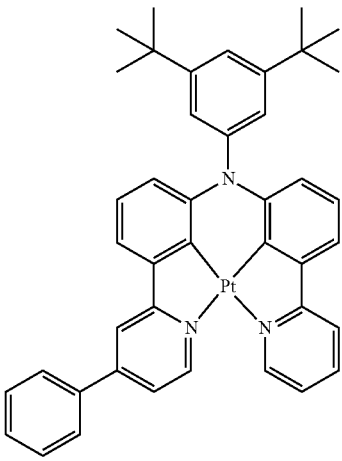
(74) 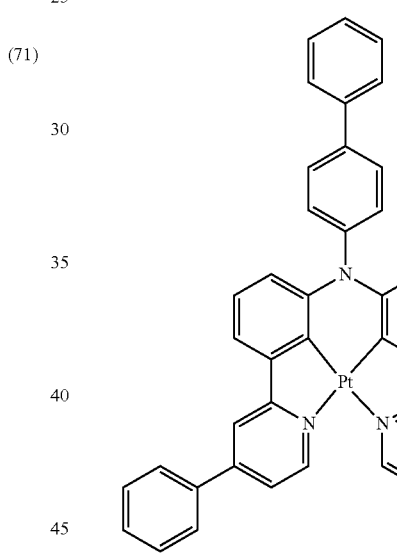
(75) 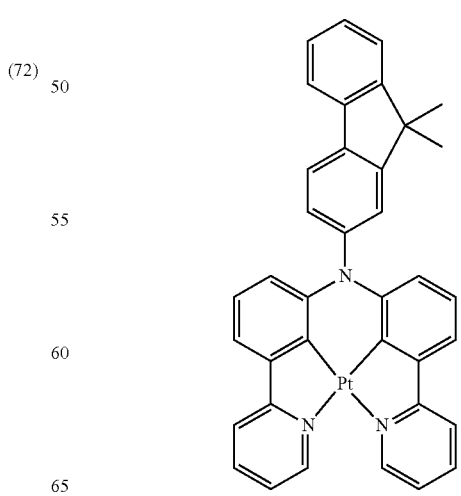

-continued
(76)
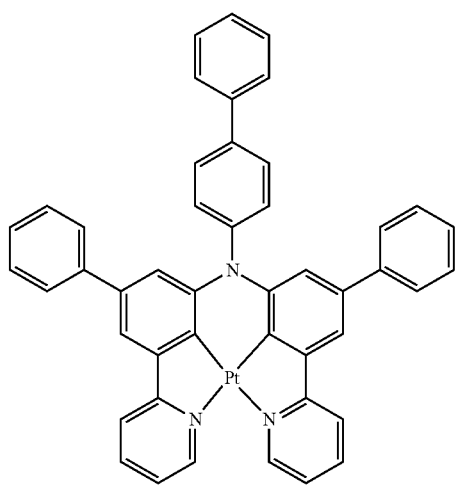
(77)
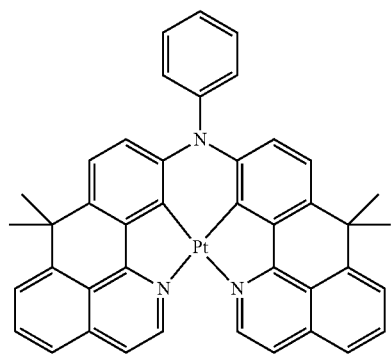
(78)
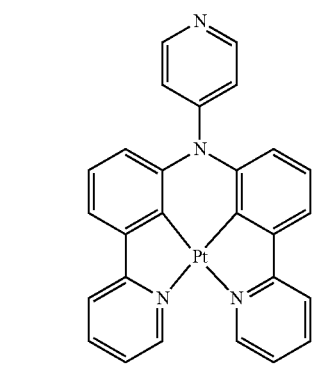
(79)
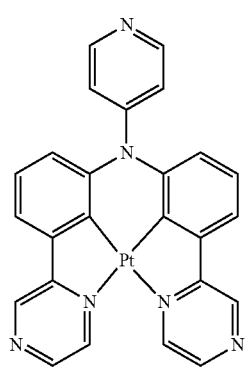
-continued
(80)
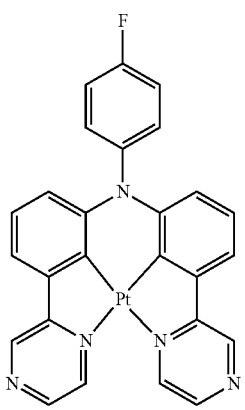
(81)
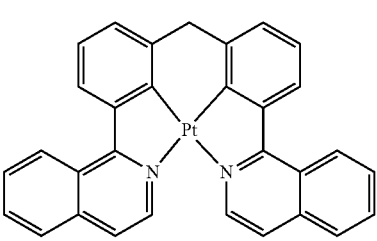
(82)
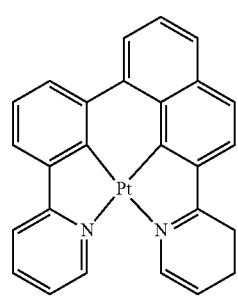
(83)
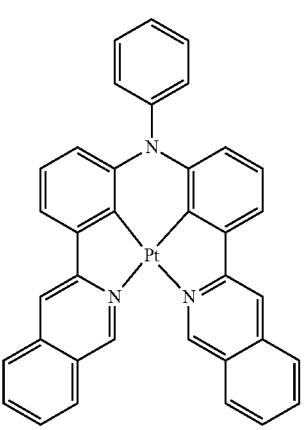

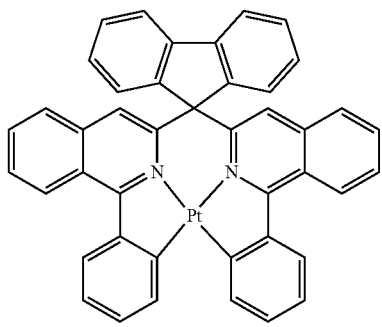
(84)
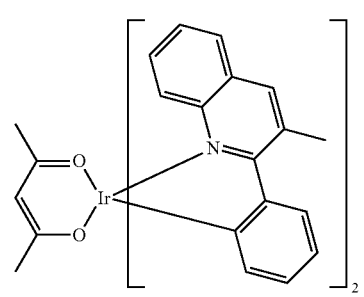
(85)
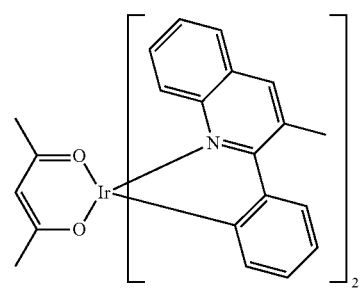
(86)
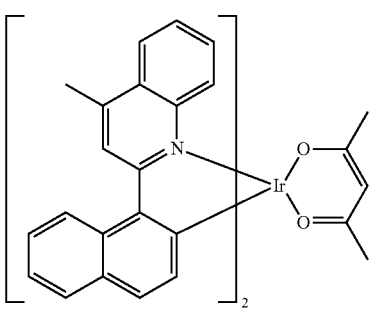
(87)
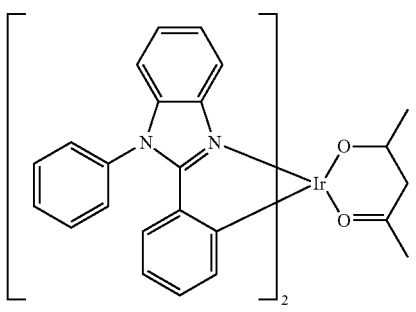
(88)
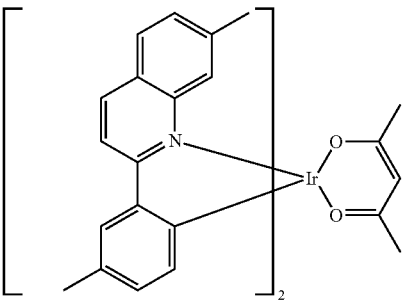
(89)
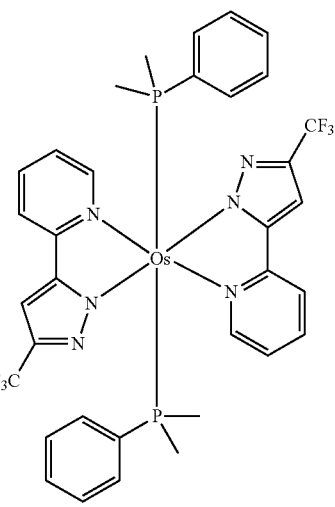
(90)
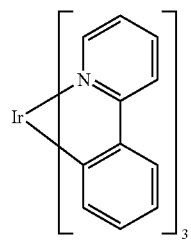
(91)
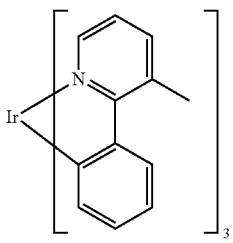
(92)
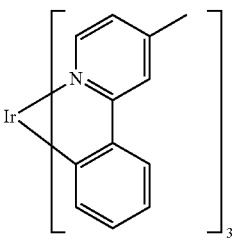
(93)

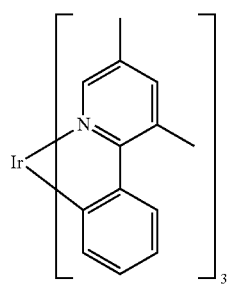 (94)
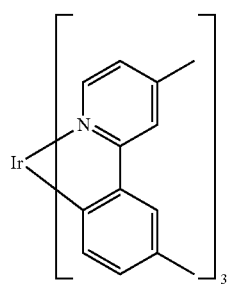 (95)
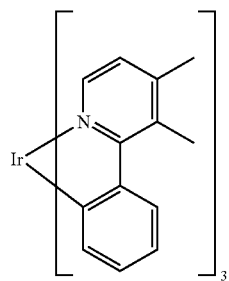 (96)
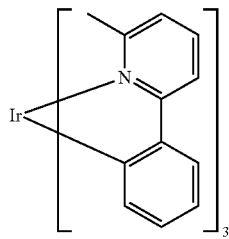 (97)
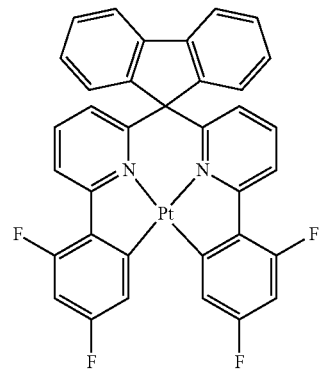 (98)
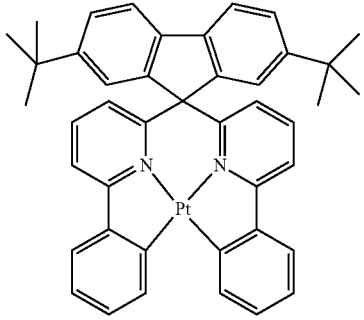 (99)
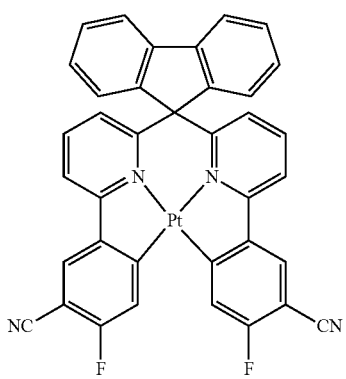 (100)
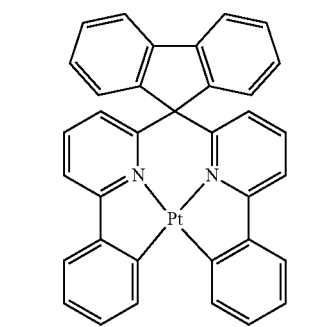 (101)
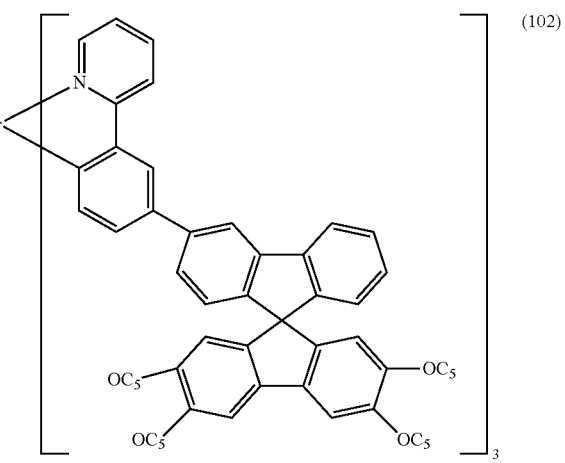 (102)

(103) 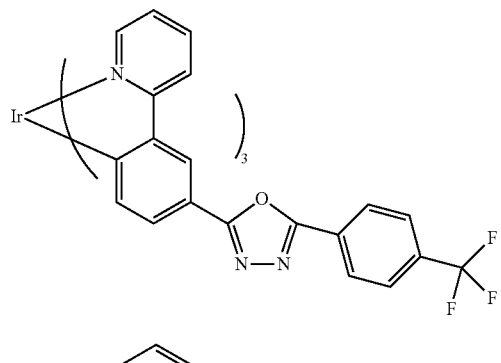
(104) 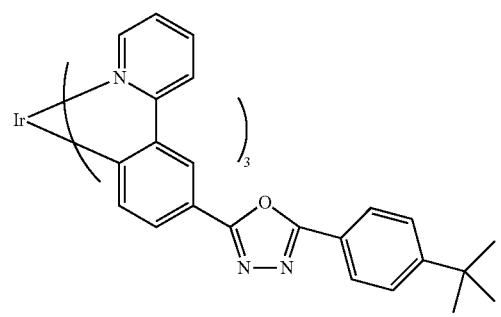
(105) 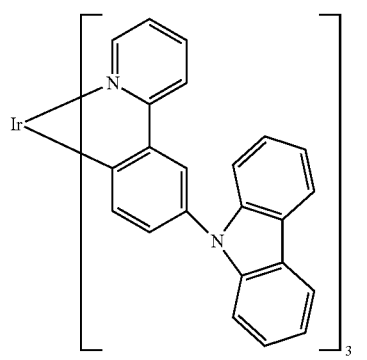
(106) 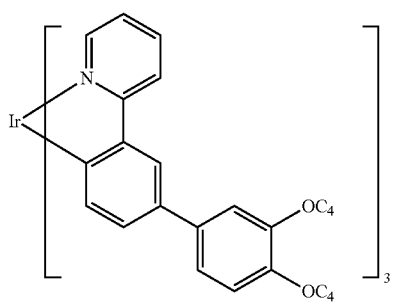
(107) 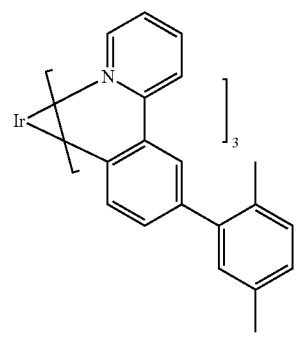
(108) 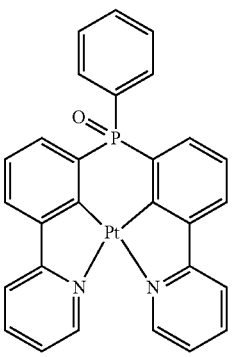
(109) 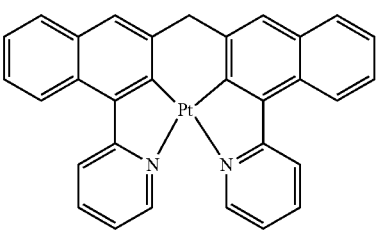
(110) 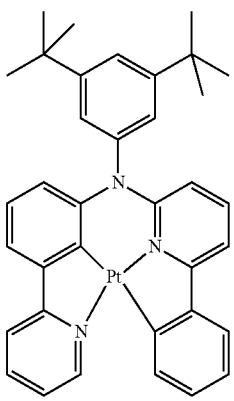
(111) 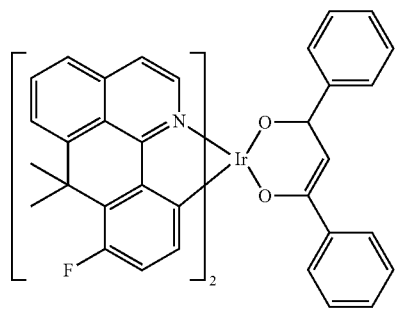
(112) 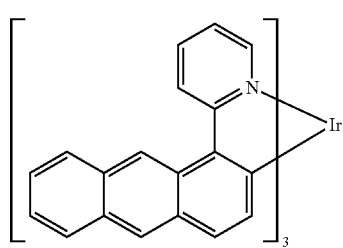

-continued
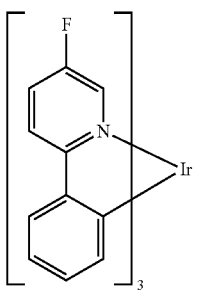
(113)
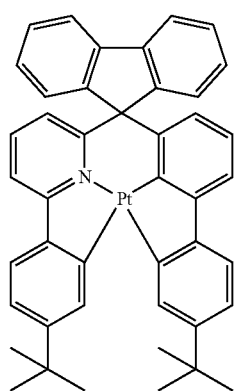
(114)
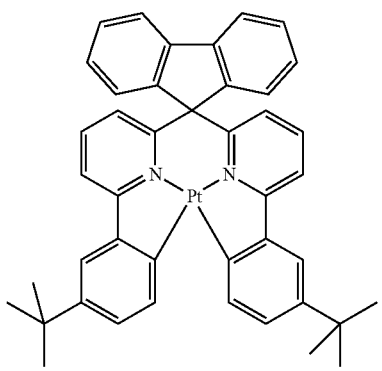
(115)
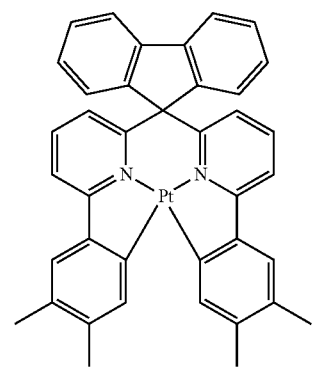
(116)
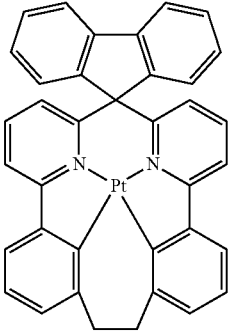
(117)
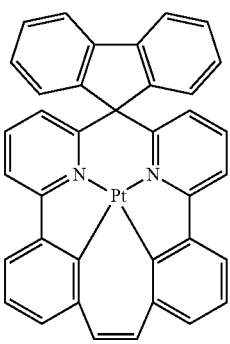
(118)
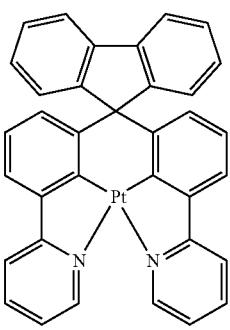
(119)
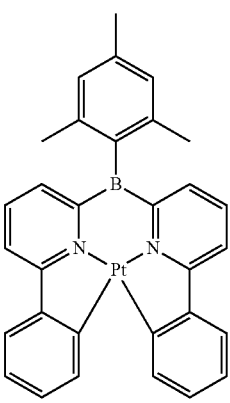
(120)

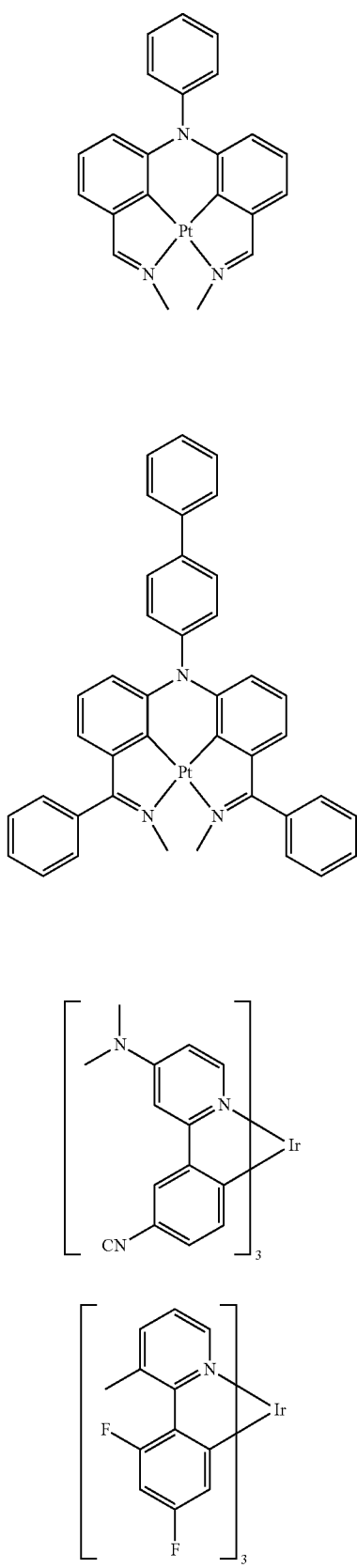
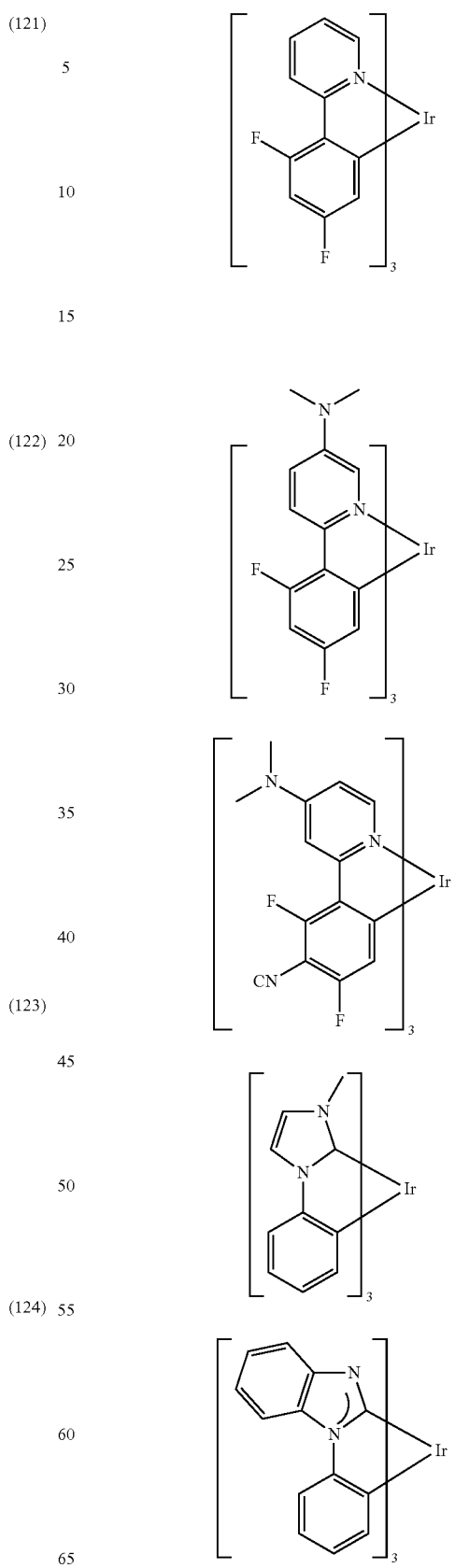

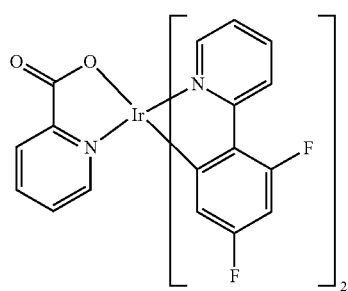 (130)
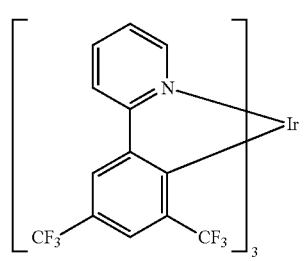 (131)
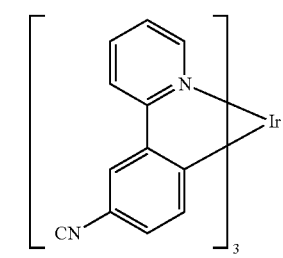 (132)
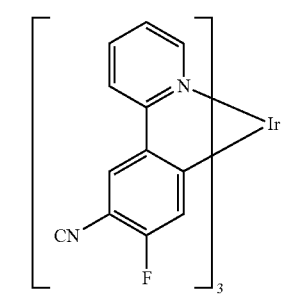 (133)
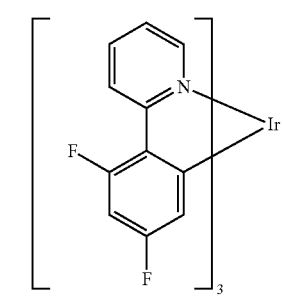 (134)
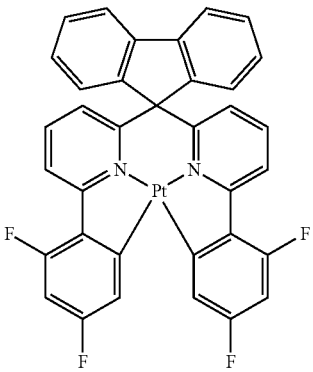 (135)
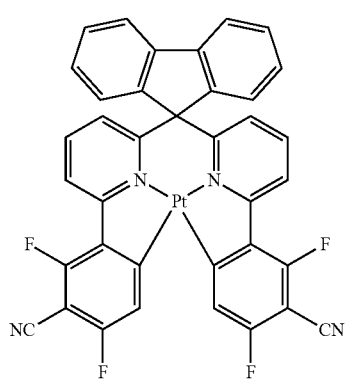 (136)
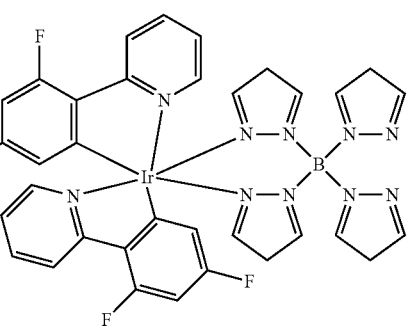 (137)
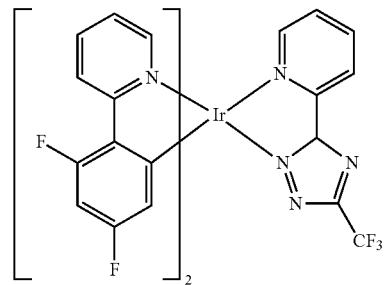 (138)

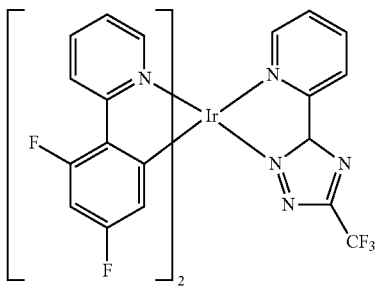

(139)

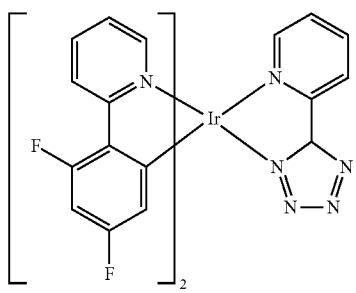

(140)

Preferred dopants are selected from the class of the monostyrylamines, the distyrylamines, the tristyrylamines, the tetrastyrylamines, the styrylphosphines, the styryl ethers and the arylamines. A monostyrylamine is taken to mean a compound which contains one substituted or unsubstituted styryl group and at least one, preferably aromatic, amine. A distyrylamine is taken to mean a compound which contains two substituted or unsubstituted styryl groups and at least one, preferably aromatic, amine. A tristyrylamine is taken to mean a compound which contains three substituted or unsubstituted styryl groups and at least one, preferably aromatic, amine. A tetrastyrylamine is taken to mean a compound which contains four substituted or unsubstituted styryl groups and at least one, preferably aromatic, amine. The styryl groups are particularly preferably stilbenes, which may also be further substituted. Corresponding phosphines and ethers are defined analogously to the amines. For the purposes of the present invention, an arylamine or an aromatic amine is taken to mean a compound which contains three substituted or unsubstituted aromatic or heteroaromatic ring systems bonded directly to the nitrogen. At least one of these aromatic or heteroaromatic ring systems is preferably a condensed ring system, particularly preferably having at least 14 aromatic ring atoms. Preferred examples thereof are aromatic anthraceneamines, aromatic anthracenediamines, aromatic pyreneamines, aromatic pyrenediamines, aromatic chryseneamines or aromatic chrysenediamines. An aromatic anthraceneamine is taken to mean a compound in which one diarylamino group is bonded directly to an anthracene group, preferably in the 9-position. An aromatic anthracenediamine is taken to mean a compound in which two diarylamino groups are bonded directly to an anthracene group, preferably in the 9,10-position. Aromatic pyreneamines, pyrenediamines, chryseneamines and chrysenediamines are defined analogously thereto, where the diarylamino groups are preferably bonded to the pyrene in the 1-position or in the 1,6-position. Further preferred dopants are selected from indenofluoreneamines or indenofluorenediamines, for example in accordance with WO 06/122630, benzoindenofluoreneamines or benzoindenofluorenediamines, for example in accordance with WO 08/006,449, and dibenzoindenofluoreneamines or dibenzoindenofluorenediamines, for example in accordance with WO 07/140,847. Examples of dopants from the class of the styrylamines are substituted or unsubstituted tristilbeneamines or the dopants described in WO 06/000388, WO 06/058737, WO 06/000389, WO 07/065,549 and WO 07/115,610. Preference is furthermore given to the condensed hydrocarbons disclosed in DE 102008035413.

Suitable dopants are furthermore the structures depicted in the following table, and the derivatives of these structures disclosed in JP 06/001973, WO 04/047499, WO 06/098080, WO 07/065,678, US 2005/0260442 and WO 04/092111.

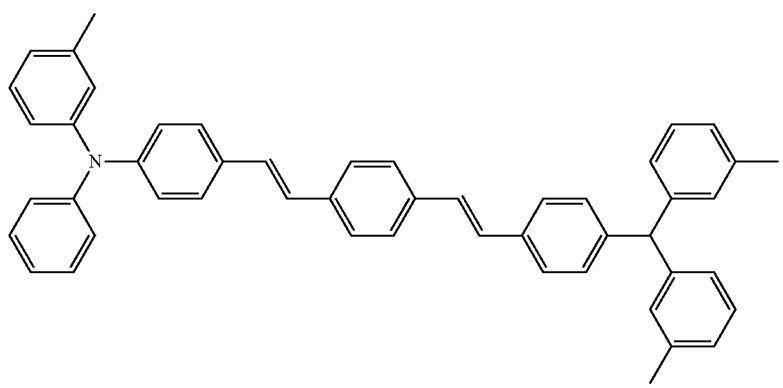 [SMILES: Cc1cccc(C(c2ccc(/C=C/c3ccc(/C=C/c4ccc(N(c5ccccc5)c5cccc(C)c5)cc4)cc3)cc2)c2cccc(C)c2)c1]

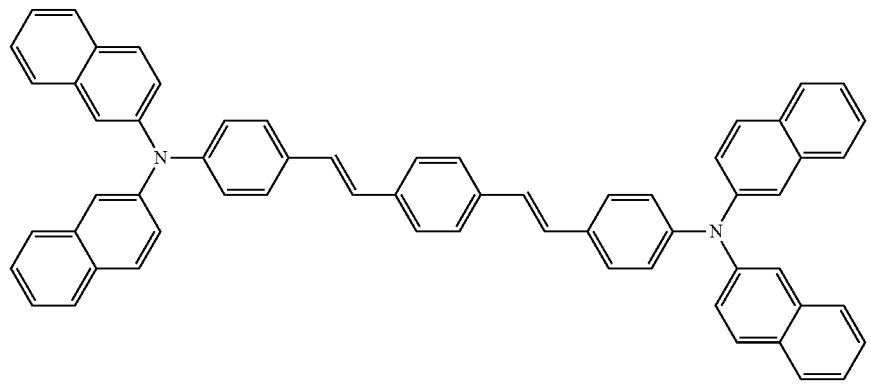 [SMILES: C(=C\c1ccc(N(c2ccc3ccccc3c2)c2ccc3ccccc3c2)cc1)/c1ccc(/C=C/c2ccc(N(c3ccc4ccccc4c3)c3ccc4ccccc4c3)cc2)cc1]
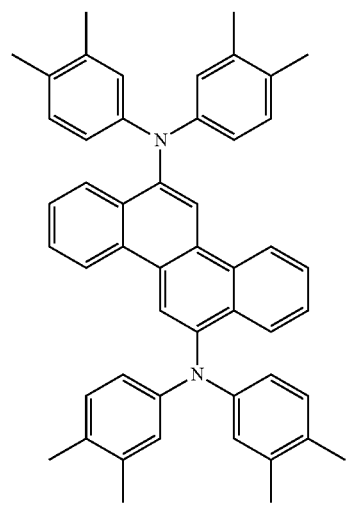
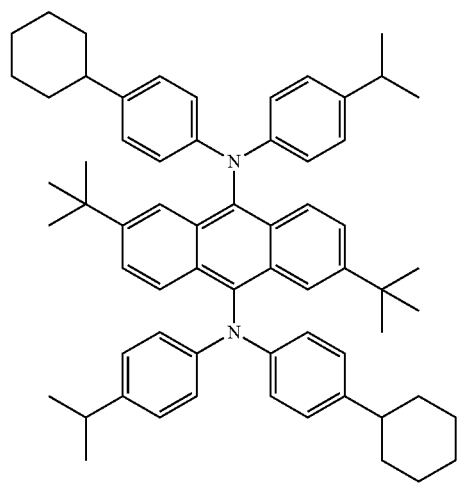 [SMILES: CC(C)c1ccc(N(c2ccc(C3CCCCC3)cc2)c2c3ccc(C(C)(C)C)cc3c(N(c3ccc(C(C)C)cc3)c3ccc(C4CCCCC4)cc3)c3ccc(C(C)(C)C)cc23)cc1]

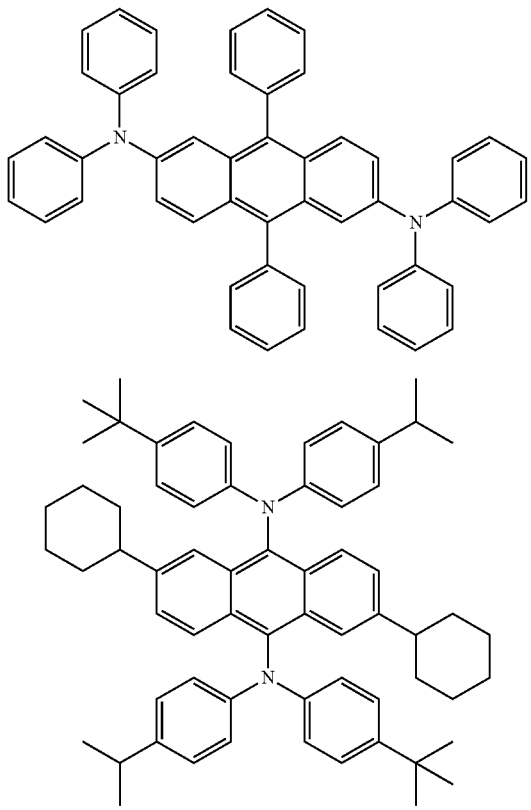

The proportion of the dopant in the mixture of the emitting layer is between 0.1 and 50.0% by weight, preferably between 0.5 and 20.0% by weight, more preferably between 1.0 and 10.0% by weight. Correspondingly, the proportion of the host material is between 50.0 and 99.9% by weight, preferably between 80.0 and 99.5% by weight more preferably between 90.0 and 99.0% by weight.

Suitable host materials for this purpose are materials from various classes of substance. Preferred host materials are selected from the classes of the oligoarylenes (for example 2,2',7,7'-tetraphenylspirobifluorene in accordance with EP 676461 or dinaphthylanthracene), in particular the oligoarylenes containing condensed aromatic groups, the oligoarylenevinylenes (for example DPVBi or spiro-DPVBi in accordance with EP 676461), the polypodal metal complexes (for example in accordance with WO 04/081017), the hole-conducting compounds (for example in accordance with WO 04/058911), the electron-conducting compounds, in particular ketones, phosphine oxides, sulfoxides, etc. (for example in accordance with WO 05/084081 and WO 05/084082), the atropisomers (for example in accordance with WO 06/048268), the boronic acid derivatives (for example in accordance with WO 06/117052) or the benzanthracenes (for example in accordance with WO 08/145,239). Suitable host materials are furthermore also the benzo[c]phenanthrene compounds according to the invention which are described above. Apart from the compounds according to the invention, particularly preferred host materials are selected from the classes of the oligoarylenes containing naphthalene, anthracene, benzanthracene and/or pyrene or atropisomers of these compounds, the oligoarylenevinylenes, the ketones, the phosphine oxides and the sulfoxides. Apart from the benzo [c]phenanthrene compounds according to the invention, very particularly preferred host materials are selected from the classes of the oligoarylenes containing anthracene, benzanthracene and/or pyrene or atropisomers of these compounds. For the purposes of this invention, an oligoarylene is intended to be taken to mean a compound in which at least three aryl or arylene groups are bonded to one another.

Suitable host materials are furthermore, for example, the materials depicted in the following table, and derivatives of these materials, as disclosed in WO 04/018587, WO 08/006,449, U.S. Pat. No. 5,935,721, US 2005/0181232, JP 2000/273056, EP 681019, US 2004/0247937 and US 2005/0211958.

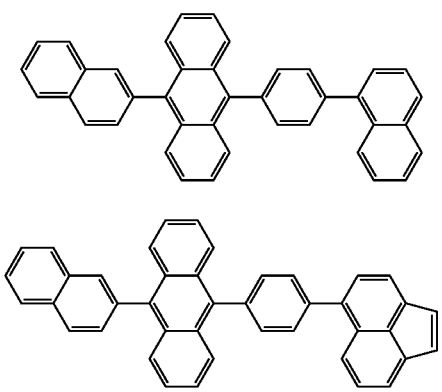

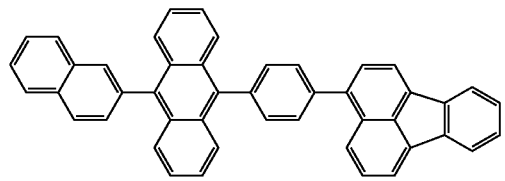 [SMILES: c1ccc2c(c1)-c1cccc3c(-c4ccc(-c5c6ccccc6c(-c6ccc7ccccc7c6)c6ccccc56)cc4)ccc-2c13]
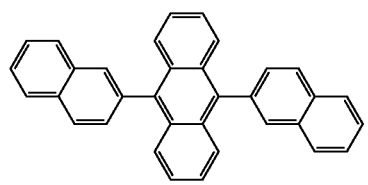 [SMILES: c1ccc2cc(-c3c4ccccc4c(-c4ccc5ccccc5c4)c4ccccc34)ccc2c1]
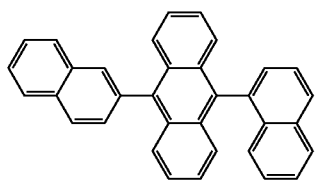 [SMILES: c1ccc2cc(-c3c4ccccc4c(-c4cccc5ccccc45)c4ccccc34)ccc2c1]
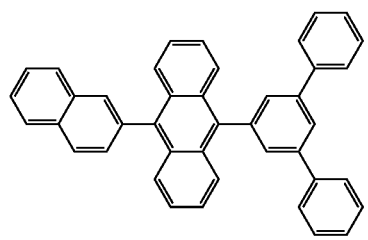 [SMILES: c1ccc(-c2cc(-c3ccccc3)cc(-c3c4ccccc4c(-c4ccc5ccccc5c4)c4ccccc34)c2)cc1]
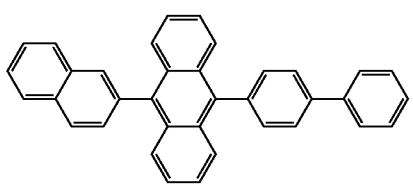 [SMILES: c1ccc(-c2ccc(-c3c4ccccc4c(-c4ccc5ccccc5c4)c4ccccc34)cc2)cc1]
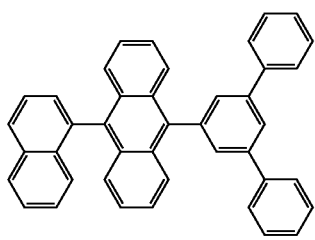 [SMILES: c1ccc(-c2cc(-c3ccccc3)cc(-c3c4ccccc4c(-c4cccc5ccccc45)c4ccccc34)c2)cc1]
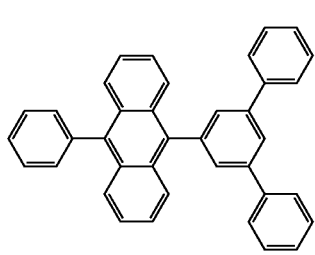 [SMILES: c1ccc(-c2cc(-c3ccccc3)cc(-c3c4ccccc4c(-c4ccccc4)c4ccccc34)c2)cc1]

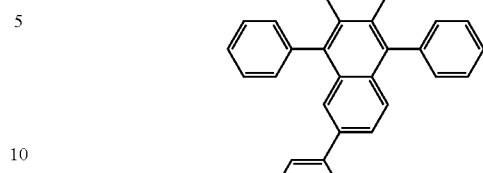
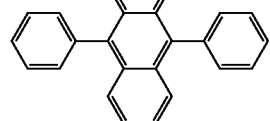
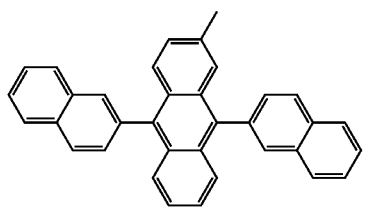 [SMILES: Cc1ccc2c(-c3ccc4ccccc4c3)c3ccccc3c(-c3ccc4ccccc4c3)c2c1]
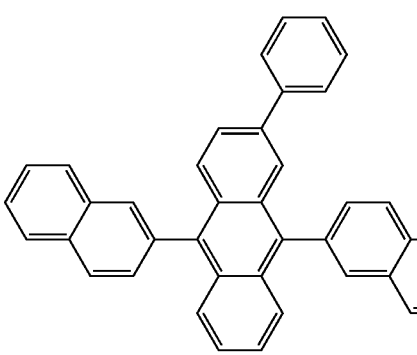

For the purposes of this invention, a hole-injection layer is a layer which is directly adjacent to the anode. For the purposes of this invention, a hole-transport layer is a layer which is located between a hole-injection layer and an emission layer. It may be preferred for them to be doped with electron-acceptor compounds, for example with $F_4$-TCNQ or with compounds as described in EP 1476881 or EP 1596445.

Apart from the materials according to the invention, suitable charge-transport materials, as can be used in the hole-injection or hole-transport layer or in the electron-injection or electron-transport layer of the organic electroluminescent device according to the invention, are, for example, the compounds disclosed in Y. Shirota et al., *Chem. Rev.* 2007, 107(4), 953-1010, or other materials as employed in these layers in accordance with the prior art.

Examples of preferred hole-transport materials which can be used in a hole-transport or hole-injection layer of the electroluminescent device according to the invention are indenofluoreneamines and derivatives (for example in accordance with WO 06/122630 or WO 06/100896), the amine derivatives as disclosed in EP 1661888, hexaazatriphenylene derivatives (for example in accordance with WO 01/049806), amine derivatives with condensed aromatics (for example in accordance with U.S. Pat. No. 5,061,569), the amine derivatives as disclosed in WO 95/09147, monobenzoindenofluoreneamines (for example in accordance with WO 08/006,449) or dibenzoindenofluoreneamines (for example in accordance with WO 07/140,847). Suitable hole-transport and hole-injection materials are furthermore derivatives of the compounds depicted above, as disclosed in JP 2001/226331, EP 676461, EP 650955, WO 01/049806, U.S. Pat. No. 4,780,536, WO 98/30071, EP 891121, EP 1661888, JP 2006/253445, EP 650955, WO 06/073054 and U.S. Pat. No. 5,061,569.

Suitable hole-transport or hole-injection materials are furthermore, for example, the materials indicated in the following table.

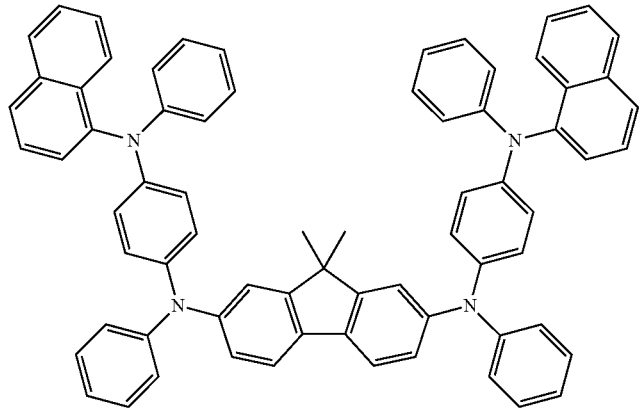 [SMILES: CC1(C)c2cc(N(c3ccccc3)c3ccc(N(c4ccccc4)c4cccc5ccccc45)cc3)ccc2-c2ccc(N(c3ccccc3)c3ccc(N(c4ccccc4)c4cccc5ccccc45)cc3)cc21]

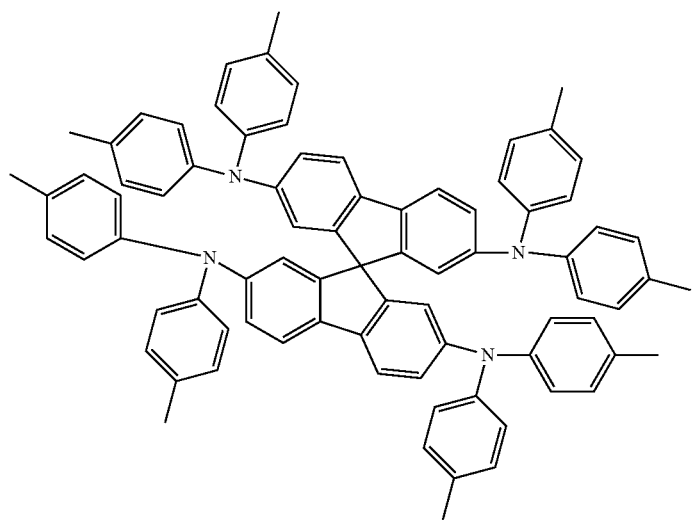

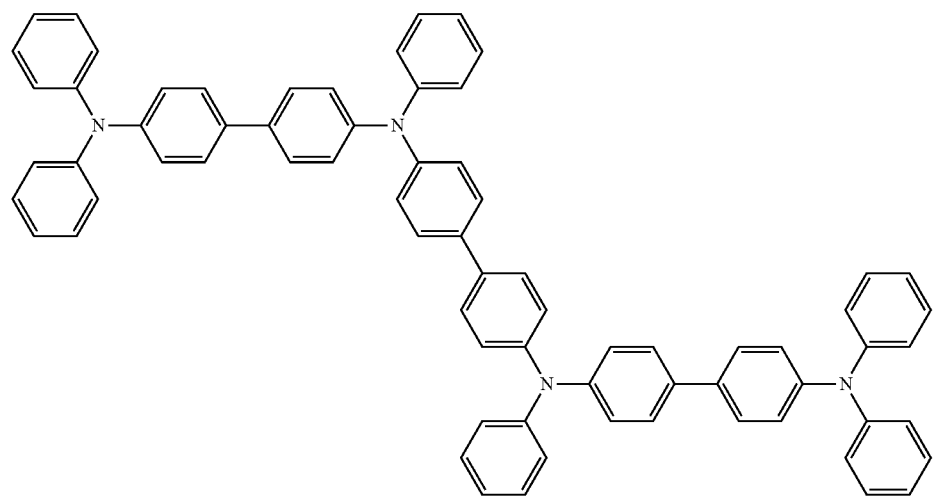 [SMILES: c1ccc(N(c2ccccc2)c2ccc(-c3ccc(N(c4ccccc4)c4ccc(-c5ccc(N(c6ccccc6)c6ccc(-c7ccc(N(c8ccccc8)c8ccccc8)cc7)cc6)cc5)cc4)cc3)cc2)cc1]

-continued
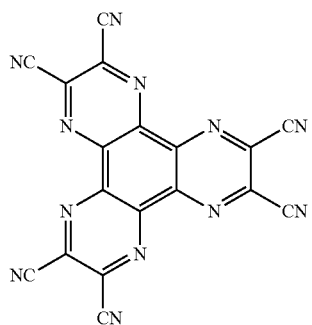 [SMILES: N#Cc1nc2c3nc(C#N)c(C#N)nc3c3nc(C#N)c(C#N)nc3c2nc1C#N]
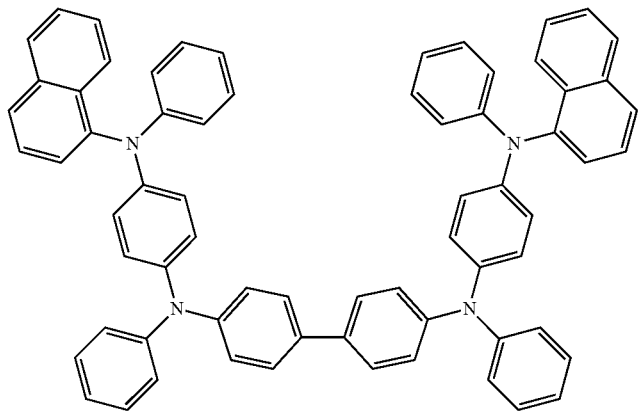 [SMILES: c1ccc(N(c2ccc(-c3ccc(N(c4ccccc4)c4ccc(N(c5ccccc5)c5cccc6ccccc56)cc4)cc3)cc2)c2ccc(N(c3ccccc3)c3cccc4ccccc34)cc2)cc1]
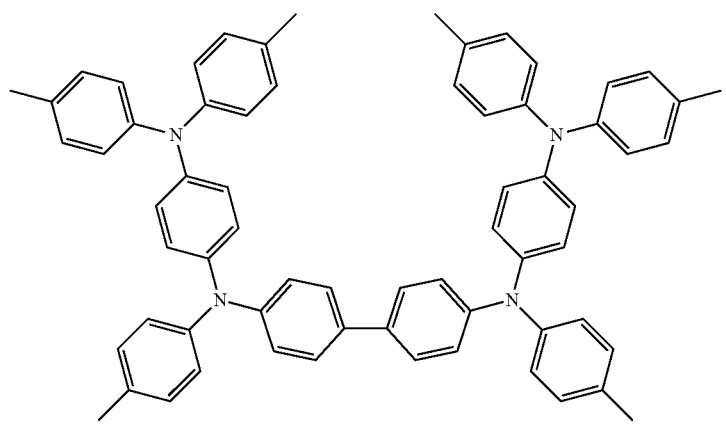
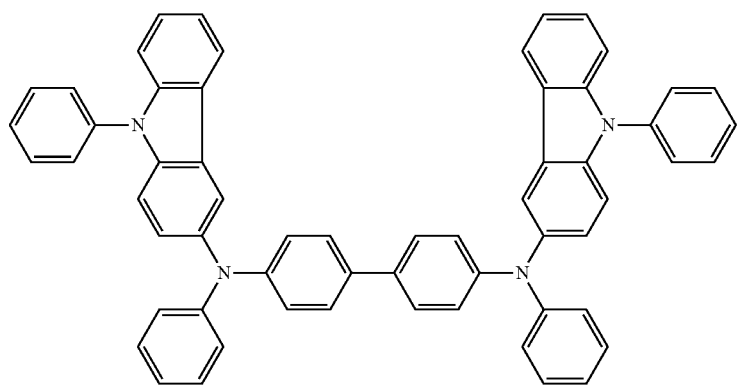 [SMILES: c1ccc(N(c2ccc(-c3ccc(N(c4ccccc4)c4ccc5c(c4)c4ccccc4n5-c4ccccc4)cc3)cc2)c2ccc3c(c2)c2ccccc2n3-c2ccccc2)cc1]

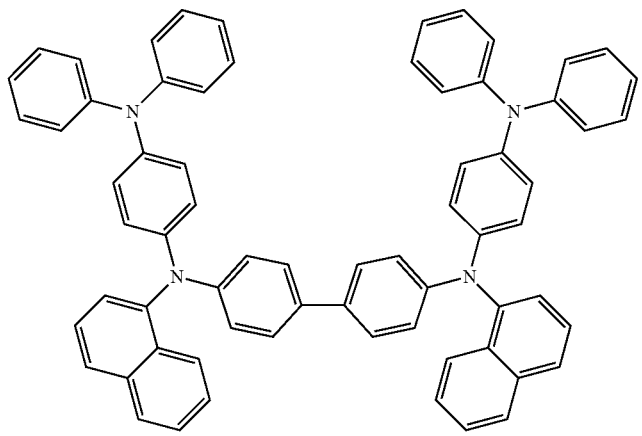 [SMILES: c1ccc(N(c2ccccc2)c2ccc(N(c3ccc(-c4ccc(N(c5ccc(N(c6ccccc6)c6ccccc6)cc5)c5cccc6ccccc56)cc4)cc3)c3cccc4ccccc34)cc2)cc1]
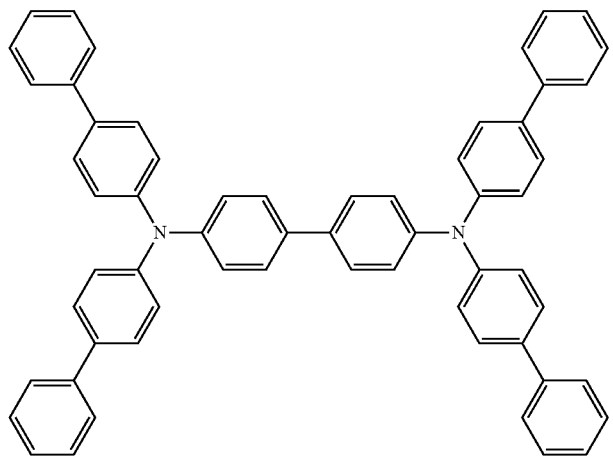 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1]
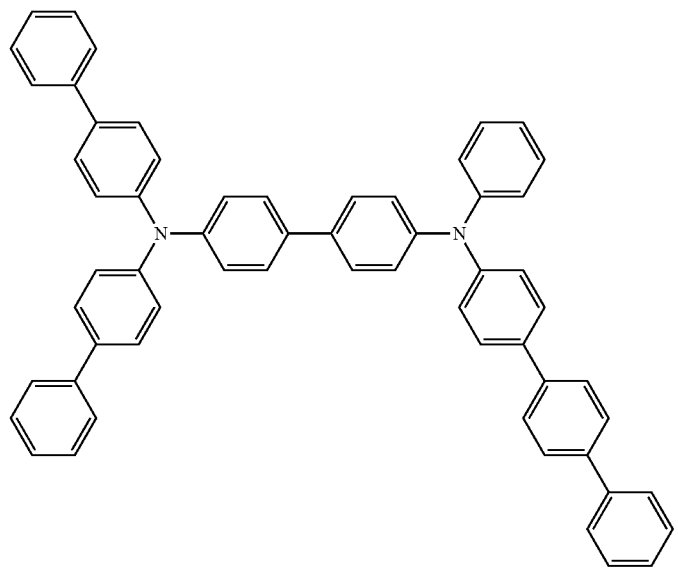 [SMILES: c1ccc(-c2ccc(-c3ccc(N(c4ccccc4)c4ccc(-c5ccc(N(c6ccc(-c7ccccc7)cc6)c6ccc(-c7ccccc7)cc6)cc5)cc4)cc3)cc2)cc1]

-continued
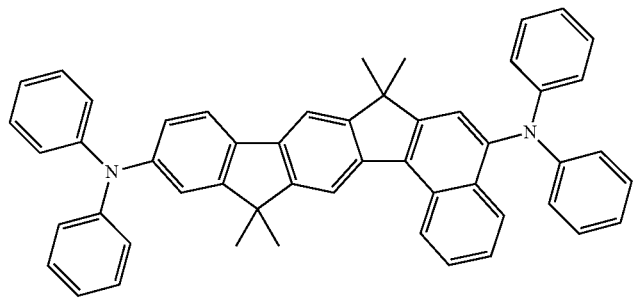 [SMILES: CC1(C)c2cc(N(c3ccccc3)c3ccccc3)ccc2-c2cc3c(cc21)-c1c(cc(N(c2ccccc2)c2ccccc2)c2ccccc12)C3(C)C]
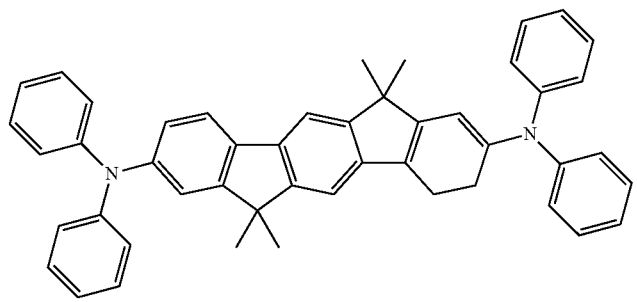 [SMILES: CC1(C)C2=C(CCC(N(c3ccccc3)c3ccccc3)=C2)c2cc3c(cc21)-c1ccc(N(c2ccccc2)c2ccccc2)cc1C3(C)C]
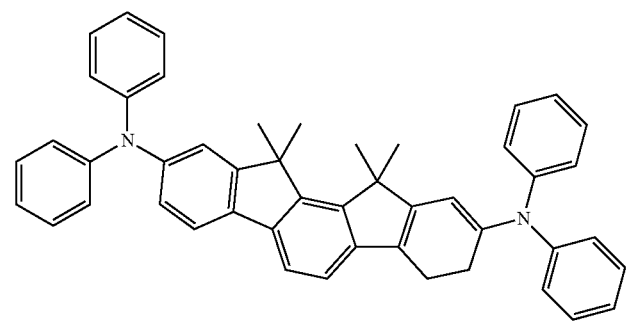 [SMILES: CC1(C)C2=C(CCC(N(c3ccccc3)c3ccccc3)=C2)c2ccc3c(c21)C(C)(C)c1cc(N(c2ccccc2)c2ccccc2)ccc1-3]
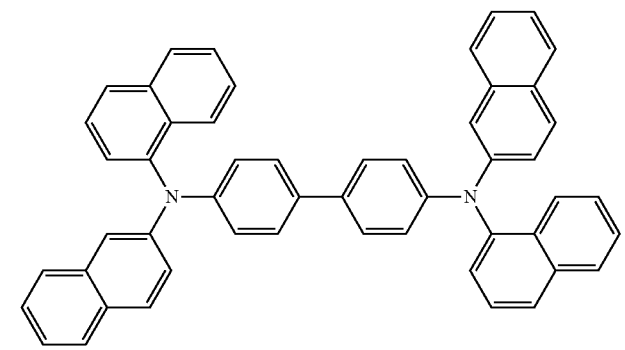 [SMILES: c1ccc2cc(N(c3ccc(-c4ccc(N(c5ccc6ccccc6c5)c5cccc6ccccc56)cc4)cc3)c3cccc4ccccc34)ccc2c1]
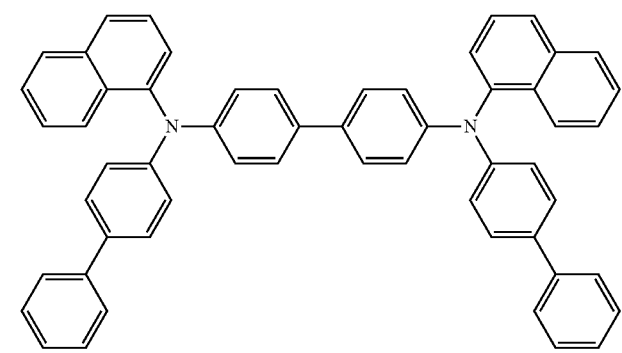 [SMILES: c1ccc(-c2ccc(N(c3ccc(-c4ccc(N(c5ccc(-c6ccccc6)cc5)c5cccc6ccccc56)cc4)cc3)c3cccc4ccccc34)cc2)cc1]

-continued
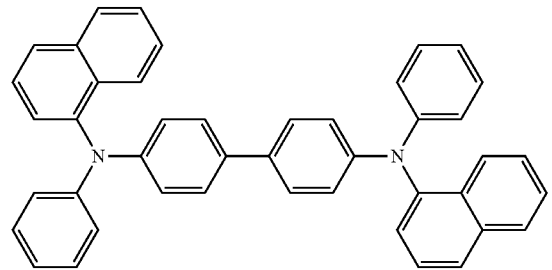 [SMILES: c1ccc(N(c2ccc(-c3ccc(N(c4ccccc4)c4cccc5ccccc45)cc3)cc2)c2cccc3ccccc23)cc1]
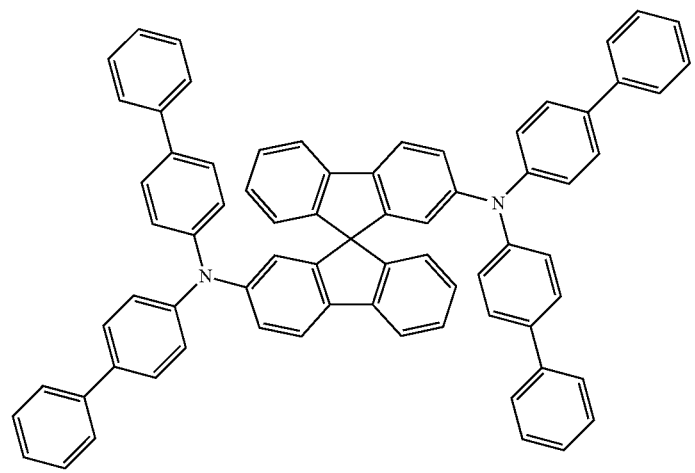 [SMILES: c1ccc(-c2ccc(N(c3ccc(-c4ccccc4)cc3)c3ccc4c(c3)C3(c5ccccc5-4)c4ccccc4-c4ccc(N(c5ccc(-c6ccccc6)cc5)c5ccc(-c6ccccc6)cc5)cc43)cc2)cc1]
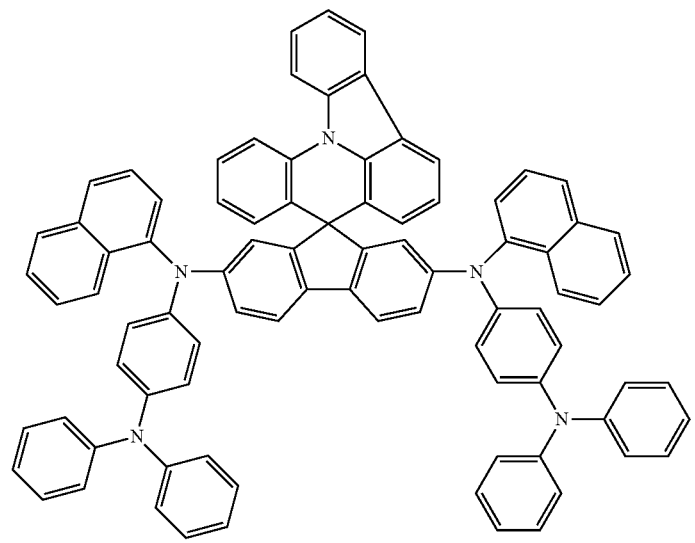 [SMILES: c1ccc(N(c2ccccc2)c2ccc(N(c3ccc4c(c3)C3(c5cc(N(c6ccc(N(c7ccccc7)c7ccccc7)cc6)c6cccc7ccccc67)ccc5-4)c4ccccc4-n4c5ccccc5c5cccc3c54)c3cccc4ccccc34)cc2)cc1]

Suitable electron-transport or electron-injection materials which can be used in the electroluminescent device according to the invention are, for example, the materials indicated in the following table. Suitable electron-transport and electron-injection materials are furthermore derivatives of the compounds depicted above, as disclosed in JP 2000/053957, WO 03/060956, WO 04/028217 and WO 04/080975.

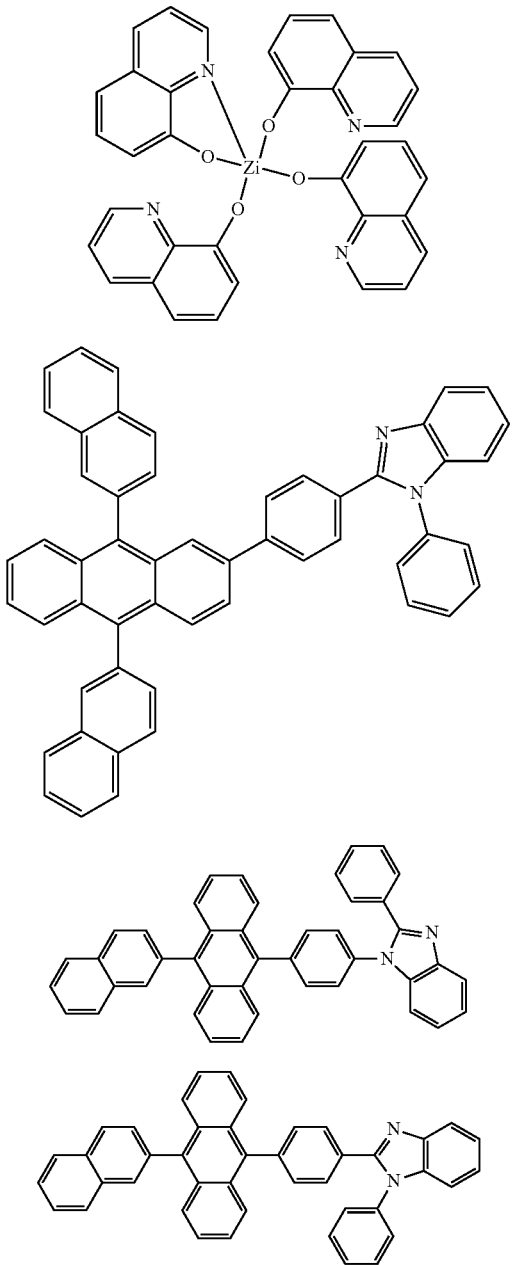

Suitable matrix materials for the compounds according to the invention are ketones, phosphine oxides, sulfoxides and sulfones, for example in accordance with WO 04/013080, WO 04/093207, WO 06/005627 or DE 102008033943, triarylamines, carbazole derivatives, for example CBP (N,N-biscarbazolylbiphenyl) or the carbazole derivatives disclosed in WO 05/039246, US 2005/0069729, JP 2004/288381, EP 1205527 or WO 08/086,851, indolocarbazole derivatives, for example in accordance with WO 07/063,754 or WO 08/056, 746, azacarbazoles, for example in accordance with EP 1617710, EP 1617711, EP 1731584, JP 2005/347160, bipolar matrix materials, for example in accordance with WO 07/137, 725, silanes, for example in accordance with WO 05/111172, azaboroles or boronic esters, for example in accordance with WO 06/117052, triazine derivatives, for example in accordance with DE 102008036982, WO 07/063,754 or WO 08/056,746, or zinc complexes, for example in accordance with DE 102007053771.

Preference is furthermore also given to solutions of non-conducting, electronically inert polymers (matrix polymers; inert polymeric binder) which comprise admixed low-molecular-weight, oligomeric, dendritic, linear or branched and/or polymeric organic and/or organometallic semiconductors. Preferably, the composition comprises 0.5 to 10% by weight inert polymeric binders.

Optionally, the OSC composition comprises one or more organic binders, preferably polymeric binders to adjust the rheological properties, as described for example in WO 2005/055248 A1, in particular an organic binder which has a low permittivity ($\in$) at 1,000 Hz of 3.3 or less, very preferably in a proportion of binder to OSC compounds from 20:1 to 1:20, preferably 10:1 to 1:10, more preferably 5:1 to 1:5 by weight.

The binder is selected for example from poly(α-methylstyrene), polyvinylcinnamate, poly(4-vinylbiphenyl) or poly(4-methylstyrene), or blends thereof. The binder may also be a semiconducting binder selected for example from polyarylamines, polyfluorenes, polythiophenes, polyspirobifluorenes, substituted polyvinylenephenylenes, polycarbazoles or polystilbenes, or copolymers thereof.

The composition according to the present invention may additionally comprise one or more further components like for example surface-active compounds, lubricating agents, dispersing agents, hydrophobing agents, adhesive agents, flow improvers, defoaming agents, deaerators, diluents which may be reactive or non-reactive, auxiliaries, colourants, dyes or pigments, sensitizers, stabilizers, nanoparticles or inhibitors. However, these further components should not be oxidising or otherwise capable of chemically reacting with the OSC or have an electrically doping effect on the OSC.

The composition according to the present invention can be used for the preparation of organic electronic (OE) devices, for example transistors like OFETs or organic photovoltaic (OPV) devices like diodes or solar cells.

Especially preferred OE devices are OFETs. A preferred OFET according to the present invention comprises the following components:
optionally a substrate (1),
a gate electrode (2),
an insulator layer comprising a dielectric material (3),
an OSC layer (4)
source and drain electrodes (5),
optionally one or more protection or passivation layers (6).

Figure 1A:
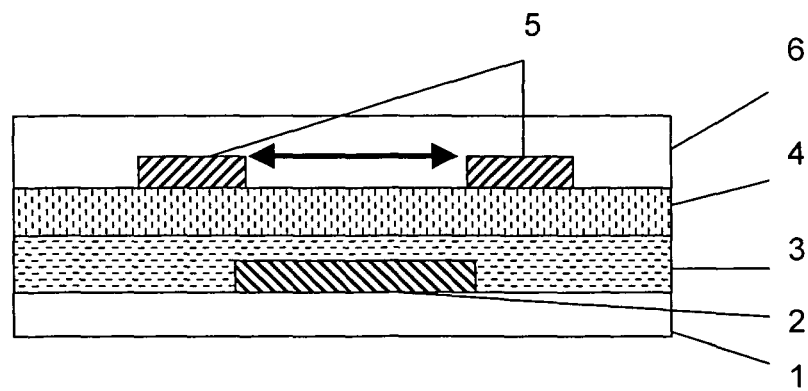

FIG. 1A exemplarily and schematically depicts a typical bottom gate (BG), top contact (TC) OFET device according to the present invention, comprising a substrate (1), a gate electrode (2), a layer of dielectric material (3) (also known as gate insulator layer), an OSC layer (4), and source and drain (S/D) electrodes (5), and an optional passivation or protection layer (6).

The device of FIG. 1A can be prepared by a process comprising the steps of depositing a gate electrode (2) on a substrate (1), depositing a dielectric layer (3) on top of the gate electrode (2) and the substrate (1), depositing an OSC layer (4) on top of the dielectric layer (3), depositing S/D electrodes (5) on top of the OSC layer (4), and optionally depositing a passivation or protection layer (6) on top of the S/D electrodes (5) and the OSC layer (4).

Figure 1B:
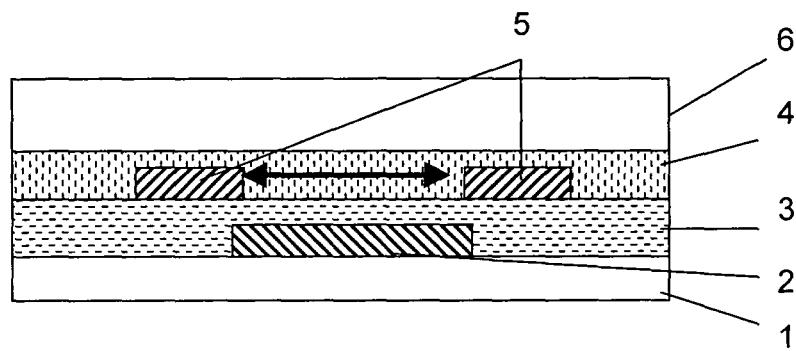

FIG. 1B exemplarily and schematically depicts a typical bottom gate (BG), bottom contact (BC) OFET device according to the present invention, comprising a substrate (1), a gate electrode (2), a dielectric layer (3), S/D electrodes (5), an OSC layer (4), and an optional passivation or protection layer (6).

The device of FIG. 1B can be prepared by a process comprising the steps of depositing a gate electrode (2) on a substrate (1), depositing a dielectric layer (3) on top of the gate electrode (2) and the substrate (1), depositing S/D electrodes (5) on top of the dielectric layer (3), depositing an OSC layer (4) on top of the S/D electrodes (4) and the dielectric layer (3), and optionally depositing a passivation or protection layer (6) on top of the OSC layer (4).

Figure 2:
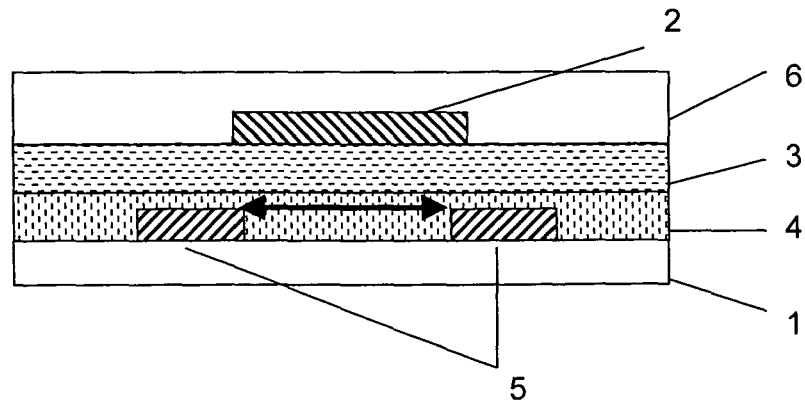

FIG. 2 exemplarily and schematically depicts a top gate (TG) OFET device according to the present invention, comprising a substrate (1), source and drain electrodes (5), an OSC layer (4), a dielectric layer (3), and a gate electrode (2), and an optional passivation or protection layer (6).

The device of FIG. 2 can be prepared by a process comprising the steps of depositing S/D electrodes (5) on a substrate (1), depositing an OSC layer (4) on top of the S/D electrodes (4) and the substrate (1), depositing a dielectric layer (3) on top of the OSC layer (4), depositing a gate electrode (2) on top of the dielectric layer (3), and optionally depositing a passivation or protection layer (6) on top of the gate electrode (2) and the dielectric layer (3).

The passivation or protection layer (6) in the devices described in FIGS. 1A, 1B and 2 has the purpose of protecting the OSC layer and the S/D or gate electrodes from further layers or devices that may be later provided thereon, and/or from environmental influence.

The distance between the source and drain electrodes (5), as indicated by the double arrow FIGS. 1A, 1B and 2, is the channel area.

In case of formulations for use in OPV cells, the formulation preferably comprises or contains, more preferably consists essentially of, very preferably exclusively of, a p-type semiconductor and an n-type semiconductor, or an acceptor and a donor material. A preferred material of this type is a blend or mixture of poly(3-substituted thiophene) or P3AT with a $C_{60}$ or $C_{70}$ fullerene or modified $C_{60}$ molecule like PCBM [(6,6)-phenyl C61-butyric acid methyl ester], as disclosed for example in WO 94/05045 A1, wherein preferably the ratio of P3AT to fullerene is from 2:1 to 1:2 by weight, more preferably from 1.2:1 to 1:1.2 by weight.

Figure 3:
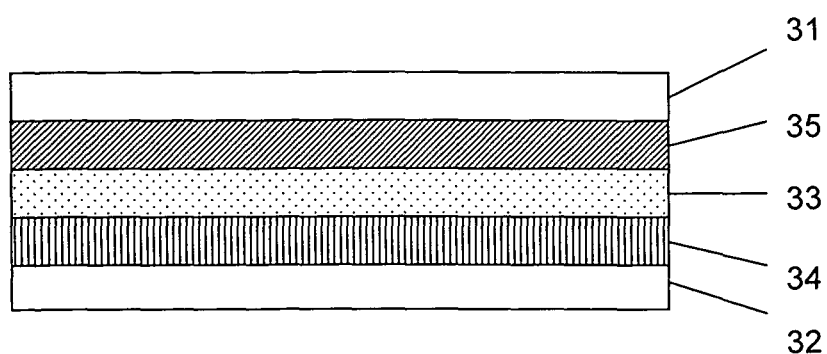
Figure 4:
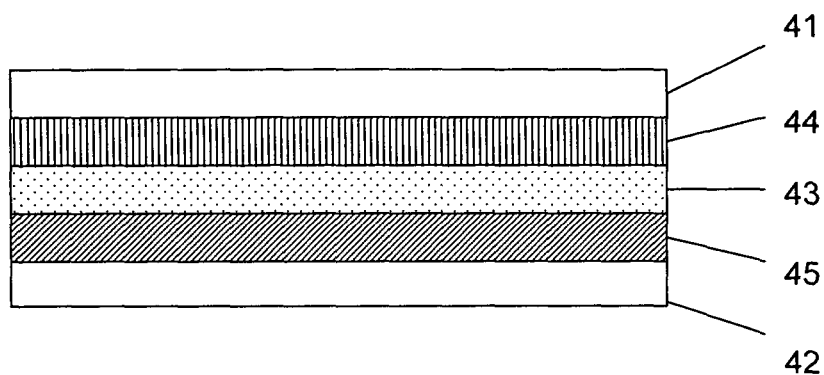

FIG. 3 and FIG. 4 exemplarily and schematically depict typical and preferred OPV devices according to the present invention [see also Waldauf et al., Appl. Phys. Lett. 89, 233517 (2006)].

An OPV device as shown in FIG. 3 preferably comprises:
a low work function electrode (31) (for example a metal, such as aluminum), and a high work function electrode (32) (for example ITO), one of which is transparent,
a layer (33) (also referred to as "active layer") comprising a hole transporting material and an electron transporting material, preferably selected from OSC materials, situated between the electrodes (31,32); the active layer can exist for example as a bilayer or two distinct layers or blend or mixture of p- and n-type semiconductor,
an optional conducting polymer layer (34), for example comprising a blend of PEDOT:PSS (poly(3,4-ethylenedioxythiophene): poly(styrenesulfonate)), situated between the active layer (33) and the high work function electrode (32), to modify the work function of the high work function electrode to provide an ohmic contact for holes,
an optional coating (35) (for example of LiF) on the side of the low work function electrode (31) facing the active layer (33), to provide an ohmic contact for electrons.

An inverted OPV device as shown in FIG. 4 preferably comprises:
a low work function electrode (41) (for example a metal, such as gold), and a high work function electrode (42) (for example ITO), one of which is transparent,
a layer (43) (also referred to as "active layer") comprising a hole transporting material and an electron transporting material, preferably selected from OSC materials, situated between the electrodes (41,42); the active layer can exist for example as a bilayer or two distinct layers or blend or mixture of p- and n-type semiconductor,
an optional conducting polymer layer (44), for example comprising a blend of PEDOT:PSS, situated between the active layer (43) and the low work function electrode (41) to provide an ohmic contact for electrons,
an optional coating (45) (for example of $TiO_x$) on the side of the high work function electrode (42) facing the active layer (43), to provide an ohmic contact for holes.

The hole transporting polymer is for example a polythiophene. The electron transporting material is for example an inorganic material such as zinc oxide or cadmium selenide, or an organic material such as a fullerene derivate (like for example PCBM) or a polymer (see for example Coakley, K. M. and McGehee, M. D. *Chem. Mater.* 2004, 16, 4533). If the bilayer is a blend an optional annealing step may be necessary to optimize device performance.

During the process of preparing an OE device, the OSC layer is deposited onto a substrate, followed by removal of the solvent together with any volatile additive(s) present, to form a film or layer.

Various substrates may be used for the fabrication of OE devices, for example glass, ITO coated glass, ITO glass with pre coated layers including PEDOT, PANI etc, or plastics, plastics materials being preferred, examples including alkyd resins, allyl esters, benzocyclobutenes, butadiene-styrene, cellulose, cellulose acetate, epoxide, epoxy polymers, ethylene-chlorotrifluoro ethylene, ethylene-tetrafluoroethylene, fibre glass enhanced plastic, fluorocarbon polymers, hexafluoropropylenevinylidene-fluoride copolymer, high density polyethylene, parylene, polyamide, polyimide, polyaramid, polydimethylsiloxane, polyethersulphone, polyethylene, polyethylenenaphthalate, polyethyleneterephthalate, polyketone, polymethylmethacrylate, polypropylene, polystyrene, polysulphone, polytetrafluoroethylene, polyurethanes, polyvinylchloride, silicone rubbers, silicones, and flexible films with ITO, or other conducting layers and barrier layers e.g. Vitex film.

Preferred substrate materials are polyethyleneterephthalate, polyimide, and polyethylenenaphthalate. The substrate may be any plastic material, metal or glass coated with the above materials. The substrate should preferably be homogeneous to ensure good pattern definition. The substrate may also be uniformly pre-aligned by extruding, stretching, rubbing or by photochemical techniques to induce the orientation of the organic semiconductor in order to enhance carrier mobility.

The electrodes can be deposited by liquid coating, such as spray-, dip-, web- or spin-coating, or by vacuum deposition or vapor deposition methods. Suitable electrode materials and deposition methods are known to the person skilled in the art.

Suitable electrode materials include, without limitation, inorganic or organic materials, or composites of the two. Examples for suitable conductor or electrode materials include polyaniline, polypyrrole, PEDOT or doped conjugated polymers, further dispersions or pastes of graphite or particles of metal such as Au, Ag, Cu, Al, Ni or their mixtures as well as sputter coated or evaporated metals such as Cu, Cr, Pt/Pd or metal oxides such as indium tin oxide (ITO). Organometallic precursors may also be used deposited from a liquid phase.

Deposition of the OSC layer can be achieved by standard methods that are known to the skilled person and are described in the literature. Suitable and preferred deposition methods include liquid coating and printing techniques. Very preferred deposition methods include, without limitation, dip coating, spin coating, spray coating, aerosol jetting, ink jet printing, nozzle printing, letter-press printing, screen printing, gravure printing, doctor blade coating, roller printing, reverse-roller printing, offset lithography printing, flexographic printing, web printing, spray coating, dip coating, curtain coating, brush coating, slot dye coating or pad printing. Gravure, flexographic and inkjet printing are most preferred.

According to a special aspect, an insulator layer can be deposited on a substrate in order to achieve a special type of an OE according to the present invention. Preferably, the insulator layer is deposited by solution processing, more preferably using a solution of a dielectric material, which is optionally cross-linkable, in one or more organic solvents. Preferably the solvent used for depositing the dielectric material is orthogonal to the solvent used for depositing the OSC material, and vice versa.

When spin coating is used as deposition method, the OSC or dielectric material is spun for example between 1000 and 2000 rpm for a period of for example 30 seconds to give a layer with a typical layer thickness between 0.5 and 1.5 µm. After spin coating the film can be heated at an elevated temperature to remove all residual volatile solvents.

If a cross-linkable dielectric is used, it is preferably cross-linked after deposition by exposure to electron beam or electromagnetic (actinic) radiation, like for example X-ray, UV or visible radiation. For example, actinic radiation can used having a wavelength of from 50 nm to 700 nm, preferably from 200 to 450 nm, more preferably from 300 to 400 nm. Suitable radiation dosages are typically in the range from 25 to 3,000 mJ/cm$^2$. Suitable radiation sources include mercury, mercury/xenon, mercury/halogen and xenon lamps, argon or xenon laser sources, x-ray, or e-beam. The exposure to actinic radiation will induce a cross-linking reaction in the cross-linkable groups of the dielectric material in the exposed regions. It is also possible for example to use a light source having a wavelength outside the absorption band of the cross-linkable groups, and to add a radiation sensitive photosensitizer to the cross-linkable material.

Optionally the dielectric material layer is annealed after exposure to radiation, for example at a temperature from 70° C. to 130° C., for example for a period of from 1 to 30 minutes, preferably from 1 to 10 minutes. The annealing step at elevated temperature can be used to complete the cross-linking reaction that was induced by the exposure of the cross-linkable groups of the dielectric material to photoradiation.

Removal of the solvent and any volatile conductive additive(s) is preferably achieved by evaporation, for example by exposing the deposited layer to high temperature and/or reduced pressure, preferably at 50 to 200° C., more preferably at 60 to 135° C.

The thickness of the OSC layer is preferably from 1 nm to 50 µm, preferably from 2 to 1000 nm and more preferably 3 to 500 nm. Preferred layers comprising organic light emitting materials and/or charge transporting materials can have a thickness in the range of 2 to 150 nm.

Further to the materials and methods as described above and below, the OE device and its components can be prepared from standard materials and standard methods, which are known to the person skilled in the art and described in the literature.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the preferred embodiments, are inventive in their own right and not just as part of an embodiment of the present invention. Independent protection may be sought for these features in addition to or alternative to any invention presently claimed.

Unless the context clearly indicates otherwise, as used herein plural forms of the terms herein are to be construed as including the singular form and vice versa.

Throughout the description and claims of this specification, the words "comprise" and "contain" and variations of the words, for example "comprising" and "comprises", mean "including but not limited to", and are not intended to (and do not) exclude other components.

The term "polymer" includes homopolymers and copolymers, e.g. statistical, alternating or block copolymers. In addition, the term "polymer" as used hereinafter does also include oligomers and dendrimers. Dendrimers are typically branched macromolecular compounds consisting of a multi-functional core group onto which further branched monomers are added in a regular way giving a tree-like structure, as described e.g. in M. Fischer and F. Vögtle, *Angew. Chem., Int. Ed.* 1999, 38, 885.

The term "conjugated polymer" means a polymer containing in its backbone (or main chain) mainly C atoms with sp$^2$-hybridisation, or optionally sp-hybridisation, which may also be replaced by hetero atoms, enabling interaction of one π-orbital with another across an intervening σ-bond. In the simplest case this is for example a backbone with alternating carbon-carbon (or carbon-heteroatom) single and multiple (e.g. double or triple) bonds, but does also include polymers with units like 1,3-phenylene. "Mainly" means in this connection that a polymer with naturally (spontaneously) occurring defects, which may lead to interruption of the conjugation, is still regarded as a conjugated polymer. Also included in this meaning are polymers wherein the backbone comprises for example units like aryl amines, aryl phosphines and/or certain heterocycles (i.e. conjugation via N-, O-, P- or S-atoms) and/or metal organic complexes (i.e. conjugation via a metal atom). The term "conjugated linking group" means a group connecting two rings (usually aromatic rings)

consisting of C-atoms or heteroatoms with $sp^2$-hybridisation or sp-hybridisation. See also "IUPAC Compendium of Chemical terminology, Electronic version".

Unless stated otherwise, the molecular weight is given as the number average molecular weight $M_n$ or as weight average molecular weight $M_w$, which unless stated otherwise are determined by gel permeation chromatography (GPC) against polystyrene standards.

The degree of polymerization (n) means the number average degree of polymerization, unless stated otherwise given as $n=M_n/M_U$, wherein $M_U$ is the molecular weight of the single repeating unit.

The term "small molecule" means a monomeric, i.e. a non-polymeric compound.

Unless stated otherwise, percentages of solids are percent by weight ("wt. %"), percentages or ratios of liquids (like e.g. in solvent mixtures) are percent by volume ("vol. %"), and all temperatures are given in degrees Celsius (° C.).

Unless stated otherwise, concentrations or proportions of mixture components, like the conductive additives, given in percentages or ppm are related to the entire formulation including the solvents.

The invention will now be described in more detail by reference to the following examples, which are illustrative only and do not limit the scope of the present invention.

All process steps described above and below can be carried out using known techniques and standard equipment which are described in prior art and are well-known to the skilled person. For example, in the photoirradiation step a commercially available UV lamp and photomask can be used, and the annealing step can be carried out in an oven or on a hot plate.

WORKING EXAMPLES

Example 1

Transistor Example

Compound A is a mixture of the following isomers

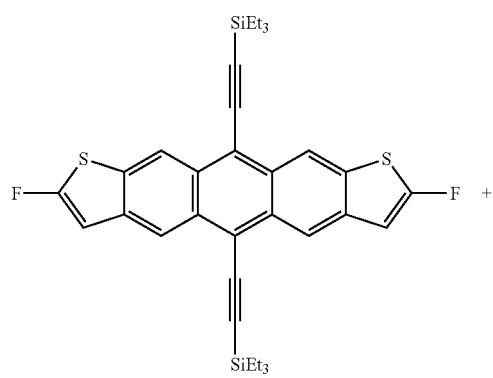

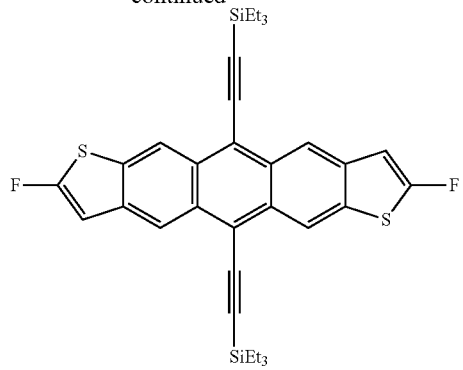

Compound A and its preparation are disclosed in S. Subramanian, J. Anthony et al., J. Am. Chem. Soc. 2008, 130, 2706-2707 (including Supporting Information).

A first OFET device ("Device A") was prepared as follows:

A Teonex Q65FA film (available from DuPont Teijin Films) was washed in deionised water. Approximately 40 nm thick gold source drain electrodes were evaporated with a parallel plate geometry of 20 micron wide by 1000 micron long. The substrate was washed with methanol, blown dry. The electrodes were treated with Lisicon M001 (commercially available from Merck Chemicals) SAM treatment by spin coating from isopropyl alcohol and evaporating the excess off on a hot plate at 70° C. for 3 minutes.

An OSC formulation was prepared by dissolving of 1.6 parts of compound A and 0.4 parts 72 000 $M_w$ poly-4-methylstyrene in 97 parts of tetralin and 1 part of a volatile surfactant/wetting aid (dodecamethylpentasiloxane) and filtering the solution through a 0.45 μm PTFE cartridge filter.

The OSC formulation was then ink jet printed using a Dimatix DMP2800 printer in several different block patterns (1200μ×300μ, 1200μ×600μ, 1200μ×900μ, 1200μ×1200μ, 1200μ×200μ) over the source drain electrodes.

The printed OSC layer was then annealed at 80° C. for 5 minutes.

A dielectric layer of fluoro-polymer Lisicon D139 (9% solids, commercially available from Merck Chemicals) was spun on top of the OSC layer on the device and annealed at 100° C. for 2 minutes to give a dry dielectric film of approximately 1 micron thick.

Finally a 40 nm thick gold gate electrode array was evaporated on top of the dielectric layer in such a way that it covered the existing source drain electrode structures.

Figure 5:
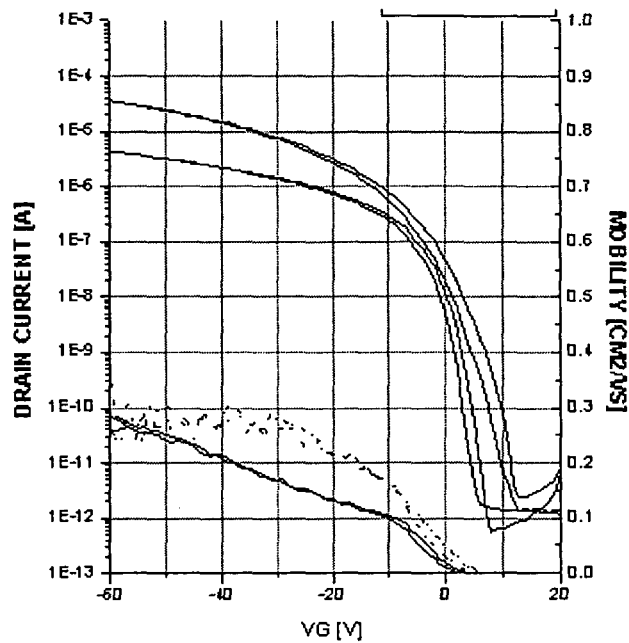
FIG. 5 illustrates the transistor transfer characteristic and the linear and saturation mobility.

The transfer and stress measurements of Device A was performed by using Keithley 4200. The transistor transfer characteristic and the linear and saturation mobility are depicted in FIG. 5 (Device A, with wetting agent). The dotted lines show the mobility after a certain number of AC stresses.

Comparative Example 1

Figure 6:
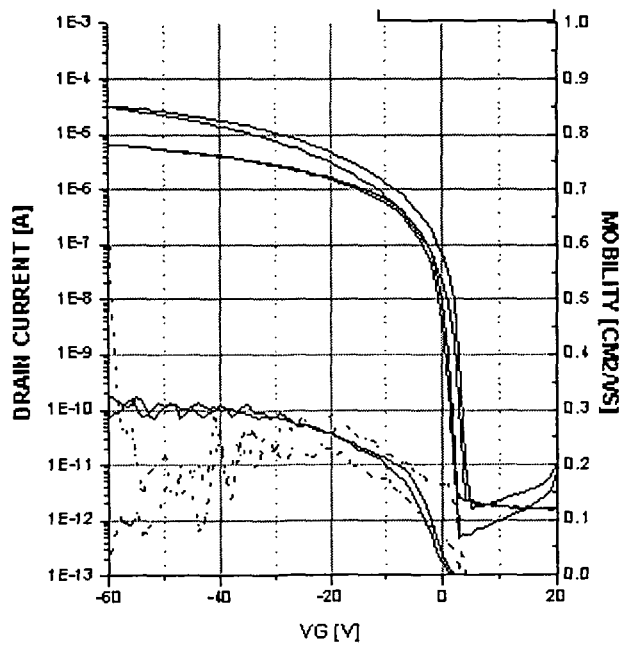
FIG. 6 illustrates the transistor transfer characteristic and the linear and saturation mobility.
Figure 7:
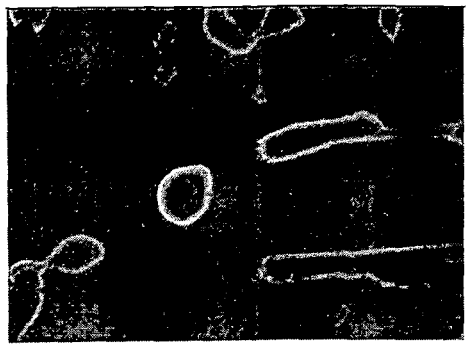
Figure 8:
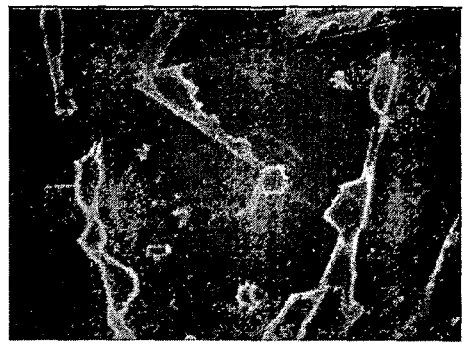
Figure 9:
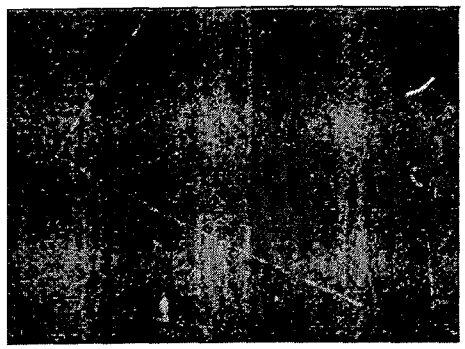
Figure 10:
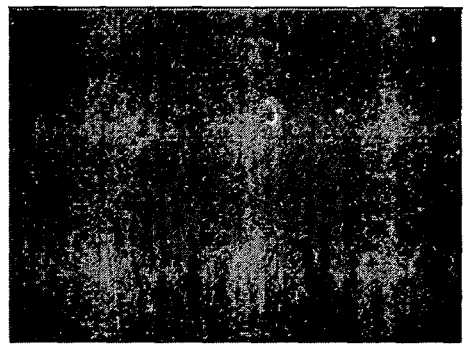
Figure 11:
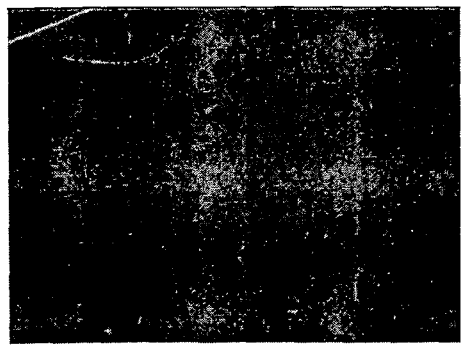
Figure 12:
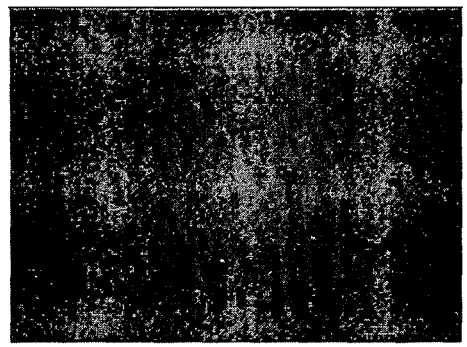
Figure 13:
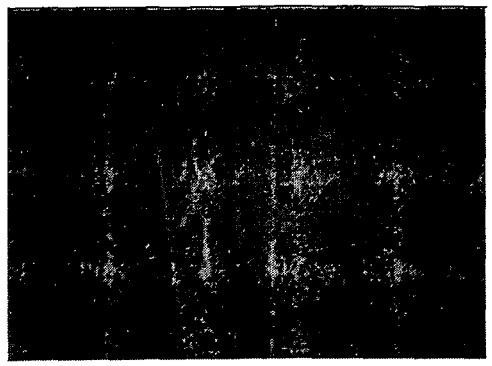
Figure 14:
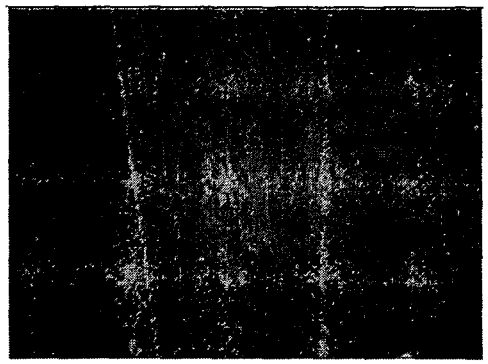
Figure 15:
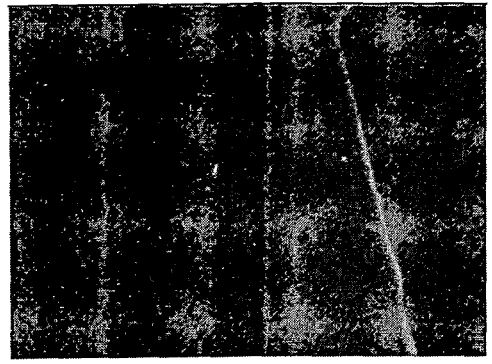
Figure 16:
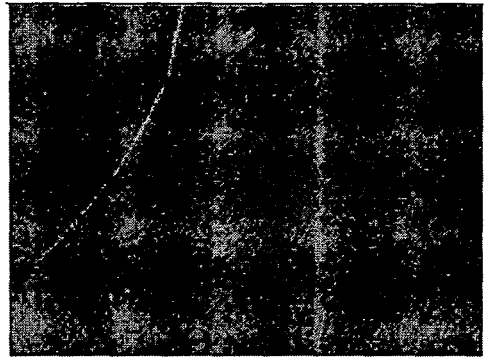

As a reference, a second OFET device ("Device B") was prepared in the same way as described for Device A above, but wherein the OSC formulation was prepared without using a wetting agent, by dissolving of 1.6 parts of compound A and 0.4 parts 72 000 $M_w$ poly-4-methylstyrene in 98 parts tetralin and filtering the solution through a 0.45 μm PTFE cartridge filter. The transistor transfer characteristic and the linear and saturation mobility are depicted in FIG. 6 (Device B, without wetting agent). The dotted lines show the mobility after a certain number of AC stresses.

When comparing the transfer curves of the two devices, it can be seen that Device A (OSC with wetting agent) has a slightly lower mobility, compared to Device B (OSC without wetting agent). However, after a certain number of AC stress, AC pulse applied on both source/drain electrodes and gate electrode, the shape of transfer curves and mobility of Device B has dramatically degraded, while those of Device A remain similar as before stress.

These results demonstrate that the use of a wetting agent in the OSC formulation can reduce the effect of AC stress on the organic transistor.

Without wishing to be bound to a specific theory, we assume that the wetting agent helps to rearrange the OSC molecules and polymer phases in an ideal way for charge transporting.

Examples 2 to 9 and Comparative Examples 2 and 3

A printing ink was prepared by mixing a phosphorescent compound according to formula 107

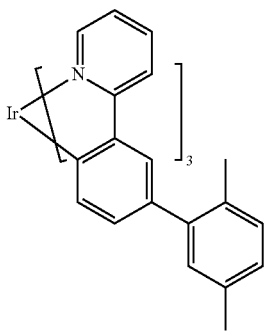

(107)

and a host material having the formula 141

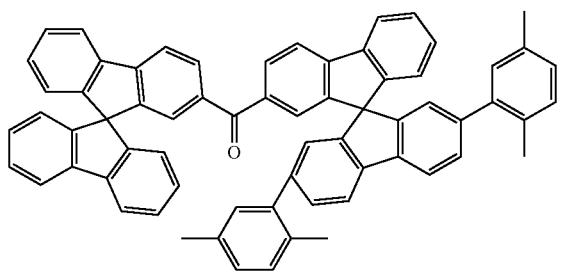

(141)

in a weight ratio of 1:4 (phosphorescent compound 107: host material 141) and dissolving the mixture obtained in methyl-benzoate (MB) The concentration of the OLED compounds was about 1.6% by weight.

The OLED inks were flexo printed using a Flexiproof 100 printer on PEN plastic substrates (50 mm wide) comprising a PEDOT layer and HIL-012 layer being spin coated onto the substrate prior to printing.

18 mm squares were printed using anilox to plate pressure of 50 units (relating to distance; a setting of the printer used) and a plate to impression roller pressure of 80 units. The subsequent prints were dried on a hot plate at 100° C. for 1 hour. The film formation was assessed by viewing under an optical microscope with UV irradiation from a Hg vapour lamp. The magnification was ×2.

Details of the different experiments are provided in Table 2 together with images of the film quality for flexo printed films with no wetting aid and a selection of the wetting aids added at an addition level of 1% by weight (Examples 2 to 9). The results are given as Figures.

TABLE 2

|  | Wetting agent | Anilox volume [cm³/m²] | Figure | Film quality |
|---|---|---|---|---|
| Control example 2 | None | 20.8 | 7 | severe reticulation evident |
| Control example 3 | None | 30.6 | 8 | severe reticulation evident |
| Example 2 | 1-decyne | 20.8 | 9 | some reticulation/ acceptable film formation |
| Example 3 | 1-decyne | 30.6 | 10 | some reticulation/ acceptable film formation |
| Example 4 | 3,5 dimethyl-1-hexyn-3-ol | 20.8 | 11 | marginal reticulation/ good film formation |
| Example 5 | 3,5 dimethyl-1-hexyn-3-ol | 30.6 | 12 | marginal reticulation/ good film formation |
| Example 6 | Hexamethyl disiloxane | 20.8 | 13 | very slight reticulation/very good film formation |
| Example 7 | Hexamethyl disiloxane | 30.6 | 14 | very slight reticulation/very good film formation |
| Example 8 | Dodecamethyl pentasiloxane | 20.8 | 15 | no reticulation/ excellent film formation |
| Example 9 | Dodecamethyl pentasiloxane | 30.6 | 16 | no reticulation/ excellent film formation |

The Figures clearly demonstrate that the Comparative Examples show an immediate reticulation on printing. In contrast thereto, surprisingly the concept of a volatile wetting agent provides a high film quality and homogeneity.

In Examples 2 and 3 the volatile wetting aid has a lower Bpt and higher RER than the solvent. The comparison of the results of the Examples indicate that the wetting aid has evaporated somewhat too fast in comparison to the evaporation of the solvent.

In Examples 4 and 5 the RER and Bpt of the volatile wetting aid are lower than RER and Bpt of the solvent. Therefore, results have been achieved being a little bit better than the results of Examples 2 and 3.

In Examples 6 and 7 the volatile wetting aid has a lower Bpt and higher RER than the solvent. However, a siloxane has been used instead of an alkyne. Therefore, results have been achieved being better than the results of Examples 2 and 3.

In Examples 8 and 9 a siloxane has been used. In addition thereto, the RER and the boiling point are similar to the RER and Bpt of the solvent. Therefore, the best results have been achieved.

Regarding the Examples, the compositions comprising a siloxane compound show a better film formation than compositions comprising an alcohol.

Example 10

Comparison of Spin Coated OLED Formulation with and without Volatile Surfactant

A printing ink was prepared by mixing a phosphorescent compound (TEG-021; Merck KGaA) and 2 host materials (TMM-080 and TMM-102; Merck KGaA) together and dissolving these in methylbenzoate (concentrations: TEG-021: 0.5% by weight, TMM-080:1% by weight and TMM-102: 1% by weight). The sample was divided into 2 parts. To one part 1% by weight additional dodecylpentasiloxane was added. The device layout which was used is shown in FIG. 17.

Both the PEDOT (Al4083 special grade) and the HIL-012-026 (Merck KGaA; pre-dissolved in mesitylene at 0.5% solids) were spin coated on to pre patterned glass substrates (30 mm wide) covered with a 4 pixels structure of ITO. The OLED inks were then spin coated onto these substrates. The Ba/Al cathode was then sputtered onto the device and the resultant device was then encapsulated. FIGS. 18 and 19 show the electroluminescence of the 2 samples.

As can be seen the sample with the additional volatile surfactant gives substantially improved wetting, resulting in improved levelling. The colour point of these materials was very similar. Sample A: 0.310/0.619 CIE x/y coordinates. Sample B: 0.312/0.630 CIE x/y coordinates. The efficiency of these devices were measured.

As can be seen from FIG. 20 a substantial improvement in the efficiency is seen in this example. The efficiency of the device without volatile surfactant could not be measured at 1000 cd/m². The efficiency of the device with the inclusion of 1% volatile surfactant was 2.7 cd/A at 1000 cd/m².

Example 11

Comparison of Ink Jetted OLED Formulation with and without Volatile Surfactant

The same printing ink as used in example 10 was prepared. The sample was divided into 2 parts. To one part 1% additional dodecylpentasiloxane was added. The device layout which was used is shown in FIG. 17.

Both the PEDOT (Al4083 special grade) and the HIL-012-026 (Merck KGaA; pre-dissolved in mesitylene at 0.5% solids) were spin coated on to pre patterned glass substrates (30 mm wide) covered with a 4 pixels structure of ITO. The OLED inks were then ink-jetted using a Dimatix DMP 2800 series printer onto these substrates. The 2 mm×2 mm ITO squares were printed over using a square pattern of 2.2 mm×2.2 mm. A drop spacing of 25 microns was used between the drops. The device was then dried at 180° C. for 30 minutes.

The Ba/Al cathode was then sputtered onto the device and the resultant device was then encapsulated. FIGS. 21 and 22 show the electroluminescence of the 2 samples. FIGS. 23 and 24 are those assessed by photoluminescence.

As can be seen the sample with the additional volatile surfactant gives substantially improved wetting, resulting in improved levelling. The colour point of these materials was very similar. Sample C: 0.300/0.612 CIE x/y coordinates. Sample D: 0.315/0.636 CIE x/y coordinates. The efficiency of these devices were measured.

As can be seen from FIG. 25 only the device with the volatile surfactant could be measured, this is because of the inhomogeneous light output from the device without volatile surfactant. The efficiency of the device without volatile surfactant could not be measured. The efficiency of the device with the inclusion of 1% volatile surfactant was 3.8 cd/A at 1000 cd/m².

Example 12

Comparison of Flexo Printed OLED Formulation with and without Volatile Surfactant The same printing ink as used in example 10 was prepared. The sample was divided into 2 parts. To one part 1% additional dodecylpentasiloxane was added. The device layout which was used is shown in FIG. 17.

Both the PEDOT (Al4083 special grade) and the HIL-012-026 (Merck KGaA; pre-dissolved in mesitylene at 0.5% solids) were spin coated on to pre patterned glass substrates (30 mm wide) covered with a 4 pixels structure of ITO. The OLED inks were then printed using a Nissha S15 angstromer flexographic printer onto these substrates. The Device was then dried at 180° C. for 30 minutes. The Ba/Al cathode was then sputtered onto the device and the resultant device was then encapsulated. FIGS. 26 and 27 show the electroluminescence of the 2 samples. FIGS. 28 and 29 are those assessed by photo luminescence.

As can be seen the sample with the additional volatile surfactant gives substantially improved wetting. Without volatile surfactant the ink reticulates giving poor film formation. The colour points of these materials are very different. Sample E: 0.189/0.204 CIE x/y coordinates. Sample F: 0.310/0.637 CIE x/y coordinates. The reason for the colour difference is that only the HIL layer lit up. The efficiency of these devices was measured.

As can be seen from FIG. 30 only the device with the volatile surfactant could be measured, this is because of the device without volatile surfactant only the hole injection layer lit up. The efficiency of the device without volatile surfactant could not be measured. The efficiency of the device with the inclusion of 1% volatile surfactant was 13.5 cd/A at 1000 cd/m².

The invention claimed is:

1. A composition comprising one or more organic semiconducting compounds (OSC), one or more organic solvents, and one or more additives that decrease the surface tension of the composition (wetting agents), wherein said wetting agent is volatile and is not capable of chemically reacting with the organic semiconducting compounds wherein said organic solvent is a naphthalene derivative, an alkyl naphthalene, a dihydronaphthalene derivative, a tetrahydronaphthalene derivative, an aromatic ester, an aromatic ketone, an alkyl ketone, a heteroaromatic solvent, an aniline derivative or mixtures of these compounds and the organic semiconducting compound is an organic phosphorescent compound which emits light and in addition contains at least one atom having an atomic number greater than 38 and wherein said wetting agent is methyl siloxane having 6 to 20 carbon atoms, $C_7$-$C_{14}$ alkane, $C_7$-$C_{14}$ akene, $C_7$-$C_{14}$ alkyne, alcohol having 7 to 14 carbon atoms, fluoro ether having 7 to 14 carbon atoms, fluoro ester having 7 to 14 carbon atoms or fluoro ketone having 7 to 14 carbon atoms, wherein the difference of the boiling point of the wetting agent and the organic solvent is in the range of −20° to 20° C.

2. The composition according to claim 1, wherein the organic semiconducting compound has a molecular weight of 2000 g/mol or less.

3. The composition according claim 1, wherein the phosphorescent compound is s compound of formulae (1) to (4):

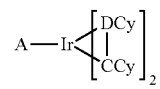

formula (1)

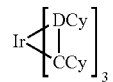

formula (2)

-continued

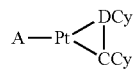  formula (3)

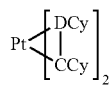  formula (4)

wherein
DCy is, identically or differently on each occurrence, a cyclic group which contains at least one donor atom, via which the cyclic group is bonded to the metal, and which may in turn carry one or more substituents $R^{18}$; the groups DCy and CCy are connected to one another via a covalent bond;

CCy is, identically or differently on each occurrence, a cyclic group which contains a carbon atom via which the cyclic group is bonded to the metal and which may in turn carry one or more substituents $R^{18}$;

A is, identically or differently on each occurrence, a monoanionic, bidentate chelating ligand;

$R^{18}$ are identically or differently at each instance, and are F, Cl, Br, I, $NO_2$, CN, a straight-chain, branched or cyclic alkyl or alkoxy group having from 1 to 20 carbon atoms, in which one or more nonadjacent $CH_2$ groups is optionally replaced by —O—, —S—, —$NR^{19}$—, —$CONR^{19}$—, —CO—O—, —C=O—, —CH=CH— or —C≡C—, and in which one or more hydrogen atoms is optionally replaced by F, or an aryl or heteroaryl group which has from 4 to 14 carbon atoms and is optionally substituted by one or more nonaromatic $R^{18}$ radicals, and a plurality of substituents $R^{18}$, either on the same ring or on the two different rings, may together in turn form a mono- or polycyclic, aliphatic or aromatic ring system; and $R^{19}$ are identically or differently at each instance, and are a straight-chain, branched or cyclic alkyl or alkoxy group having from 1 to 20 carbon atoms, in which one or more nonadjacent $CH_2$ groups is optionally replaced by —O—, —S—, —CO—O—, —C=O—, —CH=CH— or —C≡C—, and in which one or more hydrogen atoms is optionally replaced by F, or an aryl or heteroaryl group which has from 4 to 14 carbon atoms and is optionally substituted by one or more nonaromatic $R^{18}$ radicals.

4. The composition according to claim 3, wherein DCy is, identically or differently on each occurrence, a cyclic group which contains at least nitrogen, carbon in the form of a carbene or phosphorus, via which the cyclic group is bonded to the metal, and which may in turn carry one or more substituents $R^{18}$; the groups DCy and CCy are connected to one another via a covalent bond; and A is a diketonate ligand.

5. A process for the preparation of an organic electronic (OE) device which comprises utilizing the composition according to claim 1 as coating or printing ink.

6. An organic electronic (OE) device prepared from the composition according to claim 1.

7. OE device according to claim 6, wherein the device is an organic light emitting diode (OLED), an organic field effect transistor (OFET) or an organic photovoltaic (OPV) device.

8. The composition according to claim 1, wherein the methyl siloxane has 8 to 16 carbon atoms.

9. A composition comprising one or more organic semiconducting compounds (OSC), one or more organic solvents, and one or more additives that decrease the surface tension of the composition (wetting agents), wherein said wetting agent is volatile and is not capable of chemically reacting with the organic semiconducting compounds wherein said organic solvent is a naphthalene derivative, an alkyl naphthalene, a dihydronaphthalene derivative, a tetrahydronaphthalene derivative, an aromatic ester, an aromatic ketone, an alkyl ketone, a heteroaromatic solvent, an aniline derivative or mixtures of these compounds and the organic semiconducting compound is an organic phosphorescent compound which emits light and in addition contains at least one atom having an atomic number greater than 38 and wherein the composition comprises at least one inert polymeric binder.

10. A composition comprising one or more organic semiconducting compounds (OSC), one or more organic solvents, and one or more additives that decrease the surface tension of the composition (wetting agents), wherein said wetting agent is volatile and is not capable of chemically reacting with the organic semiconducting compounds wherein said organic solvent is a naphthalene derivative, an alkyl naphthalene, a dihydronaphthalene derivative, a tetrahydronaphthalene derivative, an aromatic ester, an aromatic ketone, an alkyl ketone, a heteroaromatic solvent, an aniline derivative or mixtures of these compounds and the organic semiconducting compound is an organic phosphorescent compound which emits light and in addition contains at least one atom having an atomic number greater than 38 and wherein said wetting agent has a boiling point from 125° C. to less than 350° C.

11. The composition according to claim 10, wherein the difference of the boiling point of the wetting agent and the organic solvent is in the range of −20° to 20° C.

12. The composition according to claim 10, wherein said wetting agent is a non-aromatic compound and/or non-ionic compound.

* * * * *